United States Patent
La Grou

(10) Patent No.: US 9,590,648 B2
(45) Date of Patent: Mar. 7, 2017

(54) MULTI-PATH DIGITAL-TO-ANALOG CONVERTER

(71) Applicant: John Howard La Grou, Placerville, CA (US)

(72) Inventor: John Howard La Grou, Placerville, CA (US)

(*) Notice: Subject to any disclaimer, the term of this patent is extended or adjusted under 35 U.S.C. 154(b) by 0 days.

(21) Appl. No.: 15/227,913

(22) Filed: Aug. 3, 2016

(65) Prior Publication Data

US 2016/0344401 A1 Nov. 24, 2016

Related U.S. Application Data

(63) Continuation-in-part of application No. 15/004,891, filed on Jan. 23, 2016, now abandoned, which is a continuation-in-part of application No. 14/935,363, filed on Nov. 6, 2015, now abandoned.

(60) Provisional application No. 62/199,955, filed on Jul. 31, 2015, provisional application No. 62/188,884, filed on Jul. 6, 2015, provisional application No. 62/106,219, filed on Jan. 22, 2015, provisional application No. 62/076,560, filed on Nov. 7, 2014, provisional application No. 62/309,007, filed on Mar. 16, 2016, provisional application No. 62/350,432, filed on Jun. 15, 2016, provisional application No. 62/352,975, filed on Jun. 21, 2016.

(51) Int. Cl.
*H03M 1/06* (2006.01)
*H03M 1/08* (2006.01)
*H03M 1/66* (2006.01)

(52) U.S. Cl.
CPC ............. *H03M 1/08* (2013.01); *H03M 1/66* (2013.01)

(58) Field of Classification Search
CPC ............. H03M 1/06; H03M 1/08; H03M 1/66
USPC .................................. 341/118, 120, 145, 144
See application file for complete search history.

(56) References Cited

U.S. PATENT DOCUMENTS 4,450,433 A 5/1984 Moriyama
4,843,392 A 6/1989 Gulczynski
(Continued)

FOREIGN PATENT DOCUMENTS

EP 0346605 A2 12/1989
EP 0790709 A1 8/1997

*Primary Examiner* — Peguy Jean Pierre
(74) *Attorney, Agent, or Firm* — Integral Patent; Laurence J. Shaw

(57) ABSTRACT

A digital-to-analog converter which improves dynamic range by apportioning a least significant bits portion of an incoming digital signal to a low-path circuit and a most significant bits portion of the incoming digital signal to a high-path circuit. The low-path circuit has a low-path digital-to-analog converter, which feeds a low-path resistive element, which feeds an output node. The high-path circuit has a high-path digital-to-analog converter, which feeds a high-path resistive element, which feeds an output node. The output node is a simple electrical connection of the outputs of the low-path and high-path resistive elements. The system can further improve dynamic range by providing a high-path amplifier with control element(s) which reduce or eliminate high-path noise from the output node. Further dynamic range improvement is realized when the high-path control system takes advantage of the effects of psychoacoustic masking. Performance linearity is improved by a feedback system which monitors the output signal.

77 Claims, 31 Drawing Sheets

FIGURE 2A

(56) References Cited

U.S. PATENT DOCUMENTS

| | | | |
|---|---|---|---|
| 4,868,571 A * | 9/1989 | Inamasu | H03M 1/682 |
| | | | 341/118 |
| 4,947,172 A | 8/1990 | Suzuki | |
| 5,148,163 A * | 9/1992 | Frindle | H03M 1/0641 |
| | | | 341/131 |
| 5,323,159 A * | 6/1994 | Imamura | H03M 1/68 |
| | | | 341/127 |
| 6,163,288 A | 12/2000 | Yoshizawa | |
| 6,201,490 B1 | 3/2001 | Kawano et al. | |
| 6,204,790 B1 * | 3/2001 | Jin | H03M 1/68 |
| | | | 341/145 |
| 6,362,764 B1 | 3/2002 | Niimi et al. | |
| 6,473,013 B1 | 10/2002 | Velazquez et al. | |
| 6,489,909 B2 | 12/2002 | Nakao et al. | |
| 6,593,868 B2 | 7/2003 | Clara et al. | |
| 6,697,004 B1 | 2/2004 | Galton et al. | |
| 6,822,595 B1 | 11/2004 | Robinson | |
| 6,897,794 B2 | 5/2005 | Kuyel et al. | |
| 7,375,669 B2 | 5/2008 | Kim et al. | |
| 7,414,558 B2 | 8/2008 | Rivoir et al. | |
| 7,579,971 B2 | 8/2009 | Washburn et al. | |
| 2002/0050937 A1 | 5/2002 | Boehm et al. | |
| 2003/0063022 A1 | 4/2003 | Eriksson et al. | |
| 2004/0213356 A1 | 10/2004 | Burke | |
| 2013/0234871 A1 | 9/2013 | Eliezer et al. | |
| 2013/0234873 A1 * | 9/2013 | Wyville | H03M 1/661 |
| | | | 341/144 |
| 2014/0240154 A1 * | 8/2014 | Kim | H03M 3/32 |
| | | | 341/143 |
| 2015/0048959 A1 | 2/2015 | Zhu | |

\* cited by examiner

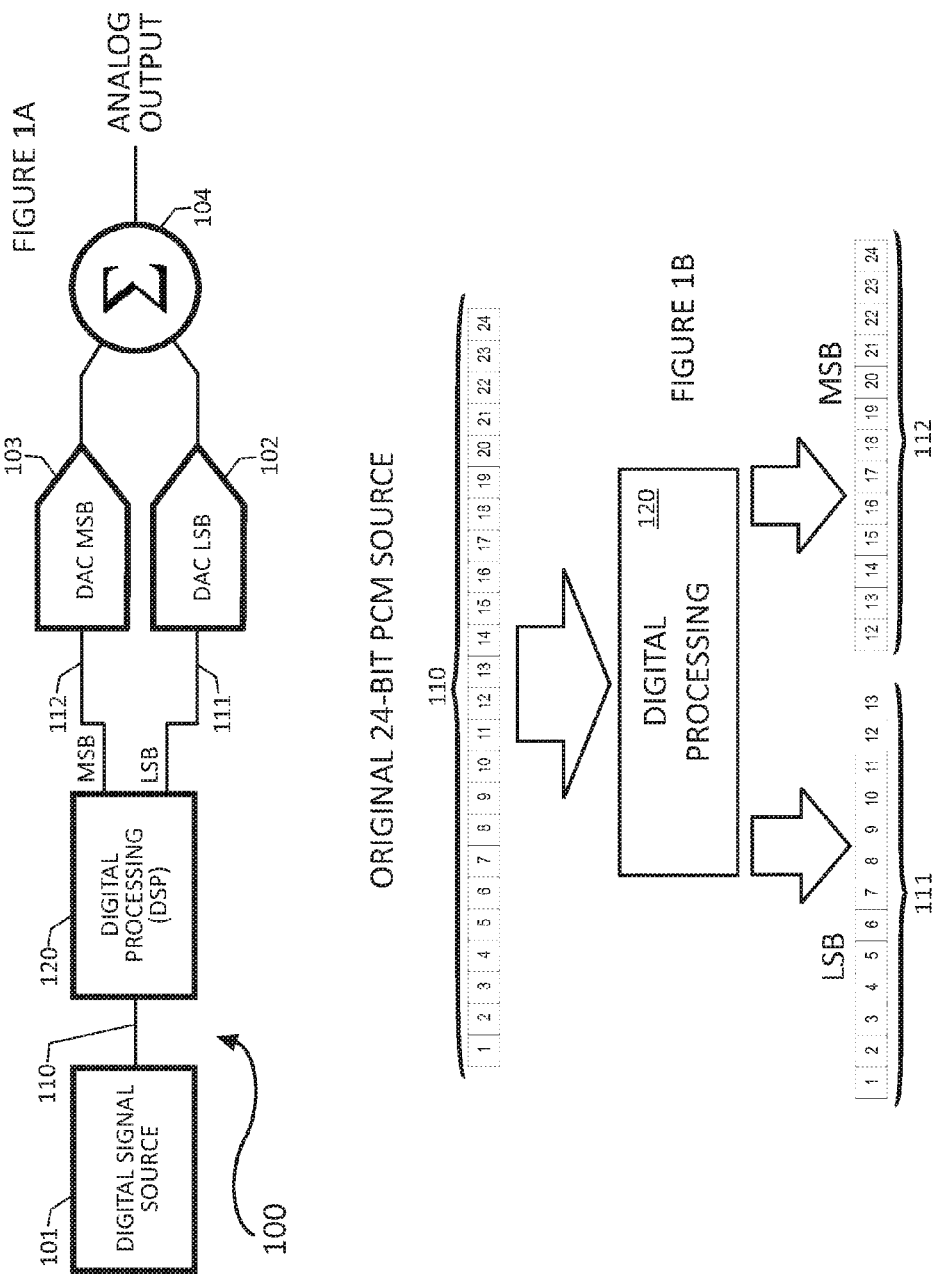

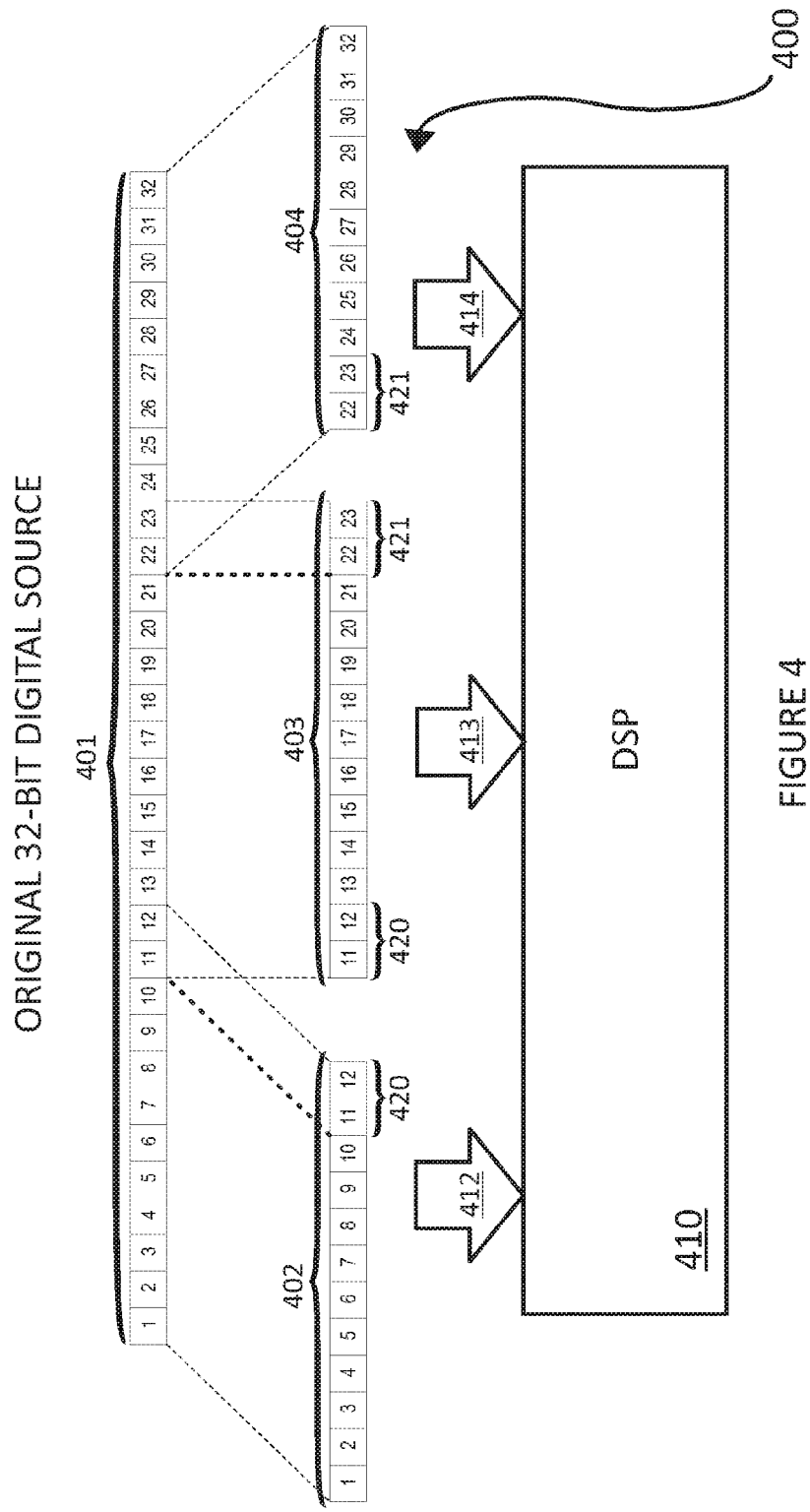

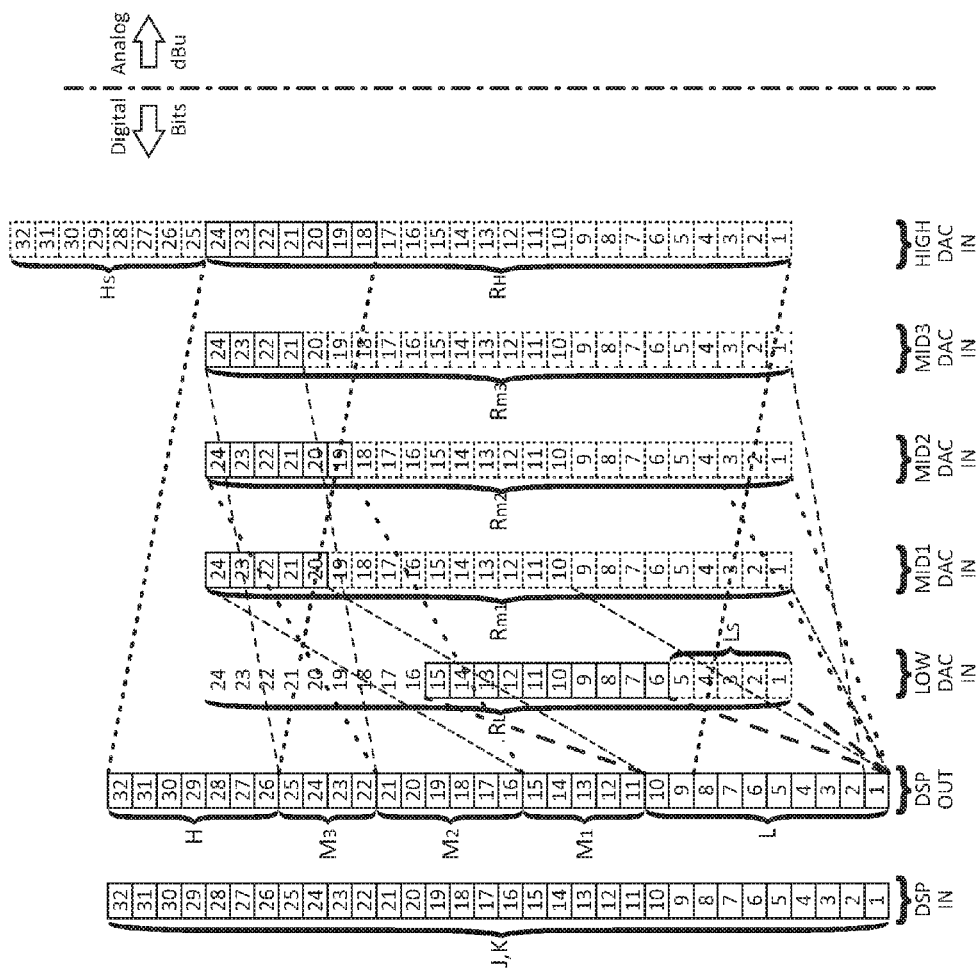

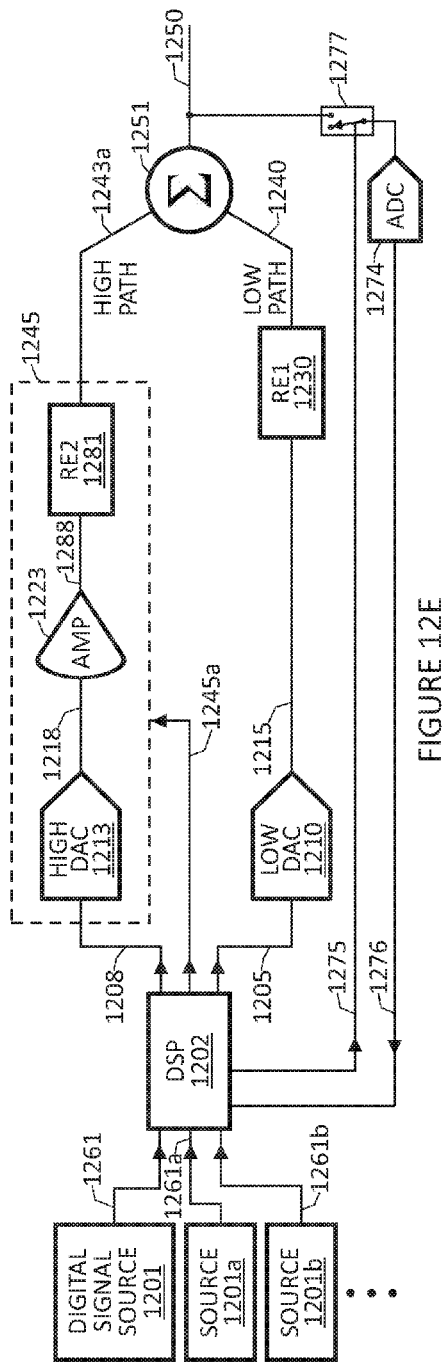
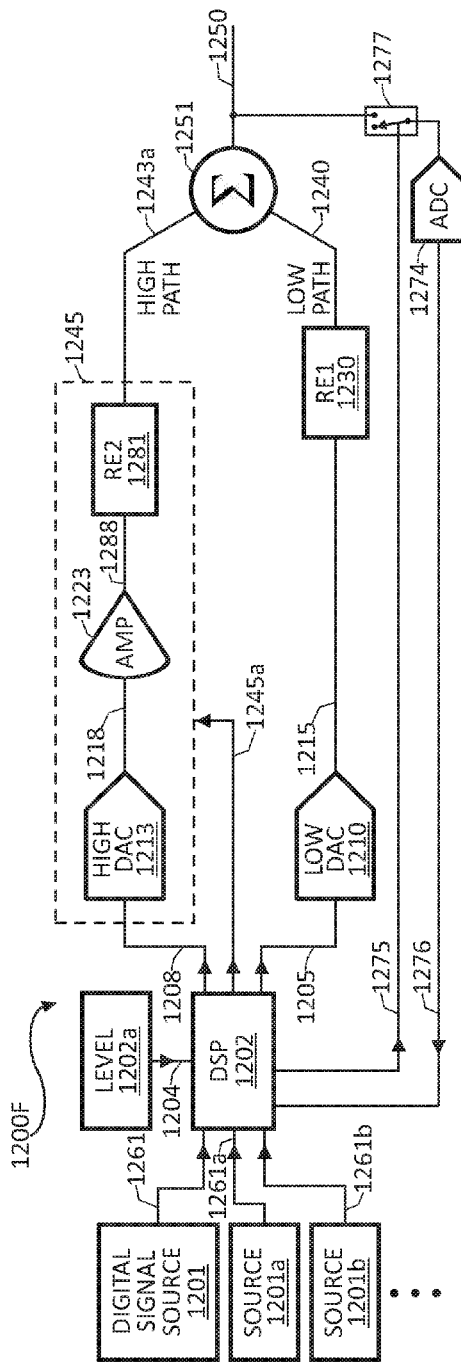
FIGURE 12E
FIGURE 12F

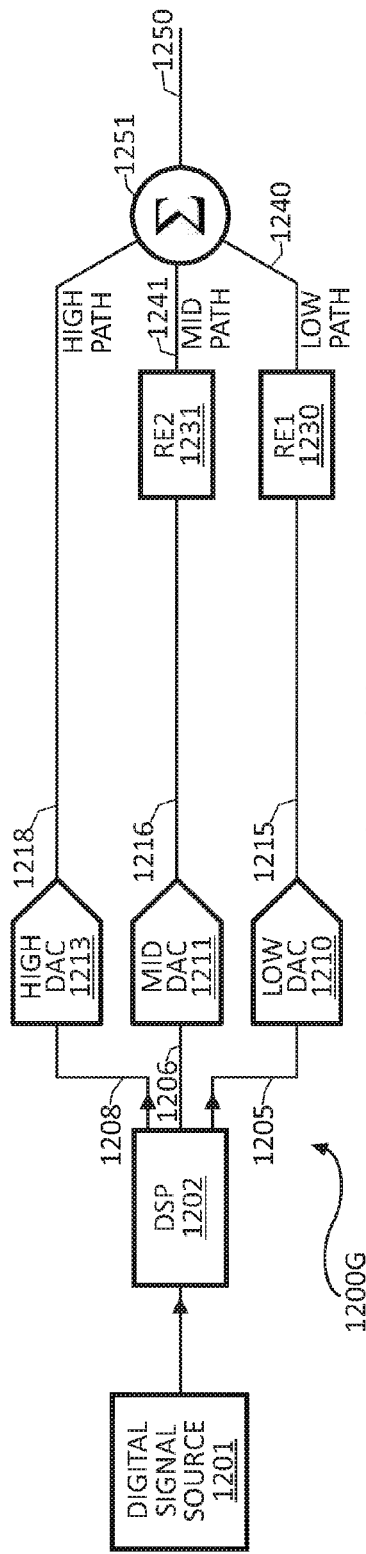
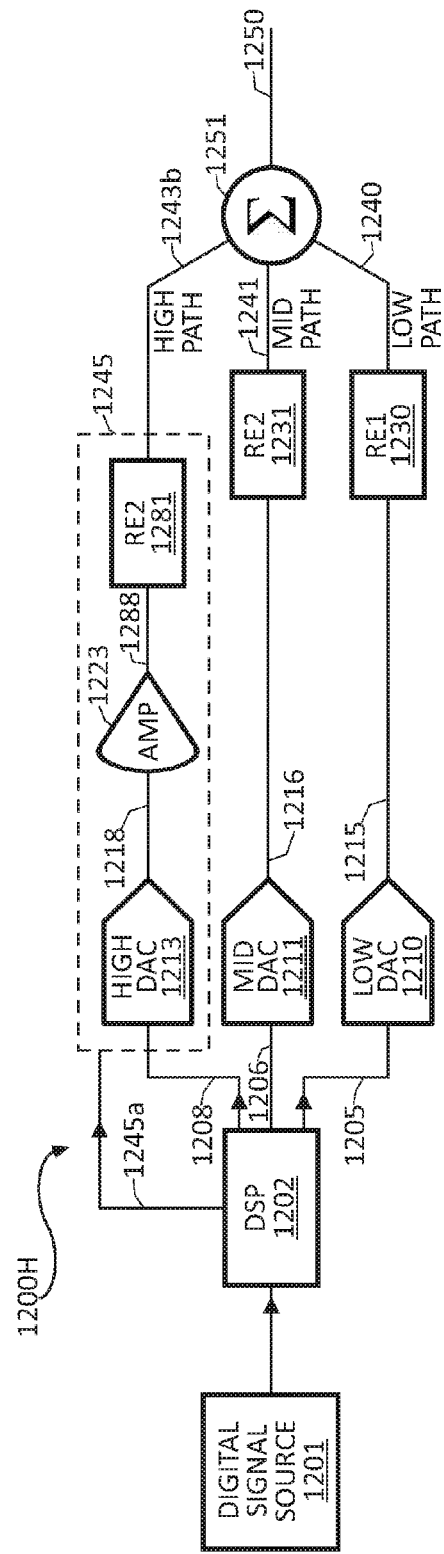

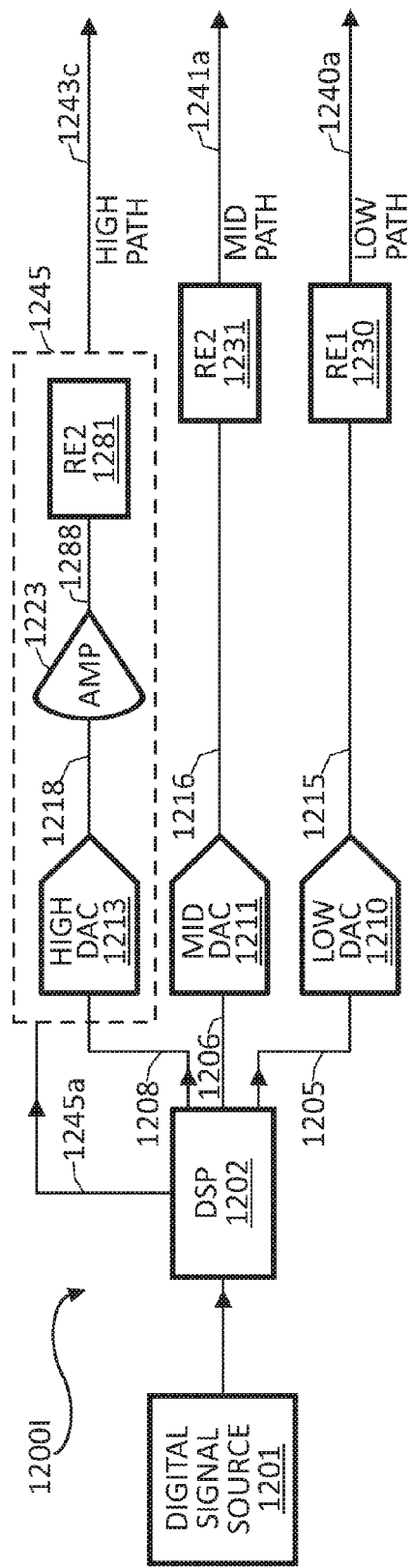
FIGURE 12|

MULTI-PATH DIGITAL-TO-ANALOG CONVERTER

CROSS-REFERENCE TO RELATED APPLICATIONS

The present application is based on and claims the priority of non-provisional patent application Ser. No. 15/004,891 filed Jan. 23, 2016 by John Howard La Grou for "Multi-path, series-switched, passively-summed digital-to-analog converter," which is based on and claims the priority of non-provisional patent application Ser. No. 14/935,363 filed Nov. 6, 2015 by John Howard La Grou entitled "Multi-path, series-switched, passively-summed digital-to-analog converter," which is based on and claims the priority of provisional patent application Ser. No. 62/199,955 filed Jul. 31, 2015 by John La Grou entitled "Process and system for the digital-to-analog conversion of signals, continuation of earlier filing," provisional patent application serial no. 62188884 filed Jul. 6, 2015 by John La Grou entitled "Process and system for the digital-to-analog conversion of signals, continuation of earlier filing," provisional patent application serial no. 62106219 filed Jan. 22, 2015 by John La Grou entitled "Process and system for the digital-to-analog conversion of signals, continuation of earlier filing," and provisional patent application serial no. 62076560 filed Nov. 7, 2014 by John La Grou entitled "Process and system for the digital-to-analog conversion of signals." Furthermore, the present application is based on and claims the priority of provisional patent application Ser. No. 62/309,007 filed Mar. 16, 2016 by John La Grou for "Multi-path power amplifier and driver," provisional patent application serial no. 62350432 filed Jun. 15, 2016 by John La Grou for "Multi-path digital-to-analog converter," and provisional patent application serial no. 62352975 filed Jun. 21, 2016 by John La Grou for "Multi-path digital-to-analog converter."

TECHNICAL FIELD

The present invention relates to electronic devices, more particularly to digital-to-analog converters, and still more particularly to D-A conversion systems and methods which utilize multiple D-A converters and provide low noise and/or high maximum level.

BACKGROUND OF THE INVENTION

Audio DAC (digital-to-analog conversion) technology has improved at a steady pace over the past three decades. Broadband dynamic range performance (i.e., the difference between a noise amplitude and a maximum level) has improved at an average pace of roughly 0.7 dB per year over the last 30 years, or a one-bit performance improvement roughly every 8 years since the 1980s. The present invention significantly improves DAC dynamic range performance. To achieve this significant performance improvement, according to the present invention a number of novel design techniques can be combined and optimized, including DSP-controlled multi-path parallel D-A conversion, ADC multi-path monitor and DSP compensation and DSP-controlled noise management. Furthermore, according to the present invention ADC (analog-to-digital conversion) is used for measuring path levels in consort with DSP calibration of said path levels in a multi-path DAC topology. Furthermore, according to the present invention, multiple pre-adapted digital input signals may be processed according to alternative embodiments of the present invention. Furthermore, according to the present invention, multiple pre-adapted analog output signals may be realized according to alternative embodiments of the present invention.

Therefore, it is an object of the present invention to provide method and apparatus for digital-to-analog conversion having low noise and high maximum level.

More particularly, it is an object of the present invention to provide method and apparatus for digital-to-analog conversion having low noise and high maximum level utilizing circuitry that separately processes a most significant bits portion and a least significant bits portion of an input digital signal, particularly where noise in the analog output signal is reduced or eliminated from the high-path circuitry when the input signal has a sufficiently low level, and outputs from the low- and high-path circuitry are summed.

It is another object of the present invention to provide method and apparatus for digital-to-analog conversion which utilizes circuit behavior monitoring and feedback to improve performance characteristics.

Additional objects and advantages of the invention will be set forth in the description which follows, and will be apparent from the description or may be learned from the practice of the invention. The objects and advantages of the invention may be realized and obtained by means of the instrumentalities and combinations particularly pointed out in the claims.

SUMMARY OF THE INVENTION

The present invention is directed to an apparatus for conversion of an input digital signal to an output analog signal having a maximum output level. The input digital signal is nominally a signal of K bits. The apparatus includes a bit grouping providing system which takes the input digital signal and produces a low-path digital signal of L bits and a high-path digital signal of H bits, where L+H is greater than or equal to J, and J is a number of bits of said input digital signal utilized by said bit divider where J is less than or equal to K. The apparatus includes a low-path digital-to-analog converter for digital inputs of $R_L$ bits or less, the low-path digital signal being bit shift mapped to an input of the low-path digital-to-analog converter where L is less than or equal to $R_L$, and where the L bits of the low-path digital signal are level shift mapped upwards by $L_S$ bits where $L+L_S \leq R_L$. The low-path digital-to-analog converter produces a low-path digital-to-analog converter output signal. Similarly, the apparatus includes a high-path digital-to-analog converter for digital inputs of $R_H$ bits, the high-path digital signal being digitally mapped or level shifted to an input of said high-path digital-to-analog converter by a bit shift of $H_S$ bits such that $(K-H_S) \leq R_H$ and $(K-H-H_S) \geq 0$. The high-path digital-to-analog converter produces a high-path digital-to-analog converter output signal. The apparatus further includes a low-path attenuator which attenuates the low-path digital-to-analog converter output signal to produce an attenuated low-path analog signal, and a high-path amplifier which can amplify the high-path digital-to-analog converter output signal to produce an amplified high-path signal having a maximum level equal to the maximum output level of the apparatus. The apparatus further includes a passive summing node which, if a signal level characteristic of the input digital signal exceeds a threshold level, sums a low-path signal derived from the attenuated low-path analog signal and a high-path signal derived from the amplified high-path signal to produce the output analog signal and, if the signal level characteristic of the input digital signal does not exceed said threshold level, utilizes a means to reduce access of noise from the high-path output to the passive summing node. Unless otherwise stated, all references to "noise" are defined as uncorrelated, unweighted and broadband, measured with an audio bandwidth of 20 kHz. When a functional noise-generating stage (e.g., a DAC) precedes another functional noise-generating stage (e.g., an amplifier), the summed uncorrelated self-noise of the output is calculated as a (right-angle) vector sum. However, it should be noted that summed noise levels given in the present specification may vary somewhat from noise that would be actually measured in practice, and operating levels and gain/noise performance of DACs and/or amplifiers and/or passive elements described in the present specification may be approximations.

The present invention is also directed to an apparatus for conversion of an input digital signal to an output analog signal having a maximum output level, where the input digital signal is nominally a signal of K bits. The apparatus includes a bit grouping providing system which takes the input digital signal and produces a low-path digital signal of L bits, a middle-path digital signal of M bits, and a high-path digital signal of H bits, where L+M+H is greater than or equal to J, and J is a number of bits of said input digital signal utilized by said bit divider, where J is less than or equal to K. The apparatus includes a low-path digital-to-analog converter for digital inputs of $R_L$ bits or less. The low-path digital signal is digitally level shifted by the bit grouping providing system to an input of the low-path digital-to-analog converter, where L is less than or equal to $R_L$, such that the L bits of the low-path digital signal are level shift mapped by $L_S$ bits, where $L+L_S \leq R_L$. The low-path digital-to-analog converter produces a low-path digital-to-analog converter output signal. The apparatus includes a middle-path digital-to-analog converter for digital inputs of $R_M$ bits or less. The middle-path digital signal is digitally level shifted by the bit grouping providing system to an input of the middle-path digital-to-analog converter, where M is less than or equal to $R_M$. The middle-path digital-to-analog converter produces a middle-path digital-to-analog converter output signal. The apparatus also includes a high-path digital-to-analog converter for digital inputs of $R_H$ bits or less. The high-path digital signal is digitally level shifted by the bit grouping providing system to an input of the high-path digital-to-analog converter, where H is less than or equal to $R_H$, such that the H bits of the high-path digital signal are level shift mapped downwards by $L_S$ bits, where $(J-H_S) \leq R_H$. The high-path digital-to-analog converter produces a high-path digital-to-analog converter output signal. The apparatus further includes a low-path attenuator which attenuates the low-path digital-to-analog converter output signal to produce an attenuated low-path analog signal, and a high-path amplifier which amplifies the high-path digital-to-analog converter output signal to produce an amplified high-path signal having a maximum level equal to the maximum output level. The apparatus further includes a passive summing node which, if a signal level characteristic of the input digital signal exceeds a first threshold level, sums a low-path signal derived from the attenuated low-path analog signal, a middle-path signal derived from the middle-path digital-to-analog converter output signal, and a high-path signal derived from the amplified high-path signal to produce the output analog signal. If the signal level characteristic of the input digital signal exceeds a second threshold level but not the first threshold level, the apparatus sums the low-path signal derived from said attenuated low-path analog signal and the middle-path signal derived from the middle-path digital-to-analog converter output signal to produce the output analog signal, and utilizes a means to reduce access of noise from the high-path to the passive summing node. And if the signal level characteristic of said input digital signal does not exceed the second threshold level, the apparatus utilizes a means to reduce access of noise from the middle-path and the high-path to the passive summing node.

The present invention is also directed to an apparatus for conversion of an input digital signal to an output analog signal having a maximum output level, where the input digital signal is nominally a signal of K bits. The apparatus includes a bit grouping providing system which takes the input digital signal and produces a low-path digital signal of L bits, a number n of middle-path digital signals of $M_1, \ldots, M_n$ bits, and a high-path digital signal of H bits, where $L+M_1+\ldots+M_n+H$ is greater than or equal to J, and J is a number of bits of the input digital signal utilized by said bit divider, where J is less than or equal to K. The apparatus has a low-path digital-to-analog converter for digital inputs of $R_L$ bits or less, the low-path digital signal being digitally level shifted to an input of the low-path digital-to-analog converter, where L is less than or equal to $R_L$, such that the L bits of the low-path digital signal are level shift mapped upwards by $L_S$ bits where $L+L_S \leq R_L$. The low-path digital-to-analog converter producing a low-path digital-to-analog converter output signal. Furthermore, the apparatus has n middle-path digital-to-analog converters for digital inputs of $R_{M1}, \ldots, R_{Mn}$ bits or less, the middle-path digital signals being digitally level shifted to inputs of the middle-path digital-to-analog converter where $M_1 \ldots M_n$ are less than or equal to $R_{M1}, \ldots, R_{Mn}$, respectively. The middle-path digital-to-analog converters produce middle-path digital-to-analog converter output signals. Furthermore, the apparatus has a high-path digital-to-analog converter for digital inputs of $R_H$ bits, the high-path digital signal being digitally level shifted downwards to an input of the high-path digital-to-analog converter by a bit shift of $H_S$ bits such that $(J-H_S) \leq R_H$. The high-path digital-to-analog converter produces a high-path digital-to-analog converter output signal. The apparatus includes a low-path attenuator which attenuates the low-path digital-to-analog converter output signal to produce an attenuated low-path analog signal, and a high-path amplifier which can amplify the high-path digital-to-analog converter output signal to produce an amplified high-path signal having a maximum level equal to the maximum output level. The apparatus has a passive summing node which, if a signal level characteristic of the input digital signal exceeds a highest threshold level, sums a low-path signal derived from the attenuated low-path analog signal, middle-path signals derived from the middle-path digital-to-analog converter output signals, and a high-path signal derived from the amplified high-path signal to produce the output analog signal. If the signal level characteristic of the input digital signal does not exceed a lowest threshold level, the apparatus utilizes a means to reduce access of noise from the middle-path and the high-path to the passive summing node.

BRIEF DESCRIPTION OF DRAWINGS

The accompanying figures, which are incorporated in and form a part of this specification, illustrate embodiments of the invention and, together with the description given above and the detailed description of the preferred embodiments given below, serve to explain the principles of the invention.

FIG. 1A shows a schematic of a digital-to-analog converter which separates the processing of the most significant bits (MSB) and the least significant bits (LSB).

FIG. 1B shows the separation of the bits of a 24-bit signal into a group of 13 least significant bits (LSB) and 13 most significant bits (MSB).

FIG. 4 shows the separation of the bits of a 32-bit signal into a group of 12 low-range bits, 13 mid-range bits, and 11 high-range bits prior to input to a digital signal processor.

FIG. 6C shows an exemplary division of a 32 bit digital input signal into five digital portions.

FIG. 12E shows the two-path digital-to-analog conversion circuit of FIG. 12D with multi-path inputs.

FIG. 12F shows the two-path digital-to-analog conversion circuit of FIG. 12E with a level control connected to the DSP.

FIG. 12G shows a three-path digital-to-analog conversion circuit.

FIG. 12H shows the three-path digital-to-analog conversion circuit of FIG. 12G with noise reduction elements added to the high-path circuitry.

FIG. 12I shows the three-path digital-to-analog conversion circuit of FIG. 12H with non-summed pre-adapted outputs.

DETAILED DESCRIPTION OF THE INVENTION

Figure 2A:
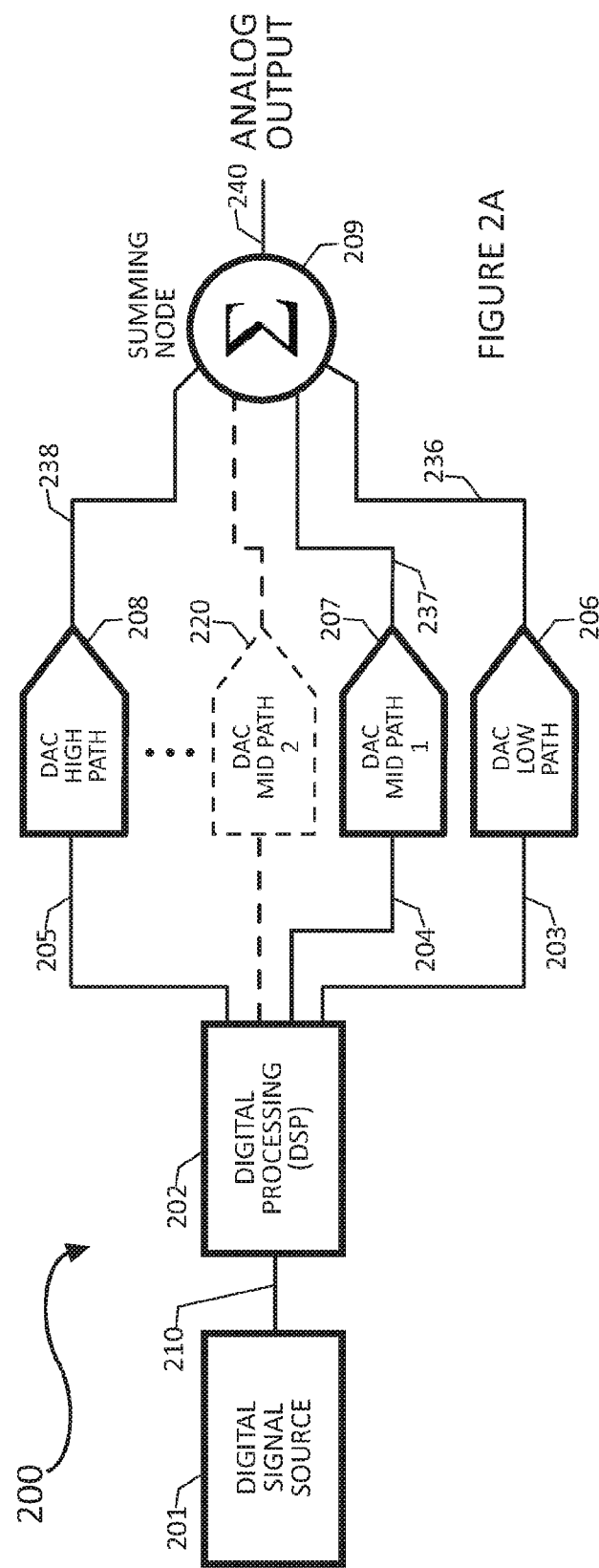
FIG. 2A shows a schematic of a digital-to-analog converter which separates the processing of the low-range signal, mid-range signal and high-range signal.

Prior art multi-path digital-to-analog converters (DACs) exhibit performance limitations due to a number of factors. The present invention improves certain performance characteristics, the primary objectives being the reduction of systemic noise and an increase in maximum level, i.e., improved dynamic range.

The circuit (100) shown in FIG. 1A shows the fundamental process and system on which the current invention is built upon. The circuit (100) of FIG. 1A performs a multi-range D-A conversion of a signal (101) (typically a PCM-encoded signal) which is sent (110) to a digital signal processor (DSP) (120) or any digital processing circuit capable of the necessary digital functions described herein. The DSP (120) is designed or programmed to separate the inputted instantaneous (i.e., at any instant) digital signal (110) into multiple bit-groupings. For instance, as shown in FIG. 1B, the DSP (120) separates a 24-bit digital word (110) into two smaller contiguous data packets (111) and (112). The number of bits shown in the lowest significant bits (LSB) packet (111) and the most significant bits (MSB) packet (112) packets is an arbitrary example, and may vary depending upon specific design criteria. Each data packet (111) and (112) is sent to a digital-to-analog converter (DAC) (102) and (103), respectively, which is an integrated circuit or other manner or style of digital-to-analog converter. In particular, the lower DAC (102) is dedicated to the least significant bits (LSB) packet (111) and the upper DAC (103) is dedicated to the most significant bits (MSB) packet (112). As depicted in FIG. 1B, some bit overlap (which is facilitated by cross-fading, level-shifting or other adjustments, as described in detail below) may be used. In particular, in the example of FIG. 1B the $12^{th}$ and $13^{th}$ bits of the input signal (110) are allocated to both the LSB packet (111) and the MSB packet (112). The output signal of each DAC (102) and (103) can be differential or single-ended, but is typically differential in integrated circuit DACs. The analog output of each DAC (102) and (103) is sent to an analog summing node (104) which recombines the outputs of the LSB DAC (102) and the MSB DAC (103) into a single analog signal. In an alternate embodiment (not shown), the LSB packet (111) and MSB packet (112) may overlap. In an alternate embodiment, MSB packet (112) may be configured by DSP (120) to use all bits (e.g., configured in the present embodiment as a 24 bit digital packet). In all embodiments, DSP (120) will maintain (what at least to listener's perception will be) linear, glitch-free path-to-path level transitions at summing node (104).

Figure 2B:
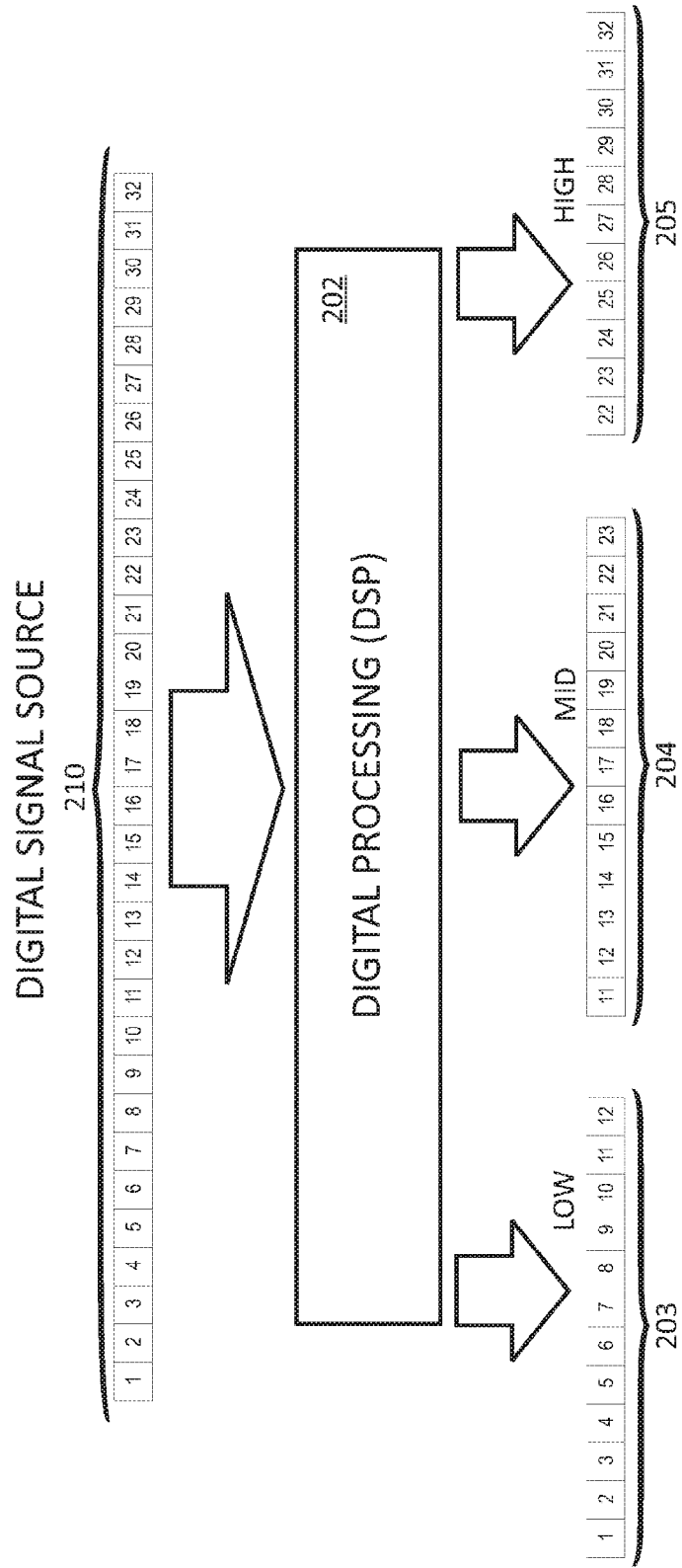
FIG. 2B shows the separation of the bits of a 32-bit signal into a group of 12 low-range bits, 13 mid-range bits, and 11 high-range bits by a digital signal processor.

The method and system of the present invention is not limited to a two stage topology, but can be realized with any number of stages as is suggested by the dotted-line mid-level DAC (220) unit shown in FIG. 2A. For instance, as shown in the embodiment of FIGS. 2A and 2B, a 32-bit PCM input signal (210) is separated into a three-path bit-grouping topology. In FIG. 2A, the DSP (202) separates the 32-bit digital word (210) in the incoming data stream into three smaller packets: a low-range packet (203), a mid-range packet (204), and high-range packet (205). The number of bits shown in the low-, mid-, and high-range packets (203), (204) and (205) is an arbitrary example, and may vary depending upon specific design criteria. Each data packet (203), (204) and (205) is sent to a DAC (206), (207) and (208), respectively, which is an integrated circuit or other manner or style of DAC irrespective of topology, whether signed, unsigned, twos-complement, or otherwise (i.e., for clarity of exposition, a simplified unsigned or unipolar DAC representation is used herein). As depicted in FIG. 2B, some bit overlap (which is facilitated by dynamic optimization, cross-fading, overlay, level-shifting or other adjustments, as described in detail below) may be used. In particular, in the example of FIG. 2B the 11$^{th}$ and 12$^{th}$ bits of the input signal (210) are allocated to both the low-range packet (203) and the mid-range packet (204), and the 22$^{nd}$ and 23rd bits of the input signal (210) are allocated to both the mid-range packet (204) and the high-range packet (205). The output signal of each DAC (206), (207) and (208) can be differential or single-ended, but is typically differential in integrated circuit DACs. The analog output (236), (237) and (238) of each DAC (206), (207) and (208), respectively, is sent to an analog summing node (209) which combines the low-, mid-, and high-range analog signals into a single analog output signal (240).

A Preferred Two-Path Embodiment According to the Present Invention

Figure 3A:
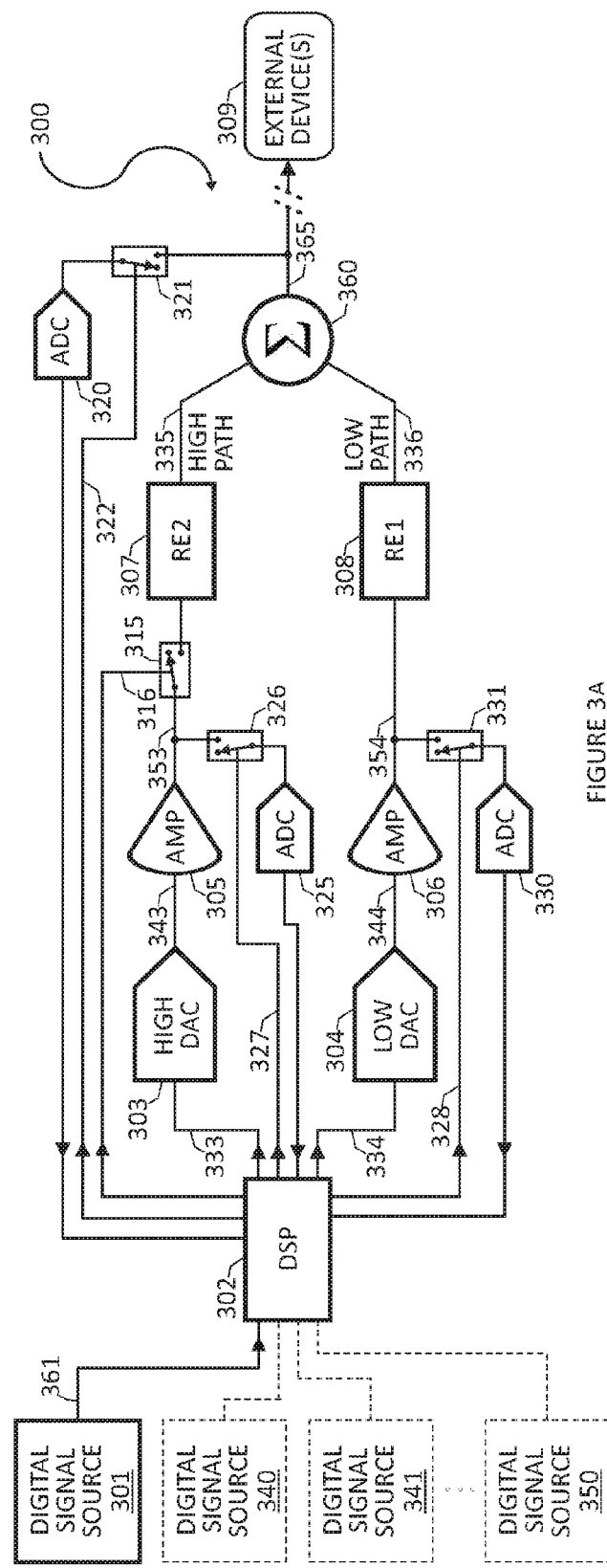
FIG. 3A shows a two-path digital-to-analog conversion circuit according to the present invention.

FIG. 3A provides a schematic of a two-path circuit (300) for a 32-bit input signal according to a preferred embodiment of the present invention which provides increased output level and decreased baseline (i.e., no input signal) self-noise. As shown in the signal levels chart of FIG. 3B, the circuit of FIG. 3A divides a 32-bit input signal (361) (K=32; corresponding to a signal range of 192 dB, which for the audio circuitry according to the preferred embodiment will be assigned the range of −160 dBu to +32 dBu) into two smaller words or bit packets, a low-path-packet (334) of L=18 bits, and a high-path-packet (333) of H=14 bits. In the examples presented in the present specification integer bit values will be used to describe the invention, and since 1 bit corresponds to 6 dB, this results in integer dB values. The use of integer values is intended for explanatory clarity only and in no way precludes the implementation of the invention using fractional values. Although the present specification does not describe the invention in terms of RMS voltages, it is noted that 0 dBu is equivalent to 0.7746 volts RMS.

Figure 3B:
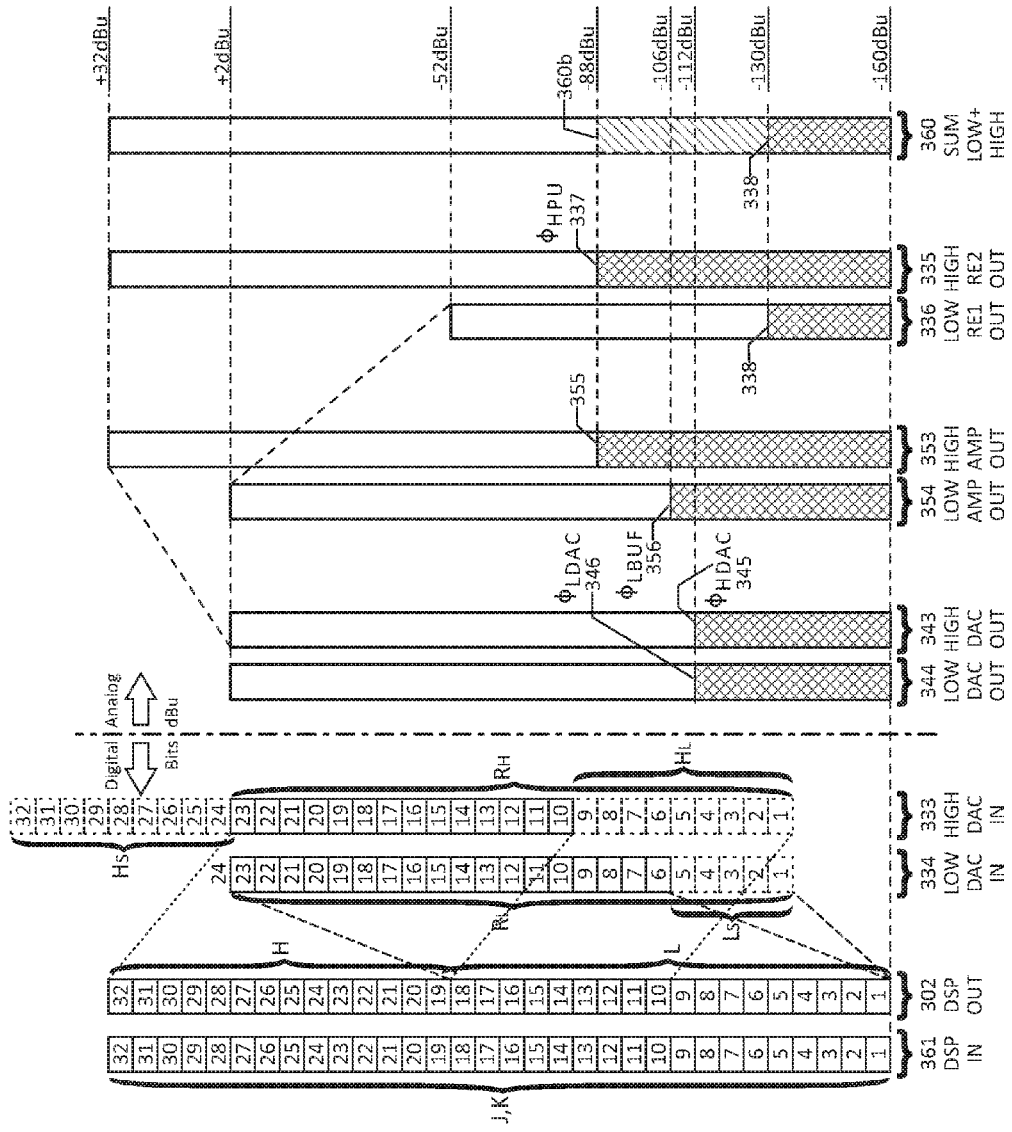
FIG. 3B shows signal and noise levels at various points in the circuit of FIG. 3A where the entire 32-bit digital input signal is utilized.

For clarity of exposition, the high-path packet (333) is shown as having H=14 bits, and bits 1 through 9 at the input to the high-path DAC (303) are represented by dotted-line boxes around the bits in FIG. 3B. It should be noted that the H=14 bits of the high-path packet (333) are the "primary" bits of the "primary" portion of the high-path packet (333) and, as represented by the dashed lines in FIG. 3B from bits 10-18 of the DSP output signal (302) to the dotted-line boxes around bits 1-9 of the high-path DAC input signal (333), the $H_L$=9 bits which are less significant than those in the H-bit primary packet are also fed from the DSP (302) to the high-path DAC (303). These less significant bits (i.e., bits 1-9 of the high-path DAC input signal (333)) comprise the "subsidiary" bits of the "subsidiary portion" of the high-path packet (333). The H primary bits are representative of the level range of the high-path DAC input signal (333) where the high-path (303), (305), (307) of the circuit (300) is utilized, while the combination of the H primary bits and the $H_L$ subsidiary bits are the actual data signal (333) fed to the high-path DAC (303).

The present invention employs a digital signal processing circuit (DSP) to partition pulse code modulated (PCM) input data into multiple smaller "bit packets" of contiguous or cross-faded or partially overlapping or fully overlapping data which are processed along separate data "paths" to increase dynamic range relative to what is possible with single-path DACs. Each-path (referred to as low, mid, high, etc.) is optimized for a partial dynamic range of the original digital signal, and then, according to the present invention, the signals from the multiple paths are summed to provide the analog output. The transitions between utilized paths, or how the paths are utilized as the input level rises or falls (i.e., "adjacent path transitions"), can occur in a contiguous or appended manner, or in an overlapped and/or cross-fading manner, and/or by summing multiple complete active paths, with any such technique under DSP control to maintain what a listener will perceive to be a linear, glitch-free output signal (i.e., a faithful rendering of the input signal) before, during and after any path transition.

Conventional (e.g., integrated circuit) DACs are often not designed with output parameters which adequately interface with typical real-world applications, such as home audio systems, professional audio systems, or live sound systems. In contrast, the DAC system of the present invention, even with its use of passive summing to provide the output signal, provides an output signal with electrical parameters appropriate for such real-world applications. The input to the circuit (300) of FIG. 3A may be a single digital signal source (301), or multiple pre-adapted digital signal sources (301) and (340), (341), etc. The digital signal source (301) or sources (301) and (340), (341), etc. are fed to a digital signal processor (DSP) (302) which divides the input signal(s) into the high-path output (333) and the low-path output (334), and directs them (333) and (334) to a high-path DAC (303) and a low-path DAC (304), respectively. The low-path output (334) is mapped upwards by $L_S$=5 bits upon input to the low-path DAC (304), and the high-path output (333) is mapped downwards by $H_S$=9 bits upon input to the high-path DAC (303). The analog output (343) and (344) of each DAC (303) and (304) is sent to an active analog amplifier (305) and (306), respectively. Typically, integrated circuit DAC outputs are differential, but the present invention is not limited to differential signal paths and can employ differential or single-ended signal paths. The amplifiers (305) and (306) can provide a number of critical functions, including but not limited to current-to-voltage conversion (IV conversion), high and/or low frequency filtering, DC servo, current buffering/current sourcing, voltage gain, and impedance buffering. In the present invention, critical requirements of these amplifiers (305) and (306) include sufficiently low noise, sufficiently low output impedance, sufficiently high output current, and sufficiently high output voltage to properly interface with a passive analog summing node (360) which combines the low-path and high-path signals into a single analog signal capable of driving real-world external devices (309) to a sufficiently high level and wide bandwidth, while maintaining sufficiently low noise and distortion. According to an alternate preferred embodiment, the passive analog summing could be implemented using an audio signal transformer(s).

It should be noted that although the high-path output signal (335), the low-path output signal (336), and the summing node output signal (365) are assigned distinct reference numerals, the electrically connecting node (360)—which physically is simply where the conductive paths from the output of the high-path resistive element (307), the output of the low-path resistive element (308), and the input to the external device (309) meet—makes those signals electrically connected. Since those signals (335), (336) and (365) are electrically connected with no intervening circuitry, those signals (335), (336) and (365) are inherently the same at all instants. Distinct reference numerals are nevertheless used for clarity of discussion. What is referred to as the high-path output signal (335) is the portion of the output signal (365) that is generated by the high-path circuitry (303), (305), and (307), and what is referred to as the low-path output signal (336) is the portion of the output signal (365) that is generated by the low-path circuitry (304), (306), and (308).

Although the present invention can be applied to circuitry and components having a wide variety of operational parameters, described herein for the purposes of example as a first preferred embodiment is the circuit (300) of FIG. 3A which has two DACs (303) and (304) which, as shown in the signal levels chart of FIG. 3B, each can accept a 24-bit input (i.e., $R_L=R_H=24$), and each can produce a maximum analog level of +8 dBu with a residual noise floor $\phi_{LDAC}$ (346) and $\phi_{HDAC}$ (345) of −112 dBu, for a total potentially usable dynamic range of 120 dB, i.e., 20 bits. Therefore, any unmapped (i.e., not processed for instance according to the present invention) digital input level (361) below −112 dBu cannot be effectively resolved at the DAC output (343) and (344) because such level is below the DACs' (303) and (304) noise floors $\phi_{LDAC}$ (346) and $\phi_{HDAC}$ (345), respectively, of −112 dBu. Hence, each DAC (303) and (304) is effectively limited to 20-bit operation, specifically input bits 5-24 which corresponds to the range of −112 dBu to +8 dBu. (However, it should be understood that although sometimes audio program signals below a noise threshold can be psychoacoustically perceived and/or digitally processed, for purposes of example in the present specification it is assumed that a measured broadband, unweighted noise floor will be the lowest usable signal level.) Furthermore, amplifier output (354) exhibits a residual unity-gain noise floor of −106 dBu, and amplifier output (353) exhibits a maximum analog level of +32 dBu with a noise floor of −88 dBu when configured at +30 dB of gain. Any analog input level (344) below −106 dBu, or any analog input level (343) below −88 dBu, cannot be effectively resolved by amplifier devices (306) and (305), respectively, because such level is below the amplifiers' residual broadband, unweighted noise floor of −106 dBu and −88 dBu, respectively.

As shown in FIGS. 3A and 3B, the DSP (302) divides a 32-bit PCM input (361) into an L=18 bit low-path DAC input signal (334) and an H=14 bit high-path DAC input signal (333). DSP (302) input bits 1 through 18 are the L=18 primary bits of the input (334) to the low-path DAC (304). The primary bits are digitally level shift mapped upwards by $L_S=5$ bits by the DSP (302) to become bits 6 through 23 of the input (334) to the low-path DAC (304). Because there are no remaining less significant bits in the input (361) to the DSP (302), the $L_S$ subsidiary bits, i.e., bits 1 through 5, of the input (334) to the low-path DAC (304) are "null" bits which may, for instance, be zeroed bits. DSP input (361) bits 19 through 32 are the H=14 primary bits of the input (333) to the high-path DAC (303). The primary bits of the input (333) to the high-path DAC (303) are digitally level shift mapped downwards by $H_S=9$ bits to input bits 10 through 23 of the input (333) to the high-path DAC (303). DSP input (361) bits 10 through 18 are the $H_L=9$ subsidiary bits of the input (333) to the high-path DAC (303). The $H_L$ subsidiary bits of the input (333) to the high path DAC (303) are also digitally level shift mapped, downwards by $H_S=9$ bits. The subsidiary bits of the input (333) therefore become input bits 1 through 9 of the input (333) to the high-path DAC (303). Level shifting or mapping of bits is defined in the present specification as where a contiguous group of bits is mapped such that all bits are shifted by the same mapping formula, i.e., the $n^{th}$ input bit is mapped to the $(n+i)^{th}$ output bit, where i is the amount of level shift applied. Equivalently, a level shift mapping can be thought of as a multiplication by $2^i$ of the signal level where i is the amount of bit level shift applied. More generally, level shift mapping is not limited to integer-wide or bit-alignment shifts within a digital register, but may result from arithmetic multiplications wherein the coefficient of multiplication may be any value within the operational range of the digital signal processing. However, bit shift mapping or level shift mapping by the DSP (302) should be understood to be a transfer of an ordered group of bits from the input of the DSP (302) to an ordered group of bits having the same ordering and provided at the input of a device following the DSP (302) (e.g., DAC (304))—this transfer may or may not involve a shifting of the nominal numbering of the bits, i.e., it may or may not involve a multiplication or level shifting. The bit-group mapping process requires that the DSP (302) performs a level shift on the high-path signal (333) and the low-path signal (334). The input (334) to the low-path DAC (304) is shifted up by +54 dB by the DSP (302), such that an input level (361) of −160 dBu for the 32-bit DSP (302) is mapped to a level of −106 dBu in terms of the 24-bit low-path DAC input (334), i.e., according to this preferred embodiment of the present invention the lowest program bit of the input (334) to the DAC (304) is mapped to just above the noise floor $\phi_{LDAC}$ (346) of the low-path DAC (304). Similarly, the input (333) to the high-path DAC (303) is effectively shifted down by −30 dB so that an input level (361) to the 32-bit DSP (302) of +32 dBu is mapped to a DAC signal level of +2 dBu at the input (333) to the 24-bit high-path DAC (303). The low-path DAC (304) receives an 18-bit signal (334) representing signal levels at the input (361) to the DSP (302) from −160 dBu to −52 dBu, i.e., a signal (334) having 108 dB of dynamic range. The 14 bits comprising the input (333) to the high-path DAC (303) represents signal levels from −52 dBu to +32 dbu, i.e., 84 dB of dynamic range.

As shown in FIG. 3B, the output (344) of low DAC (304) bit 23 has an analog level of +2 dBu and has a noise floor $\phi_{LDAC}$ (346) of −112 dBu. As also shown in FIG. 3B, the output (343) of high DAC (303) bit 23 has an analog level of +2 dBu and a noise floor $\phi_{HDAC}$ (345) of −112 dBu. As can be seen by following the successive mappings from the input (361) to the DSP (302), through the DSP (302) and the high- and low-path DACs (303) and (304), the +2 dBu signal level at the output (343) of the high-path DAC (303) represents a level of +32 dBu at the input (361) to the DSP (302), while a +2 dBu signal level at the output (344) of the low-path DAC (304) represents a level (361) of −52 dBu at the input (361) to the DSP (302).

As shown by the horizontal dashed line spanning from the top of the bar representing low-path DAC output signal (344) to the top of the bar representing low-path amplifier output signal (354) in FIG. 3B, low-path amplifier (306) is configured to provide unity gain and therefore produces an output signal (354) having a maximum level equal to that of the input (344). As can also be seen from FIG. 3B, high-path amplifier (305) is configured to provide +30 dB of gain. As mentioned earlier, the unity gain low-path amplifier (306) has a self-noise $\phi_{LBUF}$ (356) of −106 dBu. The high-path amplifier (305) produces a gain of +30 dB and has −88 dBu of self-noise (355). Therefore, as shown in FIG. 3B, the high-path amplifier (305) amplifies an input signal (343) having a maximum level of +2 dBu by +30 dB to produce a maximum level of +32 dBu at the output (353) of the high-path amplifier (305), and the amplifier's noise floor (355) of −88 dBu is the noise floor (355) of the output signal (353).

The output (353) of the high-path amplifier (305) is fed, via series switching element (315), to a high-path passive resistive element RE2 (307) (in an alternative embodiment of the invention, not shown in FIG. 3A, the series switching element (315) may follow the resistive element (307), so that the switching element (315) is connected between (307) and (335)). The series switching element (315) is controlled by a control signal (316) provided by the DSP (302). The output (354) of the low-path amplifier (306) is fed directly to a low-path passive resistive element RE1 (308). The resistive elements (307) and (308) may perform a number of functions, including signal attenuation, noise management, impedance management and frequency filtering, when required. In the examples of FIGS. 3A and 3B, resistive elements (307) and (308) have low series resistance and provide sufficiently low output impedance at (335) and (336) for proper summing of signals (335) and (336) at node (360). According to the preferred embodiment, the resistive elements RE2 (307) and RE1 (308) both exhibit 200 ohm series resistance. Additional frequency filtering (such as high-pass and/or low-pass filtering) can be added to the resistive elements (307) and (308) as may be required based on the particulars of the circuit (300) and the requirements of the external device (309).

Figure 10:
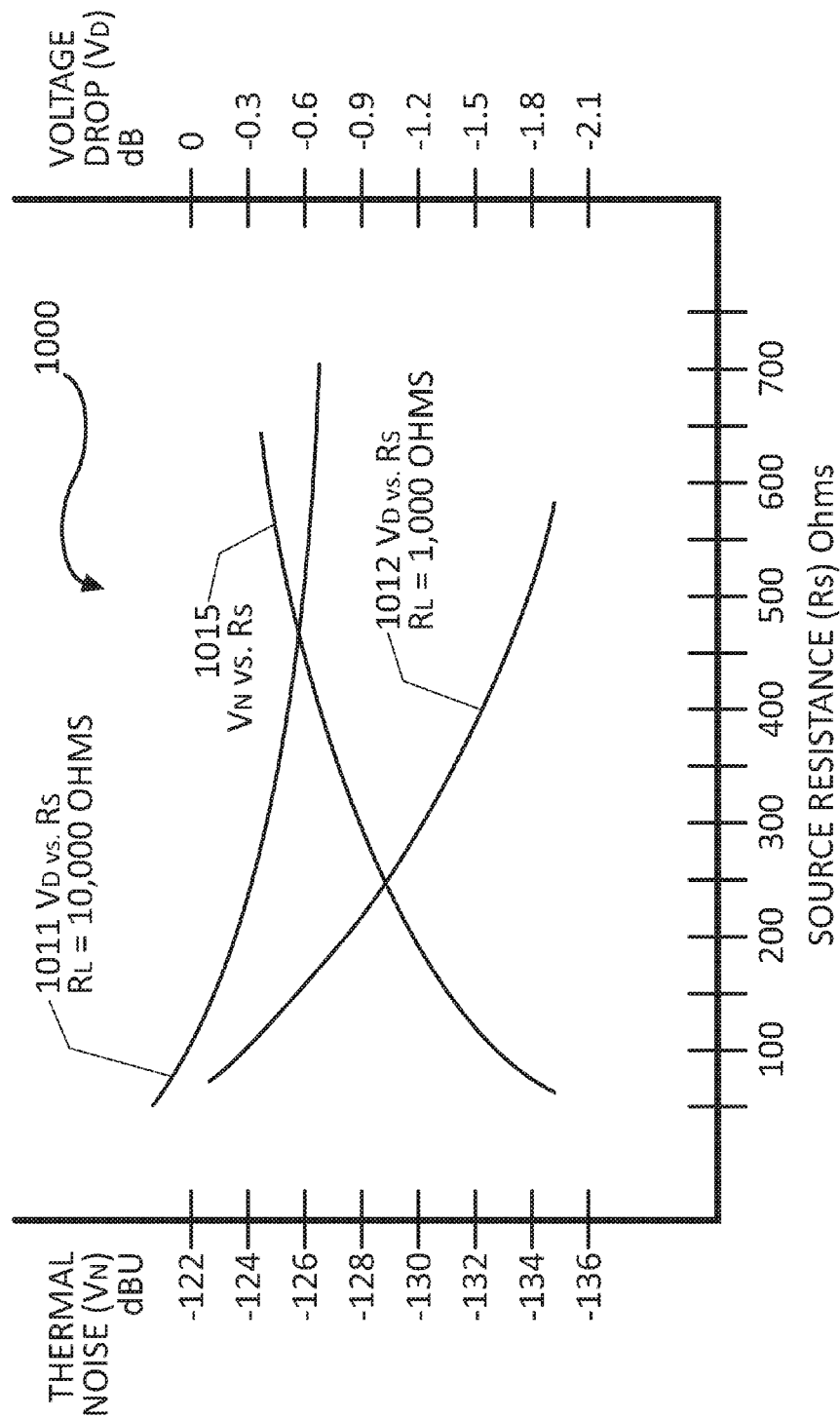
FIG. 10 shows the interrelationship of key operational parameters.

As shown in FIG. 3B, according to the preferred embodiment, the low-path resistive element RE1 (308) produces −54 dB of attenuation, provides 200 ohms series resistance, and provides for frequency filtering as may be required by the DAC (304). According to the preferred embodiment of the present invention, the high-path resistive element RE2 (307) exhibits no attenuation, provides 200 ohms series resistance, and provides for frequency filtering as may be required by the DAC (303). Other series resistance values can be employed in the resistive elements (307) and (308). As shown in FIG. 10, a lower resistance will provide lower overall thermal noise and a lower potential level loss, dependent upon the destination (309) impedance. A higher resistance will cause higher overall thermal noise and a higher potential level loss, dependent upon the destination (309) impedance.

The thermal (or Johnson-Nyquist) noise voltage $V_n$ produced by a resistor of resistance R is given by $$V_n = (4k_B TfR)^{1/2} \tag{1.1}$$

where $k_B$ is Boltzmann's Constant of $1.3806504 \times 10^{-23}$ (joule/Kelvin), T is absolute temperature in Kelvin, f is the frequency bandwidth in Hz, and R is the value of the resistance in ohms. Assuming a temperature T of 20 degrees centigrade (293.15° K), a frequency bandwidth of 20,000 Hz, and a total series resistance R of 200 ohms, the full bandwidth, unweighted noise ($V_n$) is approximately 245 nV RMS or approximately −130 dBu, as given by $$\text{dBu} = 20 \text{ Log}_{10}(V_n/0.7746) \text{ with 0dBu}=0.7746 \text{Vrms} \tag{1.2}$$

The summation node (360) is a simple physical electrical connection of the output signals (335) and (336) from the resistive elements (307) and (308), respectively. With sufficiently high source currents at (353) and (354), and sufficiently low series resistances of the resistive elements (307) and (308), the summation of the high-path output (335) and the low-path output (336) will properly interface with real world devices (309) while maintaining low noise and high output level, as will be further described below.

When the digital input signal level (361) is below L=18 bits, the high-path switching element (315) under control of DSP (302) via control line (316) is held open (as is depicted in FIG. 3A). When this switch (315) is open, it creates an open-circuit at the input to high-path resistive element RE2 (307) resulting in effectively no thermal noise $\phi_{HPU}$ (337) from the resistive element RE2 (307) reaching the summing node (360). When high-path switching element (315) is open, the only noise which is input to the summing node (360) is the thermal noise (338) generated by the low-path resistive element RE1 (308), plus any residual noise (356) generated by prior circuit elements, such as the low-path DAC (304) and low-path amplifier (306). Given that the summed noise generated by the combination of the noise $\phi_{LDAC}$ (346) from the low-path DAC (304) and the noise $\phi_{LBUF}$ (356) from the low-path amplifier (306), which is given as −106 dBu, and given that the attenuation created by low-path resistive element RE1 (308) is −54 dB, the combined noise from the low-path DAC (304) and low-path amplifier (306) is attenuated down to −160 dBu and can be neglected relative to the noise (338) of −130 dBu (roughly the thermal noise of 200 ohms series resistance) from the low-path resistive element RE1 (308).

The high-path amplifier (305) produces a gain of +30 dB, and the self-noise (355) of the high-path amplifier (305) at +30 dB gain is −88 dBu. High-path resistive element RE2 (307) provides a non-attenuated passive path which exhibits 200 ohms total series resistance (non-attenuated means, for example, that a +4 dBu signal at the input will remain a +4 dBu signal at the output when measured under no load). As the low-path output signal (336) rises and approaches a certain level, which according to the present preferred embodiment is −52 dBu, the DSP (302) sends a control signal (316) which causes high-path series switching element (315) to close (i.e., to switch to the position opposite that depicted in FIG. 3A). According to the preferred embodiment of the present invention, this switch closure occurs immediately before the DSP (302) begins to send high-path program signal to high-path DAC (303). To better anticipate the ideal point of switch (315) closure, a delay and look-ahead function could be used in the DSP (302), i.e., the input signal (361) could be slightly delayed in the DSP (302), for example on the order of a few milliseconds, while the DSP (302) determines in advance the optimal point of switch (315) closure, and activates such closure at a predetermined optimum point.

The high-path amplifier (305) produces +30 dB of gain (which is apparent in FIG. 3B by the +30 dB increase in the height of amplifier output signal (353) relative to the DAC output signal (343)) and has −88 dBu of self-noise (355).

The high-path amplifier (305) is followed by resistive element RE2 (307) which has 200 ohms total series resistance and −130 dBu of self-noise. Since the self-noise of the resistive element RE2 (307) is so much less than the noise (355) generated by the high-path amplifier (305), the total noise $\phi_{HPU}$ (337) at the output (335) of the resistive element RE2 (307) is also roughly −88 dBu. Similarly, when low-path output (336) and high-path output (335) are combined at the summing node (360), the noise (338) contributed by low-path output (336) is so much less than the noise $\phi_{HPU}$ (337) contributed by the high-path output (335) that the total noise (360b) at the summing node (360) results almost entirely from the noise $\phi_{HPU}$ (337) on high-path output (335). Because the high-path amplifier (305) output signal (353) is switched by high-path switching element (315) into electrical connection with the summing node (360) when the low-path (336) program level at summing node (360) approaches or exceeds −52 dBu, there exists a significant level difference between low-path program level (336) and high-path noise level $\phi_{HPU}$ (337) when the high-path circuitry (303) and (305) is switched into electrical connection with the output node (360). The roughly 30 dB signal-to-noise difference provides a high degree of psychoacoustic masking to the −88 dBu high-path noise level $\phi_{HPU}$ (337) added by the closure of switch (315), making the noise $\phi_{HPU}$ (337) generated by the high-path components (303), (305), (307), and (315) generally psychoacoustically undetectable. This is an important aspect of the present invention. (It should be noted that because of the inherent difficulties in measuring noise, a broadband noise measurement is typically taken with no audio program, for example music, present.)

When high-path switching element (315) is open (which is the state in which it (315) is depicted in FIG. 3A), the total series resistance into the summing node (360) is 200 ohms, i.e., the inherent series resistance of low-path resistive element RE1 (308). When high-path switching element (315) is closed (i.e., the state opposite to that depicted in FIG. 3A), the parallel resistances of low-path resistive element RE1 (308) and high-path resistive element RE2 (307) produce a total resistance at output node (360) of 100 ohms, i.e., the total resistance of RE1 (308) and RE2 (307) when connected in parallel. According to the preferred embodiment of the present invention, when high-path switching element (315) is closed the DSP (302) adjusts its digital output levels (333) and (334) to compensate for any level shift of the summed output signal (365) produced by the ratio of the change in the total source resistance against the fixed destination impedance (309) as described below. The DSP calculates the amount of compensation required based on measurements it receives via ADCs (320), (325), and (330). According to an alternative embodiment of the present invention, the series resistance of high-path resistive element RE2 (307) could be maintained constant at output node (360) with switching element (315) in either an open or closed state, i.e., a total high-path resistance of 200 ohms would remain constant at summing node (360) regardless of switch (315) state.

According to the present invention, the high-path switching element (315) is to be understood to represent any method or technique under DSP (302) control for removing or reducing the high-path output level (335) from the summing node (360) in such a manner as to eliminate or significantly reduce the self-noise generated by the high-path components (303), (305), (307). In a differential signal path, the high-path switching element (315) could be two discrete switching elements, with one switching element per each leg of the differential signal. According to an alternate embodiment, high-path amplifier (305) may employ a selectable shut-down, mute or disable (etc.) function in which a design feature of the amplifier (305) itself allows selective (i.e., DSP (302) controlled) reduction or removal of signal and noise from the output (353) of the amplifier (305). According to an alternate embodiment, high-path DAC (303) may employ a selectable shut-down, mute or disable (etc.) function so that a design feature of the DAC (303) itself allows selective (i.e., DSP (302) controlled) reduction or removal of noise from the output (343) of the DAC (303). According to another alternate embodiment, high-path resistive element (307) may employ a selectable resistance and/or switching functionality so that a design feature of the resistive element (307) itself allows selective (i.e., DSP (302) controlled) attenuation and/or series-resistive values, and thus control of noise from the output (335).

As shown in FIG. 3A, the signal levels at the summing node (360), high-level amplifier output (353), and low-level amplifier output (354) are monitored by analog-to-digital converters (ADCs) (320), (325) and (330) when switched into monitoring via associated series-path switching elements (321), (326) and (331), respectively. Each ADC device (320), (325) and (330) reports its analog input level to the DSP (302). In passive summing of signals (335) and (336) according to the present invention, there will generally be some amount of output level loss due to the relationships between the resistances of the high-path circuit (303), (305), and (307), low-path circuit (304), (306), and (308), and external device (309), both from the interplay of the summing build-out resistances, and the source/destination resistance ratios. According to the preferred embodiment of the present invention, the ADC level reporting is used by the DSP (302) to control the level of the output signals (333) and (334) to compensate for normal passive level losses and other losses or changes in output level.

Figure 3C:
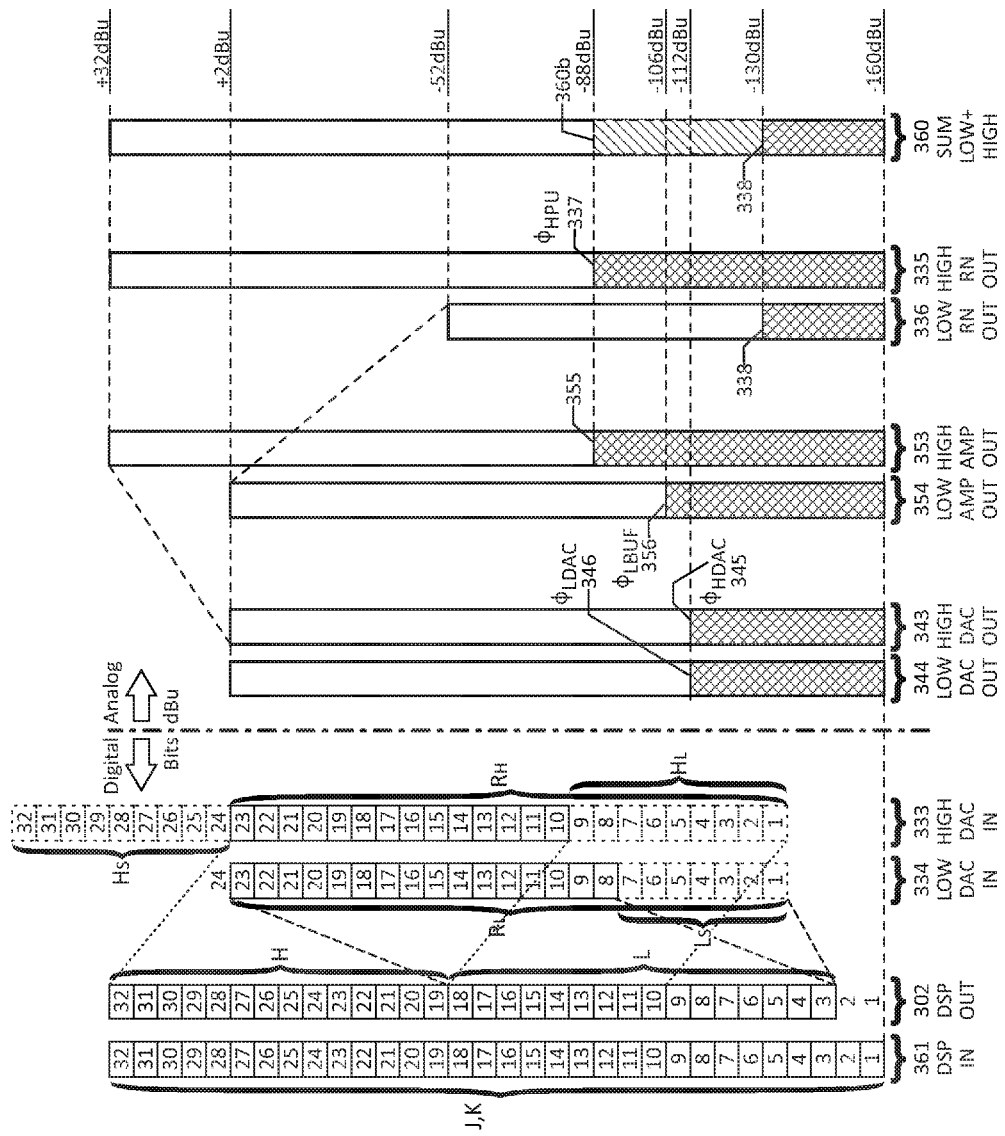
FIG. 3C shows signal and noise levels at various points in the circuit of FIG. 3A where 30 bits of the 32-bit digital input signal is utilized.

FIG. 3C shows an alternate embodiment of the present invention where not all the nominal K=32 input bits to the DSP (302) are utilized. In particular, as shown in FIG. 3C, J=30 input bits are utilized. Bits 3 through 18 (i.e., L=16 bits) are shifted upwards by $L_S$=7 bits by the DSP (302) to provide the primary digital input signal (334) to the low-path DAC (304). Bits 19 through 32 (i.e., H=14 bits) of DSP (302) input (361) are bit shift mapped downwards by $H_S$=9 bits by the DSP (302) to provide the primary digital input signal (333) to the high-path DAC (303). Bits 10 through 18 of DSP (302) input (361) are also bit shift mapped downwards by $H_S$=9 bits by the DSP (302) to provide subsidiary bits 1 through 9 of the digital input signal (333) to the high-path DAC (303). As indicated by the removed lines of the first and second bits of DSP OUT (302), the first and second bits are not utilized according to the above-specified parameters of this embodiment. The number of utilized bits J=30 (which equals in this case L and H) is less than K=32 by 2. The processing of the signals in the analog portion of the signal processing, as depicted in FIG. 3C, parallels that described above for FIG. 3B.

Figure 7:
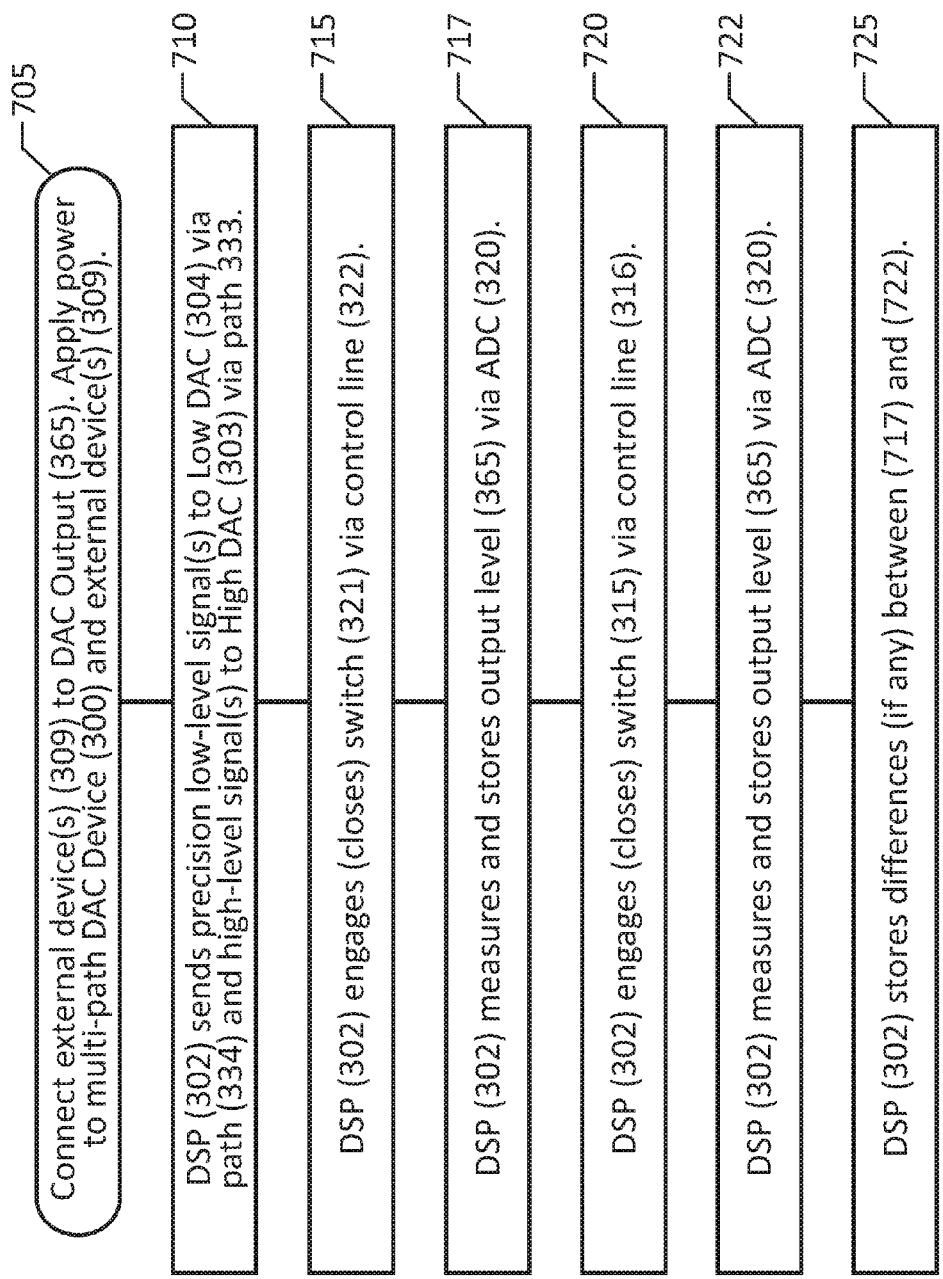
FIG. 7 shows a calibration process for the circuit of FIG. 3A.

As shown in FIG. 7, immediately upon power-on (705) of the circuit (300) of FIG. 3A and external device(s) (309), the DSP (302) will send (710) a steady-state AC signal, or a sequence of different steady-state signals, of precisely known amplitude(s) through both the high-path DAC (303) and the low-path DAC (304), while holding switching element (315) open (which is the position in which it is depicted in FIG. 3A). The DSP (302) will then send (715) a control signal via control line (322) to close switching element (321), and the DSP (302) will measure (717) the amplitude of the output signal (365) using ADC (320). Once the DSP (302) has determined and internally saved the precise amplitude of this first measurement, the DSP (302) will then send (720) a control signal via control line (316) to close switching element (315), thereby changing the source impedance seen at summing node (360). After switching element (315) is closed, the DSP (302) will again measure (722) the amplitude of the output signal (365) using ADC (320). The amplitude difference (if any) between the first and second measurements will be stored (725) in DSP (302) memory and used as a calibration factor to maintain linear performance in the course of impedance and resistance shifts due to the opening and closing of high-level switching element (315). If the external device (309) is changed, and especially if the destination (input) impedance of (309) is changed, this routine should be repeated to determine new calibration factors.

According to the preferred embodiment, the internal impedance of the ADCs (320), (325) and (330) is great enough that switching them (320), (325) and (330) into the circuit via switches (321), (326) and (331) causes minimal amplitude shifts of the signal they (320), (325) and (330) are measuring. According to the present invention, the input impedances of the ADCs (320), (325) and (330) are preferably at least ten times greater, more preferably at least twenty times greater, and still more preferably at least forty times greater than the output impedances of the components (303)/(305)/(307), and (304)/(306)/(308) in the signal paths the ADCs (320), (325) and (330) are monitoring.

Furthermore, according to the present invention, ADC (325) and ADC (330) are used to compare measured amplitudes with expected amplitudes. In particular, the DSP (302) can send control signals via control lines (327) and (328) to close high-level and low-level monitoring switches (326) and (331) thereby connecting ADCs (325) and (330) to the outputs of the high-level and low-level amplifiers (305) and (306). The difference between the measured amplitude values of DSP calibration signals, provided by ADCs (325) and (330), and the expected values are used by the DSP (302) to calculate and store correction/calibration factors. The calibration measurements will typically be taken immediately at power-on with zero input program, but can also be taken during any sufficiently long period of zero input program. The calibration measurements could also be taken concurrent with audio program (for example, music) with suitable discrimination (i.e., filtering) of audio program and calibration signal(s). Said calibration measurements may be further improved after a "warm-up" period in which a systemic thermal equilibrium is reached. Switching elements (321), (326) and (331) are used to completely remove the ADC inputs from the low-level, high-level and summed circuit paths when not in use, thereby fully removing any potentially detrimental electrical issues.

A Preferred Three-Path Embodiment According to the Present Invention

Figure 6A:
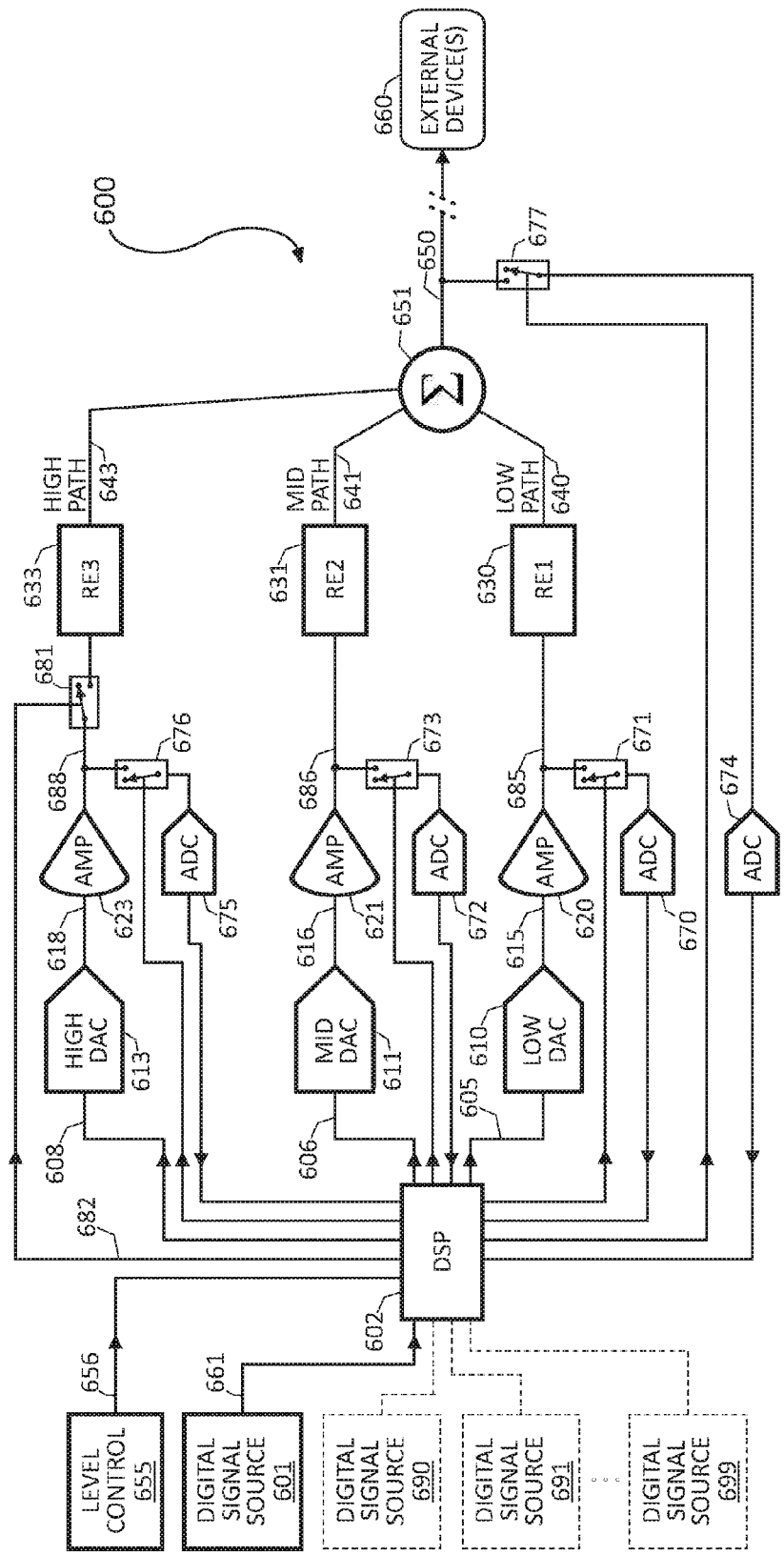
FIG. 6A shows a three-path digital-to-analog conversion circuit according to the present invention.

FIG. 6A provides a schematic of a three-path circuit (600) for a 32-bit signal according to a preferred embodiment of the present invention which provides increased maximum output level and decreased baseline (i.e., no input signal) self-noise. As shown in the signal levels chart of FIG. 6B, the circuit of FIG. 6A divides a 32-bit input signal (661) (corresponding to a signal range of 192 dB, which for the audio circuitry according to the preferred embodiment will be assigned the range of −160 dBu to +32 dBu) into three smaller words or bit packets, a low-path packet (605), and mid-path packet (606) and a high-path packet (608).

The input to the circuit (600) of FIG. 6A may be a single digital signal source (601), or multiple pre-adapted digital signal sources (601) and (690), (691), etc. The digital signal source (601) or sources (601) and (690), (691), etc. are fed to a digital signal processor (DSP) (602) which divides the input signal into a high-path output (608), a mid-path output (606) and a low-path output (605), and directs them (608), (606) and (605) to a high-path DAC (613), a mid-path DAC (611), and a low-path DAC (610), respectively. The analog output (618), (616), and (615) of each DAC (613), (611) and (610) is sent to an active analog amplifier (623), (621) and (620), respectively. Typically, integrated circuit DAC outputs are differential, but the present invention is not limited to differential signal paths and can employ differential or single-ended signal paths. The amplifiers (623), (621) and (620) can provide a number of critical functions, including but not limited to current-to-voltage conversion (IV conversion), high and/or low frequency filtering, DC servo, current buffering/current sourcing, voltage gain, and impedance buffering. In the present invention, critical requirements of these amplifiers (623), (621) and (620) include sufficiently low noise, sufficiently low output impedance, sufficiently high output current, and sufficiently high output voltage to properly interface with a passive analog summing node (651) which combines the low-path, mid-path and high-path signals into a single analog signal capable of driving typical external devices (660) to a sufficiently high level and wide bandwidth, while maintaining sufficiently low noise and distortion. Such sufficient audio specifications will be generally understood by those skilled in the art of professional audio circuit design.

Figure 6B:
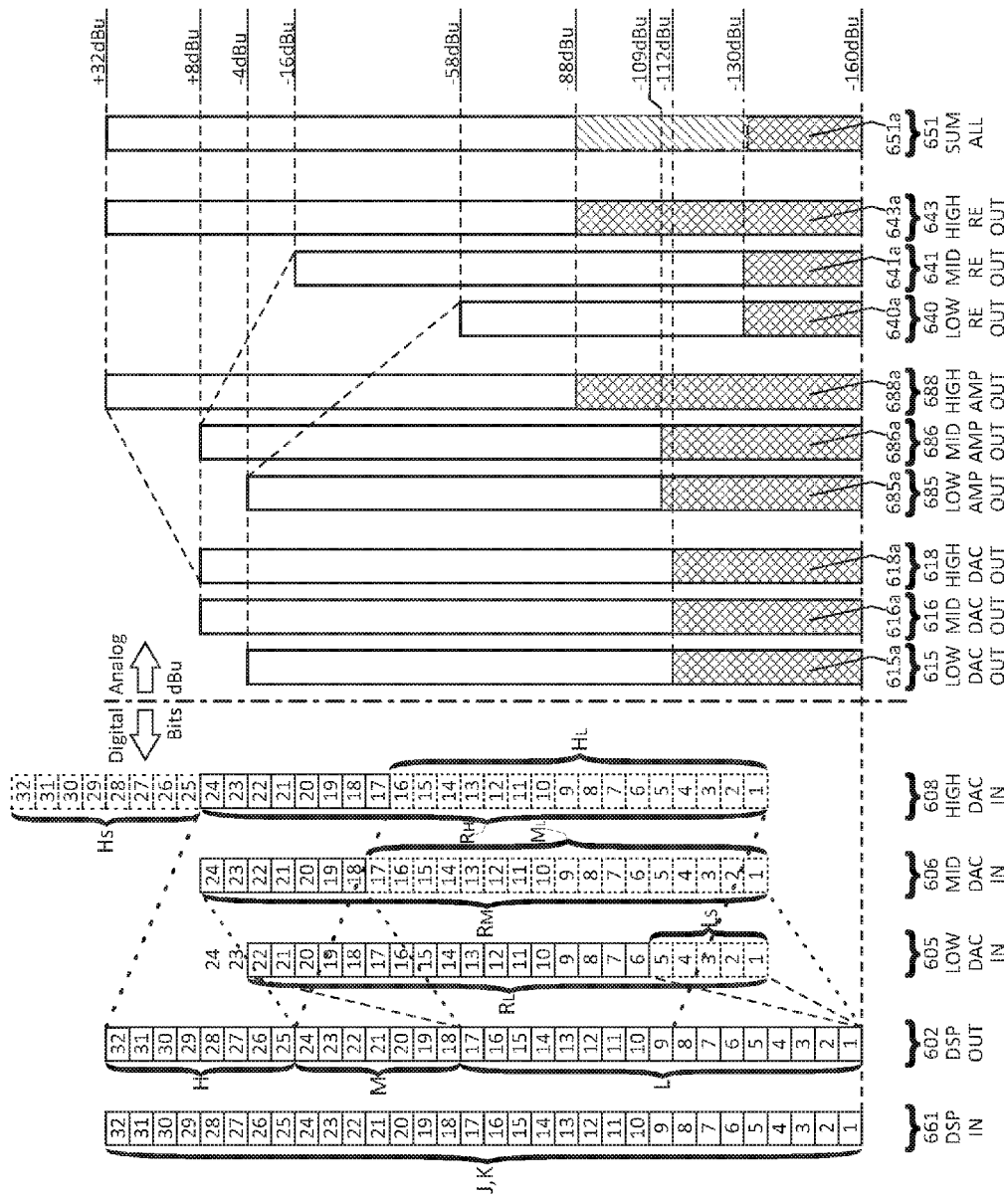
FIG. 6B shows signal and noise levels at various points in the circuit of FIG. 6A.

Although the present invention can be applied to circuitry and components having a wide variety of operational parameters, described herein for the purposes of example as a second-preferred embodiment is the circuit (600) of FIG. 6A which has three DACs (610), (611) and (613) which, as shown in the signal levels chart of FIG. 6B, can each accept a 24-bit input (605), (606) and (608), and can each produce a maximum analog level of +8 dBu with a residual noise floor (615a), (616a) and (618a) of −112 dBu, giving each DAC device (610), (611) and (613) a total noise-free dynamic range of 120 dB, i.e., 20 bits. Therefore, any unmapped digital input level (661) below −112 dBu cannot be effectively resolved at the DAC output (615), (616) or (618) because such level is below the DACs' (610), (611) and (613) residual noise floor (615a), (616a) and (618a), respectively, of −112 dBu. Hence, each DAC (610), (611) and (613) is effectively limited to 20-bit operation, specifically input bits 5-24 which corresponds to the range of −112 dBu to +8 dBu. (However, it should be understood that although sometimes audio program signals below a noise threshold can be psychoacoustically perceived and/or digitally processed, for purposes of example in the present specification it is assumed that the measured broadband, unweighted noise floor will be the lowest usable program signal level.) Furthermore, amplifiers (620) and (621) can provide a maximum analog output level (685) and (686) of +32 dBu with a residual unity gain noise floor of −112 dBu, and amplifier (623) provides a maximum analog output level (688) of +32 dBu with a residual +24 dB gain noise floor of −88 dBu (688a). The total noise at the amplifier outputs (685) and (686) is the vector sum of the −112 dBu DAC noise (615a) and (616b) and −112 dBu amplifier noise, which results in a −109 dBu noise level (685a) and (686a) at the outputs (685) and (686) of amplifiers (620) and (621). Any analog level (615) and (616) below −109 dBu cannot be effectively resolved by amplifier devices (620) and (621), and any analog level (618) below roughly −88 dBu cannot be effectively resolved by amplifier device (623) because such levels are below the amplifiers' (620), (621) and (623) respective residual noise floors.

As shown in FIG. 6A and FIG. 6B, the DSP (602) divides a 32-bit PCM input (661) into a low-path DAC input signal (605), a mid-path DAC input signal (606) and a high-path DAC input signal (608). Source (601) input bits (661) 1 through 17 (plus any null or zero bits within Ls, as is discussed in detail herein elsewhere) are mapped by the DSP (602) to input bits 6 through 22 of the input (605) to the low-path DAC (610), source (601) input bits (661) 18 through 24 (plus any less significant bits within $M_L$, as is discussed in detail herein elsewhere) are mapped by the DSP (602) to input bits 18 through 24 (and the less significant bits within $M_L$ are mapped to bits 1 through 17) of the input (606) to the mid-path DAC (611), while source (601) input bits (661) 25 through 32 (plus any lesser significant bits within $H_L$, as is discussed in detail herein elsewhere) are mapped to input bits 17 through 24 (and the less significant bits within $H_L$ are mapped to bits 1 through 16) of the input (608) to the high-path DAC (613).

In the present embodiment, the mapping process requires that the DSP (602) performs a digital level shift or mapping on the high-path signal (608), the mid-path signal (606) and the low-path signal (605). The input (605) to the low-path DAC (610) is digitally level shifted by +54 dB by the DSP (602), such that an equivalent input level (661) of −160 dBu is mapped to a DAC (610) output level (615) of −106 dBu at the low-path DAC input (605), i.e., the lowest program bit of the input signal (661) is mapped to just above the vector-summed noise floor (685a) of the low-path DAC (610) and low-path amplifier (620). Similarly, the input (606) to the mid-path DAC (611) is digitally level shifted by +24 dB so that an equivalent input level (661) of −16 dBu is mapped to a DAC (611) output level (616) of +8 dBu at the mid-path DAC input (606). The input (608) to the high-path DAC (613) is digitally level shifted by −24 dB so that an input level (661) to the DSP (602) of +32 dBu is mapped to a DAC (613) output level (618) of +8 dBu at the high-path DAC input (608). The low-path DAC (610) receives a 17-bit signal (605) (plus any null or zero bits within Ls, as is discussed in detail herein elsewhere) representing signal levels at the input (661) to the DSP (602) from −160 dBu to −58 dBu, i.e., a signal (605) (not including null or zero bits) having 102 dB of dynamic range. The 7-bit signal comprising the input (606) to the mid-path DAC (611) (plus any less significant bits within $M_L$, as is discussed in detail herein elsewhere) represents signal levels at the input (661) to the DSP (602) from −58 dBu to −16 dBu, i.e., 42 dB of dynamic range. The 8-bit signal comprising the input (608) to the high-path DAC (613) (plus any less significant bits within $H_L$, as is discussed in detail herein elsewhere) represents signal levels at the input (661) to the DSP (602) from −16 dBu to +32 dBu, i.e., 48 dB of dynamic range.

Figure 6D:
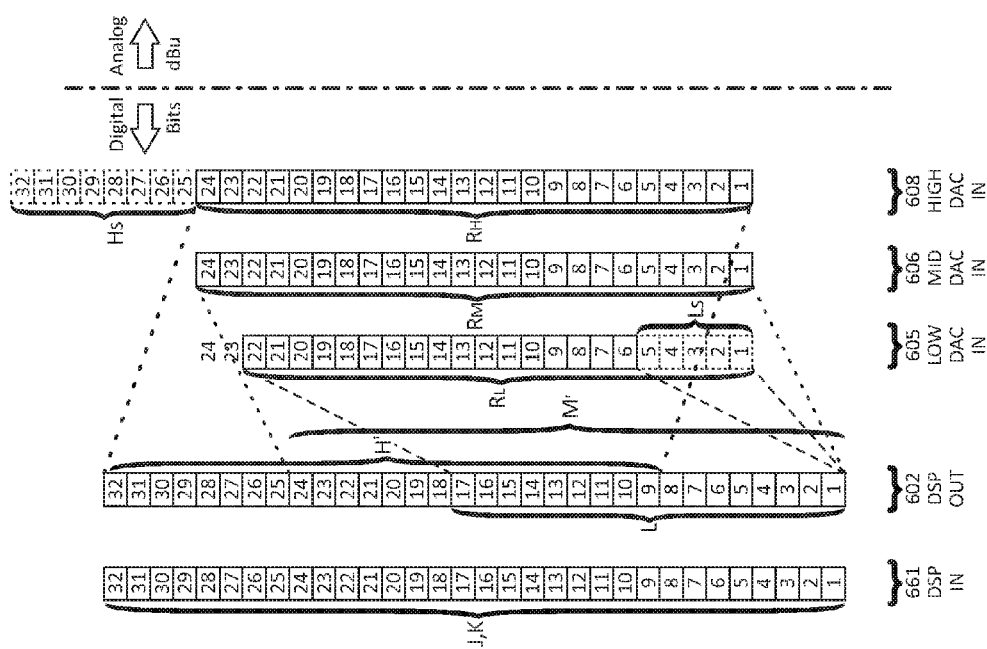
FIG. 6D shows an instance where maximal numbers of bits are directed to the mid-path and high-path digital-to-analog converters.

As shown in FIG. 6B, the output (615) of low-path DAC (610) exhibits a maximum level of −4 dBu and a noise floor (615a) of −112 dBu. As also shown in FIG. 6B, the output (616) of mid-path DAC (611) exhibits a maximum level of +8 dBu and a noise floor (616a) of −112 dBu. As also shown in FIG. 6B, the output (618) of high-path DAC (613) exhibits a maximum level of +8 dBu and a noise floor (618a) of −112 dBu. FIG. 6D shows an alternate embodiment of bit mappings (relative to the embodiment of FIG. 6B) showing the inputs (606) and (608) to the mid-path DAC (611) and the high-path DAC (613), respectively, being bit mappings of the maximum numbers of bits M'=$R_M$=24 and H'=$R_H$=24 (and a null bit transfer Ls to the low-path DAC (605)). It should be noted that, in comparison to the embodiment of FIG. 6B, in this embodiment the range of bits of the DSP output signal (602) spanned by L and M' substantially overlaps, and the range of bits of the DSP output signal (602) spanned by M' and H' substantially overlaps. The embodiment of FIG. 6D illustrates the general principle that any number of bits up to the maximum input capacity of the DACs (610), (611) and (613) (which in the current preferred embodiment is 24 bits) can be transferred from the DSP (602) to low-path DAC (610), mid-path DAC (611), and high-path DAC (613). A first dashed line from the bottom of bit 1 of DSP OUT (602) to the bottom of bit 1 of MID DAC IN (606), and a second dashed line from the top of bit 24 of DSP OUT (602) to the top of bit 24 of MID DAC IN (606), where the first dashed line being parallel to the second dashed line indicates a one-to-one ordered mapping of bits and shows that the bottom M'=$R_M$=24 bits of DSP OUT (602) are transferred to the mid-path DAC (611). Similarly, a third dashed line from the bottom of bit 9 of DSP OUT (602) to the bottom of bit 1 of HIGH DAC IN (608), and a fourth dashed line from the top of bit 32 of DSP OUT (602) to the top of bit 24 of HIGH DAC IN (608), where again the third dashed line is parallel to the fourth dashed line to indicate a one-to-one ordered mapping of bits and shows that the top H'=$R_H$=24 bits of DSP OUT (602) are transferred to the high-path DAC (613).

As shown by the horizontal dashed line spanning from the top of the bar representing low-path DAC output signal (615) to the top of the bar representing low-path amplifier output signal (685) in FIG. 6B, low-path amplifier (620) is configured to provide unity gain and therefore produces an output signal (685) having a maximum level (in dBu) equal to that of the input (615). As mentioned earlier, the unity gain low-path amplifier (620) has a self-noise of −112 dBu. As can also be seen from FIG. 6B, mid-path amplifier output (686) is configured to provide unity gain and therefore produces an output signal (686) having a maximum level (in dBu) equal to that of the input (616). As mentioned earlier, the unity gain mid-path amplifier (621) has a self-noise of −112 dBu. As shown in FIG. 6B by the dashed line spanning from the top of the bar representing high-path DAC output signal (618), to the top of the bar representing high-path amplifier output signal (688), high-path amplifier (623) is configured to provide +24 dB of gain and therefore produces an output signal (688) having an amplitude 24 dB higher than the input (618). As mentioned earlier, the high-path amplifier (623), configured with a gain of +24 dB, exhibits a self-noise (688a) of −88 dBu. Therefore, as shown in FIG. 6B, the high-path amplifier (623) amplifies an input signal (618) having a maximum level of +8 dBu by 24 dB to produce a maximum level of +32 dBu at the output (688) of the high-path amplifier (623), and the amplifier's noise floor of −88 dBu is the noise floor (688a) of the output signal (688). The output (688) of the high-path amplifier (623) is fed, via series switching element (681), to a high-path-passive resistive element RF3 (633) (in an alternative embodiment of the invention, not shown in FIG. 6A, the series switching element (681) may follow the resistive element (633), so that the switching element (681) is connected between (633) and (643)). The series switching element (681) is controlled by a control signal (682) provided by the DSP (602). The output (686) of the mid-path amplifier (621) is fed directly to the mid-path passive resistive element RE2 (631). The output (685) of the low-path amplifier (620) is fed directly to the low-path passive resistive element RE1 (630). The resistive elements can perform a number of functions, including signal attenuation, noise management, impedance management, and frequency filtering. In the example of FIG. 6A, high-path resistive element (633) provides a low series resistance, provides sufficiently low output impedance at (643) for proper summing of signals (643), (641) and (640) at node (651), and can provide for frequency filtering as may be required by DAC (613). Also in the example of FIG. 6A, the mid-path resistive element (631) provides a low series resistance, provides sufficiently low output impedance at (641) for proper summing of signals (643), (641) and (640) at node (651), and can provide for frequency filtering as may be required by DAC (611). Also in the example of FIG. 6A, the low-path resistive element (630) provides a low series resistance, provides sufficiently low output impedance at (640) for proper summing of signals (643), (641) and (640) at node (651), and can provide for frequency filtering as may be required by DAC (610).

As shown in FIG. 6A, and according to the preferred embodiment, the high-path resistive element RE3 (633) is a 200 ohm resistor exhibiting no series attenuation. This non-attenuated signal path is represented on FIG. 6B as a dashed horizontal line beginning at the top of the bar of the high-path amplifier output (688) and ending at the top of the bar of the high-path resistive element RE3 output (643). As shown in FIG. 6A and FIG. 6B, and according to the preferred embodiment, the mid-path resistive element RE2 (631) provides 200 ohms series resistance and provides −24 dB of series attenuation. This series attenuation is represented on FIG. 6B as a dashed downward sloping diagonal line beginning at the top of the bar of the mid-path amplifier output (686) and ending at the top of the bar of the mid-path resistive element RE2 output (641). As shown in FIG. 6A and FIG. 6B, and according to the preferred embodiment, the low-path resistive element RE1 (630) provides 200 ohms series resistance and provides −54 dB of series attenuation. This series attenuation is represented on FIG. 6B as a dashed downward sloping diagonal line beginning at the top of the bar of the low-path amplifier output (685) and ending at the top of the bar of the low-path resistive element RE1 output (640). Hence, from our earlier analysis of resistive thermal noise, and as can be seen from FIG. 6B, the noise levels (640*a*) and (641*a*) at the resistive element outputs (640) and (641) which follow the resistive elements RE1 (630) and RE2 (631) are no higher than roughly −130 dBu.

The summation node (651) is a simple physical electrical connection of the output signals (640), (641) and (643) from the resistive elements (630), (631) and (633), respectively. With sufficiently high source current at (685), (686) and (688), typically no less than roughly 10 mA per path, and sufficiently low series resistance of the resistive elements (630), (631) and (633), which we have given as 200 ohms per series path for our preferred embodiment, the passive summation of the high-path, mid-path and low-path outputs (643), (641) and (640) at summing node (651) will suitably interface with typical real world external devices (660), meaning that the summed signal output (650) will maintain high level, high current, high bandwidth, low noise, and low distortion when coupled with typical external devices (660).

When the digital input signal level (661) is below 25 bits, the high-path switching element (681) under control of DSP (602) via control line (682) is held open (as is depicted in FIG. 6A). When this switch (681) is open, it creates an open-circuit at the input to high-path resistive element RE3 (633) resulting in effectively zero thermal noise from the resistive element RE3 (633) reaching the summing node (651). When high-path switching element (681) is open, the only noise which is input to the summing node (651) is the thermal noise generated by the lower path resistive elements RE1 (630) and RE2 (631), plus any residual noise generated by prior circuit elements, such as the low-path DAC (610), low-path amplifier (620), mid-path DAC (611), and mid-path amplifier (621). Referring to FIG. 6B, given that the summed noise generated by the combination of low-level DAC (610) and amplifier (620) is roughly −109 dBu (685*a*), and given that the attenuation created by low-path resistive element RE1 (630) is −54 dB, the noise from the low-level DAC (610) and amplifier (620) is attenuated by RE1 (630) down to −163 dBu and can be neglected relative to the thermal noise of −130 dBu (640*a*) generated from the low-path resistive element RE1 (630). Given that the summed noise generated by the combination of the mid-level DAC (611) and mid-level amplifier (621) is roughly −109 dBu (686*a*), and given that the attenuation created by mid-path resistive element RE2 (631) is −24 dB, the sum of all noise from the mid-level DAC (611), mid-level amplifier (621), and mid-path resistive element RE2 (631) is very roughly −130 dBu (641*a*). When the low-path output (640) and the mid-path output (641) are combined at the summing node (651), and the high-path output (643) is not connected into the summing circuit (651), the 200 ohms series resistance of the low-path resistive element RE1 (630) combines in parallel with the 200 ohms series resistance of the mid-path resistive element RE2 (631), creating a total series resistance of 100 ohms, which can further reduce the total thermal noise (651*a*) as measured at the summing node (651).

The high-path amplifier (623) produces a gain of +24 dB, and the noise (688*a*) at the output (688) of the high-path amplifier (623) at +24 dB gain is −88 dBu (i.e., the high-path DAC (613) noise (618*a*) of −112 dBu is negligible compared with the high-path amplifier (623) noise). High-path resistive element RE3 (633) is a non-attenuated passive path which exhibits 200 ohms series resistance. As the mid-path output signal (641) rises to/approaches a certain level, which according to the present preferred embodiment is −16 dBu, the DSP (602) sends a control signal (682) which causes high-path series switching element (681) to close (i.e., to switch to the position opposite that depicted in FIG. 6A). According to the preferred embodiment of the present invention, this switch closure occurs immediately before the DSP (602) begins to send high-path-program signal (608) to high-path DAC (613).

The high-path amplifier (623) produces +24 dB of gain (which is apparent in FIG. 6B by the 24 dB increase in the height of amplifier output signal (688) relative to the DAC output signal (618)) and has −88 dBu of noise (688*a*). The high-path amplifier (623) is followed by resistive element RE3 (633) which has 200 ohms total series resistance and −130 dBu of thermal self-noise. Since the self-noise of the resistive element RE3 (633) is so much less than the noise generated by the high-path amplifier (623) and high-path DAC (613), the total noise (643*a*) at the output (643) of the resistive element RE3 (633) is roughly −88 dBu. Because the high-path amplifier (623) output signal (688) is switched by high-path switching element (681) into electrical connection with the summing node (651) when the mid-path program level (641) at summing node (651) is at or near −16 dBu, there exists a roughly 70 dB level difference (the level difference between −88 dBu and −16 dBu) between mid-path-program level (641) and high-path noise level (643*a*) when the high-path (643) is switched into electrical connection with the output summing node (651). The roughly 70 dB signal-to-noise difference provides a very high degree of psychoacoustic masking to the −88 dBu high-path noise level added by the closure of switch (681), making the total noise (643a) generated by the high-path components (613), (623), (681) and (633) generally psychoacoustically undetectable.

When high-path switching element (681) is open (which is the state in which it (681) is depicted in FIG. 6A), the total series resistance into the summing node (651) is 100 ohms, i.e., the total series resistance of low-path and mid-path resistive element RE1 (630) and RE2 (631) in parallel (neglecting the source resistance of amplifiers (620) and (621) because it is low). When high-path switching element (681) is closed (i.e., the state opposite to that depicted in FIG. 6A), the parallel resistances of low-path resistive element RE1 (630), mid-path resistive element RE2 (631) and high-path resistive element RE3 (633), not including the negligible source resistance of amplifiers (620), (621), and (623), produces a total series resistance at output node (651) of roughly 66.7 ohms, i.e., the total resistance of RE1 (630), RE2 (631) and RE3 (633) when connected in parallel. At the moment in which high-path switching element (681) is closed, according to the preferred embodiment of the present invention, the DSP (602) adjusts its digital output levels (605), (606) and (608) as required to compensate for any level shift of the output signal (650) produced by the change in the total (summed) circuit resistance. The DSP (602) calculates the amount of level compensation required based on prior measurements it receives via ADCs (670), (672), (674) and (675), as described elsewhere. In an alternative embodiment, RE3 resistive element (633) input is connected to ground when the high-path is not in use and RE3 (633) input is connected to amplifier (623) when the high-path is selected for use. In this manner, using a suitable switching technique (e.g., make-before-break, etc.), the high-path source resistance (643) seen at summing node (651) remains roughly constant whether the high-path is in-use or not in-use.

According to the present invention, the high-path switching element (681) is to be understood to represent any method or technique under DSP (602) control for removing or reducing the high-path output level (643) from the summing node (651) in such a manner as to eliminate or significantly reduce the self-noise generated by the high-path components (613), (623) and (633).

In a differential signal path, the high-path switching element (681) could be two discrete switching elements, with one switching element per each leg of the differential signal. According to an alternate embodiment, more than one DAC path may employ a series-switching element used for the purpose of reducing or removing path noise from the summing node. According to an alternate embodiment, high-path amplifier (623) may employ a selectable shut-down, mute or disable (etc.) function in which a design feature of the amplifier (623) itself allows selective (i.e., DSP (602) controlled) removal or reduction of signal and noise from the output (688) of the amplifier (623). In the preferred embodiment, a reed relay is used for switching element (681) due to its fast switching speed, electrically and physically quiet operation, and complete removal of the high-path noise generation devices (613), (623) and (633) from the output summing node (651).

As shown in FIG. 6A, the signal levels at the output (650) of the summing node (651), and the outputs (688), (686) and (685) of all amplifiers (623), (621) and (620), are monitored by analog-to-digital converters (ADCs) (674), (675), (672) and (670), respectively, when switched into monitoring via associated series-path switching elements (677), (676), (673) and (671), respectively. Each ADC device (674), (675), (672) and (670) reports its analog input level to the DSP (602).

Figure 8:
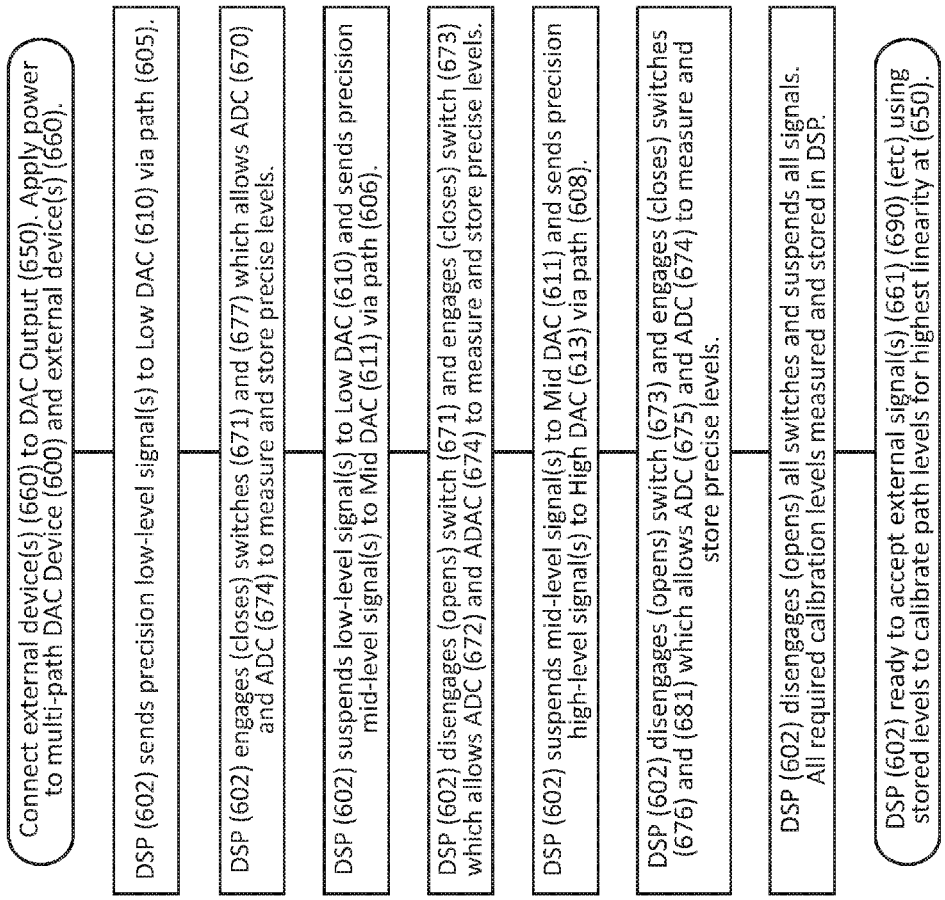
FIG. 8 shows a calibration process for the circuit of FIG. 6A.

One preferred embodiment of ADC monitoring for DSP level calibration is given in the flow chart of FIG. 8. According to the preferred embodiment of the present invention, ADC level reporting is used by the DSP (602) to adapt to circuit and external variations by calibrating the level of the output signals (688), (686), (685) and (650). If the external device (660) is changed, and especially if the destination (input) impedance of (660) is changed, the calibration routine described below and shown in FIG. 8 should be repeated to determine new calibration factors. According to the preferred embodiment, the input impedance of the ADCs (674), (675), (672) and (670) is great enough that switching them (674), (675), (672) and (670) into the circuit via switching elements (677), (676), (673) and (671) causes minimal amplitude shifts of the signal they (674), (675), (672) and (670) are measuring. According to the present invention, the input impedances of the ADCs (674), (675), (672) and (670) are preferably at least ten times greater, more preferably at least twenty times greater, and still more preferably at least forty times greater than the output impedance of the circuit point the ADCs (674), (675), (672) and (670) are monitoring.

Furthermore, according to the present invention, ADC (674), (675), (672) and (670) are used to compare measured amplitudes with expected amplitudes. In particular, the DSP (602) can close any desired combination of switching elements (677), (676), (673) and (671), thereby connecting ADCs (674), (675), (672) and/or (670) to the outputs (688), (686) and (685) of the high-, mid- and low-level amplifiers (623), (621) and (620), and the summed output (650). The difference between the measured amplitude values provided by ADCs (674), (675), (672) and/or (670) and the expected values in DSP (602) memory are used by the DSP (602) for calculating and storing correction/calibration factors or coefficients. The calibration measurements will typically be taken at power-on with zero input program (661), but can also be taken during any sufficiently long period of zero input program (661). The calibration measurements could also be taken concurrent with audio program (for example, music) with suitable discrimination (i.e., filtering) of audio program and calibration signal(s). Systemic performance from said measurements may be further improved after a "warm-up" period in which a systemic thermal equilibrium is reached. Switching elements (677), (676), (673) and (671) are used to completely remove the ADC inputs from their respective circuit paths when not in use, thereby fully removing any potentially detrimental electrical issues.

As shown in FIG. 6A, the circuit (600) of the present invention is not limited to a single digital signal source (601), i.e., the circuit (600) may be utilized for the D-A conversion of a plurality of previously conditioned or "pre-adapted" multi-path signals (i.e., any contiguous signal that has been pre-conditioned (split) into two or more discrete paths for the purpose of improved dynamic range. Additional digital signal input sources (690), (691) . . . (699) are represented here in a multi-input parallel topology for clarity, but such multi-path sources can also be configured in a single input serial topology, or hybrid series-parallel topology, or any other appropriate method or topology of digital data transfer, transmission, and/or input.

A method of level control will now be described which takes advantage of the novel architecture of the present invention, wherein the levels of the analog outputs (685), (686), and (688) are shifted by dynamically altering the DSP multi-path bit-shift mapping characteristics.

As described above in reference to FIG. 6A, a digital signal (661) is mapped (605), (606) and (608) into multiple DAC devices (610), (611) and (613) by DSP (602). The mapping is done in a manner which achieves a fixed (non-adjustable) analog level range at the output (650) with respect to the input (661). However, according to this alternate embodiment the level of the analog output (650) can be varied by DSP (602), either higher or lower, by adjusting the mapped location of input bits (661) via a level adjustment control (655) connected to DSP (602) via signal path (656), as is shown in FIG. 6A. The level adjustment control (655) can be any manner of input control or control device to the DSP (602) which provides a signal (656) to the DSP (602) which instructs the DSP (602) to carry out a resultant level adjustment. Some examples of such a level control (655) or control device (655) include, but are not limited to, gray-coded rotary encoder control, quadrature rotary encoder control, up-down control via switches, or any other means well-known to those skilled in the art of digital control.

Figure 9:
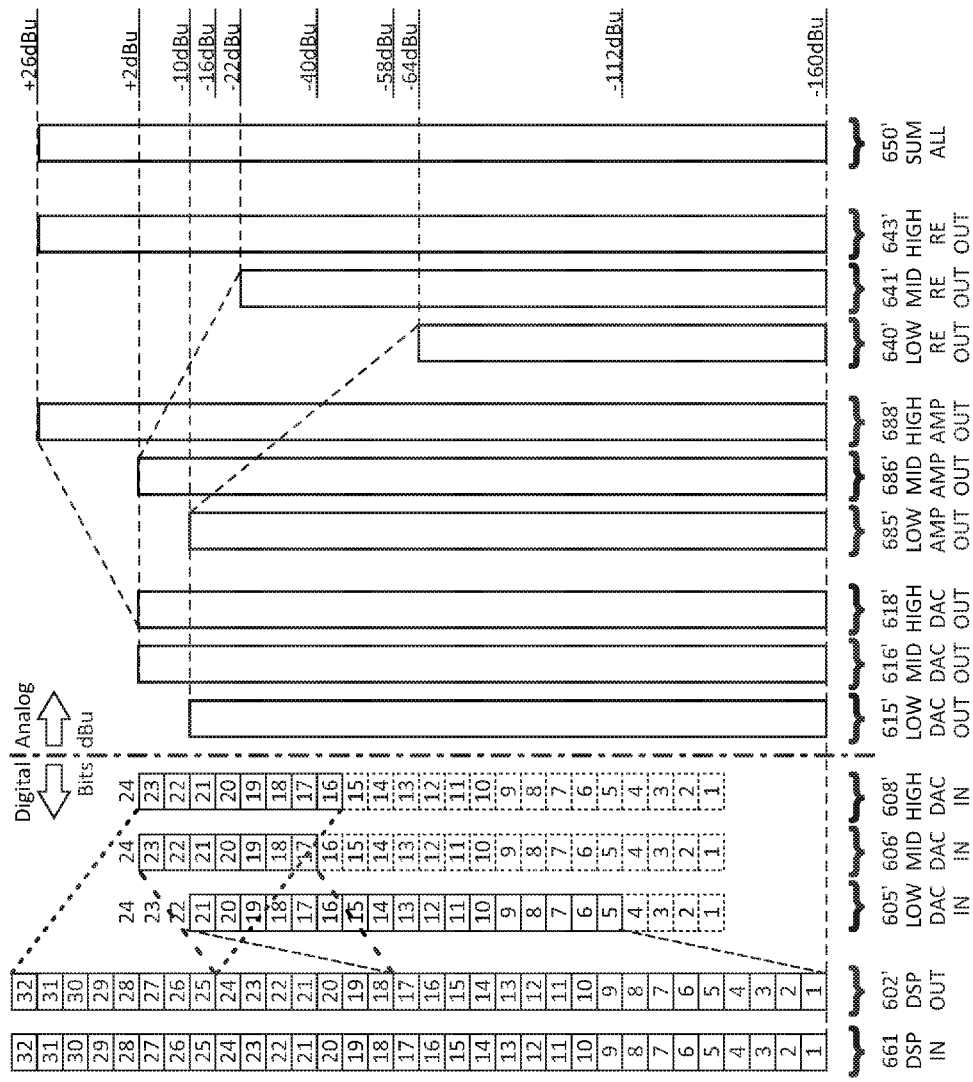
FIG. 9 shows signal levels at various points in the circuit of FIG. 6A when there is a −6 dB shift in levels relative to those shown in FIG. 6B.

As shown in FIG. 6B, the 32 bit digital input signal (661) corresponds to an analog level range of −160 dBu to +32 dBu resulting in a usable output (650) level range of −130 dBu to +32 dBu. The cross-hatching below −130 dBu indicates that range is not usable because of noise. In comparison, FIG. 9 shows an example where the maximum level of the output (650') is reduced by −6 dB relative to the digital input signal (661). (Shifted levels relative to those of FIG. 6B are noted by primed reference numerals. For clarity of depiction, the noise levels shown in FIG. 6B are not depicted in FIG. 9 since their characteristics are adequately described in FIG. 6B). This −6 dB reduction in output range is achieved by a downward level shift by the DSP (602) by 1 bit at each input (605'), (606'), and (608') to the DACs (610), (611) and (613). More specifically, as shown in FIG. 9, to achieve a level reduction of −6 dB at the output (650') relative to the output level (650) achieved in FIG. 6B, the source (601) input bits (661) 1 through 17 are mapped by the DSP (602') to input bits 5 through 21 of the input (605') to the low-path DAC (610), source (601) input bits (661) 18 through 24 are mapped by the DSP (602') to input bits 17 through 23 of the input (606') to the mid-path DAC (611), and source (601) input bits (661) 25 through 32 are mapped by the DSP (602') to input bits 16 through 23 of the input (608') to the high-path DAC (613) (along with any required subsidiary bits as described previously, not specifically shown on FIG. 9).

Therefore, as shown in FIG. 9, to achieve the −6 dB output (650') level reduction relative to the output level (650) achieved in FIG. 6B, the DSP (602) performs a digital level shift such that the input (605') to the low-path DAC (610) is shifted up by 4 bits by the DSP (602) so that bit 1 of input signal (661), which corresponds to an analog level of −160 dBu in the 32-bit DSP (602'), is mapped to bit 5 of the low-path DAC (610), which corresponds to a level of −112 dBu of the 24-bit low-path DAC output (615'). The input (606') to the mid-path DAC (611) is shifted down by 1 bit by the DSP (602') so that bit 18 of input signal (661), which corresponds to an analog level of −58 dBu in the 32-bit DSP (602), is mapped to bit 17 of the mid-path DAC (611), which corresponds to an analog level of −40 dBu at the output (616') of the 24-bit mid-path DAC (611). The input (608') to the high-path DAC (613) is shifted down by 9 bits by the DSP (602') so that bit 32 of input signal (661), which corresponds to an analog level of +32 dBu in the 32-bit DSP (602'), is mapped to bit 23 of the high-path DAC (613), which corresponds to an analog level of +2 dBu at the output (618') of the high-path DAC (613).

Therefore, when the low-path bits (605'), mid-path bits (606') and high-path bits (608') are shifted in the manner described above and shown in FIG. 9, the analog level of DAC outputs (615'), (616'), and (618') are −6 dB lower relative to the DAC output levels (615), (616), and (618) described above in reference to FIG. 6B. Furthermore, when the low-path bits (605'), mid-path bits (606'), and high-path bits (608') are all shifted in a manner described above and shown in FIG. 9, the output levels (685'), (686'), and (688') of amplifiers (620), (621), and (623) are −6 dB lower than the amplifier output levels (685), (686), and (688) described above in reference to FIG. 6B, respectively. Furthermore, when the low-path bits (605'), mid-path bits (606'), and high-path bits (608') are shifted in the manner described above and shown in FIG. 9, the output levels (640'), (641'), and (643') of resistive elements (630), (631), and (633) are −6 dB lower than the resistive element output levels (640), (641), and (643) described above in reference to FIG. 6B. Hence, the low-path, mid-path, and high-path output signals (640'), (641'), and (643') shown in FIG. 9 are at all times −6 dB lower than the low-path, mid-path, and high-path output signals (640), (641), and (643) shown in FIG. 6B, and FIG. 9 describes an embodiment of the invention where a −6 dB level shift at output (650') is achieved relative to the output level (650) described above in reference to FIG. 6B. Therefore, a downward level shift at the analog output (650) can be realized via appropriate digital level shifting implemented by the DSP (602). Similarly, an upward relative level shift at analog output (650) can also be realized via appropriate digital level shifting implemented by the DSP (602).

For clarity, the level shifting described above is implemented by integer-stepped bit shifts, resulting in 6 dB increments in shifts of level. But more generally, DSP-implemented level shift adjustments can be realized in steps smaller than 6 dB, within the operational range of the DSP (602). Level shift mapping, as described above, is not limited to integer-wide or bit-alignment shifts within a digital register, but may result from arithmetic multiplications wherein the coefficient of multiplication may be any value within the operational range of the digital signal processing. For a change in level to be psychoacoustically perceived as linear (i.e., non-stepped), audio level changes of no greater than roughly 0.1 dB per increment are required, i.e., increments at or below the "just noticeable difference" in level shifts (see *Introduction to the Physics and Psychophysics of Music*, Juan Roederer, Springer Verlag, 1978, p 81, which is incorporated herein by reference).

According to an alternate embodiment of the present invention, rather than the DSP (602) implementing the level controls, there is a means for level control associated with each DAC. Each level control may be implemented as an analog potentiometer, adjustable resistor, or a digitally-controlled analog leveling device, or a digital gain function in the DSP (602), or a gain control in the DAC devices (610), (611) and (613) themselves.

It should be understood that the system of the present invention may also be applied to more than three paths. For instance, FIG. 6C shows an exemplary division of a K=32 bit input signal into a L=10 bit low-path signal (plus any required null or zero bits at Ls) taken from bits 1 through 10 of DSP IN, a first $M_1$=5 bit middle-path signal (plus any required null/zero bits and any required lower significant bits) taken from bits 11 through 15 (and below, as required) of DSP IN, a second $M_2$=6 bit middle-path signal (plus any required null/zero bits and any required lower significant bits) taken from bits 16 through 21 (and below as required) of DSP IN, a third $M_3=4$ bit middle-path signal (plus any required lower significant bits) taken from bits 22 through 25 (and below as required) of DSP IN, and a H=7 bit high-path signal (plus any required lower significant bits) taken from bits 26 through 32 (and below as required) of DSP IN. The DSP digitally level shifts the L=10 bit low-path signal upwards by 5 bits to provide LOW DAC IN. It should be noted that, in the present embodiment, bits 16 through 24 of the $R_L=24$ low-path DAC are generally not utilized. As indicated by the dashed boxes of bits 1 through 19 of MID1 DAC IN, the DSP shifts or maps the $M_1=5$ bit first middle-path signal upwards 9 bits. As indicated by the dashed boxes of bits 1 through 18 of MID2 DAC IN, the DSP shifts or maps the $M_2=6$ bit second middle-path signal upwards by 3 bits. And as indicated by the dashed boxes of bits 1 through 20 of MID3 DAC IN, the DSP shifts or maps the $M_3=4$ bit third middle-path signal downwards by 1 bit. As indicated by the dashed boxes of bits 1 through 17 and 25 through 32 of HIGH DAC IN, the DSP shifts or maps the H=7 bit high-path signal downwards by $H_S=8$ bits. In this example, LOW DAC IN, MID1 DAC IN, MID2 DAC IN, MID3 DAC IN, MID4 DAC IN and HIGH DAC IN have input ranges of $R_L=R_{M1}=R_{M2}=R_{M3}=R_H=24$ bits.

As depicted in FIG. 4, according to an alternate embodiment of the present invention rather than having the DSP (410) divide an incoming digital signal into bit paths (111) and (112), or (203), (204) and (205), or (333) and (334) as shown in FIGS. 1A, 1B, 2A, 2B and 3A, the digital signal processor (DSP) (410) may have multiple digital inputs (412), (413) and (414) which receive digital signals (402), (403), and (404), respectively, which represent "pre-adapted" portions of an original signal (401). Although a 32-bit digital input signal (401) is shown in FIG. 4, it should be noted that the input signal (401) may be comprised of any number of bits. The original input signal (401) is divided into three smaller partial input signals (402), (403) and (404) that each feed separate DSP (410) inputs (412), (413) and (414). The partial pre-adapted input signals (402), (403) and (404) can represent any pre-adapted source (e.g., microphone, general transducer, A-D converter output, digital workstation output, etc.). The partial signals (402), (403) and (404) may have some overlap of data between paths, such as is shown FIG. 4 where bits 11-12 (420) are shared by low-level and mid-level signals (402) and (403), and bits 22-23 (421) are shared by mid-level and high-level signals (403) and (404). Alternatively, the partial-path signals (402), (403) and (404) may be contiguous with no bit overlap. According to another alternative embodiment, any number of partial-path sources could be packaged into a single serial data stream, or any other manner of digital transmission or input. In one alternative embodiment, the processing would then be as shown in FIG. 3A, where the DSP (in this case (302) rather than (401)) would then align the multi-path input data (402), (403) and (404) into two output paths feeding high-level DAC (303) and low-level DAC (304). The invention provides for any multiple of multi-path input signals to feed any number of multi-path DACs, divided into any number of bits or sub-bits per path.

Figure 5:
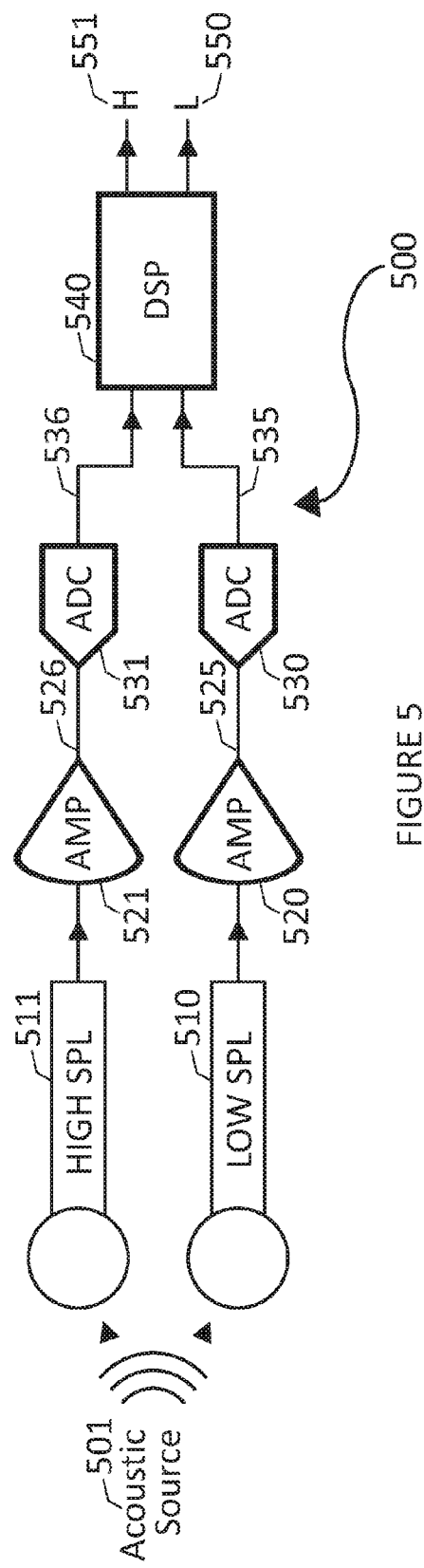
FIG. 5 shows a schematic of system which utilizes the present invention in the processing of sound captured by a low sound-pressure level microphone and a high sound-pressure level microphone.

In another alternate embodiment (500) shown in FIG. 5, two audio microphones (510) and (511) are utilized. The two microphones (510) and (511) are exposed to a wide dynamic range acoustic source (501). Microphone (510) is optimized for performance with relatively low sound-pressure level (SPL) acoustic signals. Microphone (511) is optimized for performance with relatively high SPL acoustic signals. Each microphone (510) and (511) feeds a conditioning amplifier (520) and (521), respectively, with each conditioning amplifier (520) and (521) providing suitable gain, input and output impedance, and other preferred-performance characteristics as familiar to one skilled in the art of microphone termination, for instance according to the means and methods described in www.thatcorp.com/datashts/ AES129_Designing_Mic_Preamps.pdf, which is incorporated herein by reference. The high-path and low-path outputs (526) and (525) from the conditioning amplifiers (521) and (520), being suitably conditioned, are then fed to analog-to-digital converters (ADCs) (531) and (530), respectively. The output of each ADC (536) and (535) then feeds the inputs of a suitable DSP (540). The system (500) of FIG. 5 may be applied to the system (300) of FIG. 3A, in which case the outputs (536) and (535) of the ADCs (531) and (530) would be the digital signal sources (301) and (340), and the digital outputs (551) and (550) would be the inputs (333) and (334) to the high-path DAC (303) and the low-path DAC (304), respectively.

Of course, FIG. 4 and FIG. 5 show just two examples (400) and (500) among myriad possible applications of the present invention for feeding multiple DACs a plurality of pre-adapted digital signals that represent a single program (as opposed to feeding a single original signal to DSP that then feeds multiple multi-path DACs). Any number of multi-path-program signals could be used.

As per equations (1.1) and (1.2), thermal noise $V_N$ rises with circuit source resistance $R_S$ as is shown in FIG. 10 by curve (1015). Therefore, the resistances of the resistive elements (307) and (308) and (630), (631) and (633) must not be too large or else signal-to-noise will be compromised. As is also shown in FIG. 10, as the source resistance $R_S$ increases, the voltage drop VD across the output increases (1011) and (1012), where the amount of voltage drop VD is dependent also on the load $R_L$ of the external device(s) (309) and (660). Therefore, it is advantageous for the resistive elements (307), (308), (630), (631) and (633) to have a low level of resistance providing low systemic signal-to-noise and voltage drop. Therefore according to the present invention, it is preferred criteria for each resistive element to have a resistance of between 10 and 1,000 ohms, and more preferably a resistance between 30 and 300 ohms.

Alternative Embodiments for High-Path Noise Reduction

High-path (or higher-paths) switching or or other means to reduce or remove noise from the high path(s) are now elaborated upon. One aspect of the present invention is that the high path(s) gain is digitally-adjustable, so that when the path is not in use, the lowest gain setting (and hence the lowest amplifier noise performance) can be realized. Any functional element of the high path(s) (e.g., DAC, amplifier, attenuator, etc.) can also operate as a digitally-controlled (i.e., DSP-controlled) noise reducing element to exhibit the lowest possible noise when said high path(s) (i.e., non-low-paths) is/are not used for transporting audio information, and may provide said control via adjustable resistive adjustment (s), switching elements, or other methods or functional attributes. For example, the amplifier in a low-noise configuration (i.e., an amplifier configured with lower gain will generally provide lower noise than an amplifier configured with higher gain) is followed by an attenuator which is configured to reduce noise to some level commensurate with a low noise systemic design goal. For instance, if the total quiescent noise measured at the amplifier output, which is the sum of all noise generated previous to, and internal to, the amplifier (i.e., DAC noise+amplifier noise, etc.), is measured at −115 dBu, and the design goal is to achieve a total noise at the path output of −130 dBu, then an attenuator of −20 dB, with 127 ohms total series resistance (127 ohms resistance exhibits −131.7 dBu of thermal noise) is placed after the amplifier, causing the total quiescent noise at the attenuator output (the point where the path is sent to the summing node) to be about −130 dBu, i.e., noise at amplifier output (−115 dBu) less attenuation (−20 dB) plus vector sum thermal noise of attenuator (−131.7 dBu). In the present alternative embodiments, various means are shown to reduce path element noise, including the use of a selectable shut-down, mute or disable function in which a design feature of the amplifier or DAC itself allows selective (i.e., DSP- or digitally-controlled) removal or reduction of signal and/or noise from the output of the amplifier or DAC or other controllable active path element. Another technique is given whereby digitally-controlled resistance(s) in the amplifier and/or attenuator can be configured to reduce noise, with said digitally-controlled resistances being used to alter the overall gain and/or attenuation value(s). Unless otherwise stated, all references to "noise" are defined as uncorrelated noise, measured unweighted (i.e., no in-band weighting filters) with an audio-bandwidth of 20 kHz, and given in "dBu" in which 0 dBu is equivalent to 0.7746 Vrms.

A Three-Path Embodiment with Controlled High Path Amplifier

Figure 11A:
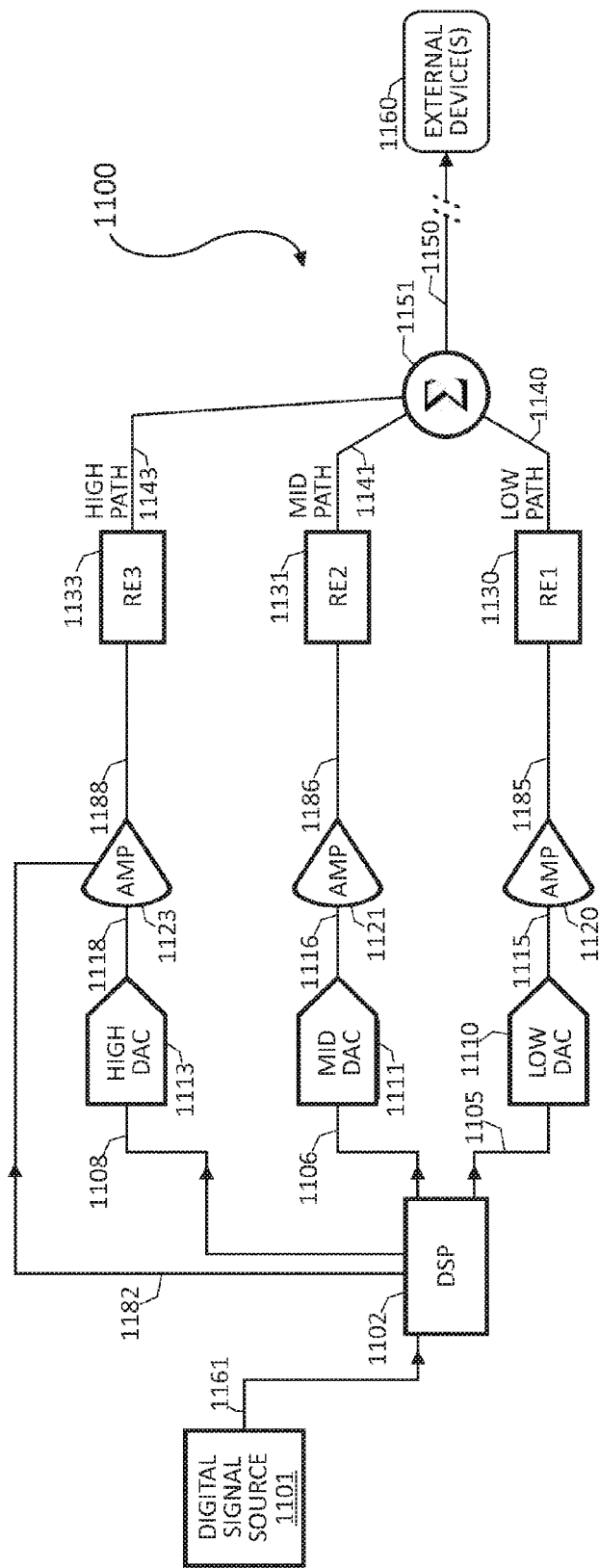
FIG. 11A shows a three-path digital-to-analog conversion circuit according to an alternate embodiment of the present invention

FIG. 11A provides a schematic of a first preferred alternative three-path circuit (1100) for a 32-bit input signal according to a preferred embodiment of the present invention which provides improved dynamic range by providing increased output level and decreased baseline (i.e., no input signal) self-noise. As shown in the signal levels chart of FIG. 11B, the circuit (1100) of FIG. 11A divides a 32-bit input signal (1161) (corresponding to a signal range of 192 dB, which for the audio circuitry according to the preferred alternative embodiment will be assigned the range of −160 dBu to +32 dBu) into three smaller words or bit groups or packets, a low-path packet (1105), and a mid-path packet (1106) and a high-path packet (1108).

The input to the circuit (1100) of FIG. 11A may be a single digital signal source (1101) or multiple digital signal sources, as described earlier and shown in FIG. 6A. The digital signal source shown on FIG. 11A (1101), or "preadapted" sources shown on FIG. 6A (690), (691), . . . (699), are fed to a digital signal processor (DSP) (1102) which divides the input signal into a high-path output (1108), a mid-path output (1106) and a low-path output (1105), and directs them (1108), (1106) and (1105) to a high-path DAC (1113), a mid-path DAC (1111), and a low-path DAC (1110), respectively. The analog output (1118), (1116), and (1115) of each DAC (1113), (1111) and (1110), respectively, is sent to an active analog amplifier (1123), (1121) and (1120), respectively. The amplifiers (1123), (1121) and (1120) can provide a number of critical functions, including but not limited to current-to-voltage conversion (IV conversion), high and/or low frequency filtering, DC offset servo, current buffering/current sourcing, voltage gain and impedance buffering. A suitably designed DAC device may include some or all of these said critical functions, in which case the functionalities presented herein will apply to the DAC device itself. In the present invention, critical requirements of these amplifiers (1123), (1121) and (1120) include sufficiently low noise, sufficiently low output impedance, sufficiently high output current, and sufficiently high output voltage to properly interface with a passive analog summing node (1151) which combines the low-path (1140), mid-path (1141) and high-path (1143) signals into a single analog signal (1150) capable of driving typical external devices (1160) to a sufficiently high level and wide bandwidth, while maintaining sufficiently low noise and distortion. Such sufficient audio specifications will be generally understood by those skilled in the art of professional audio circuit design.

Figure 11B:
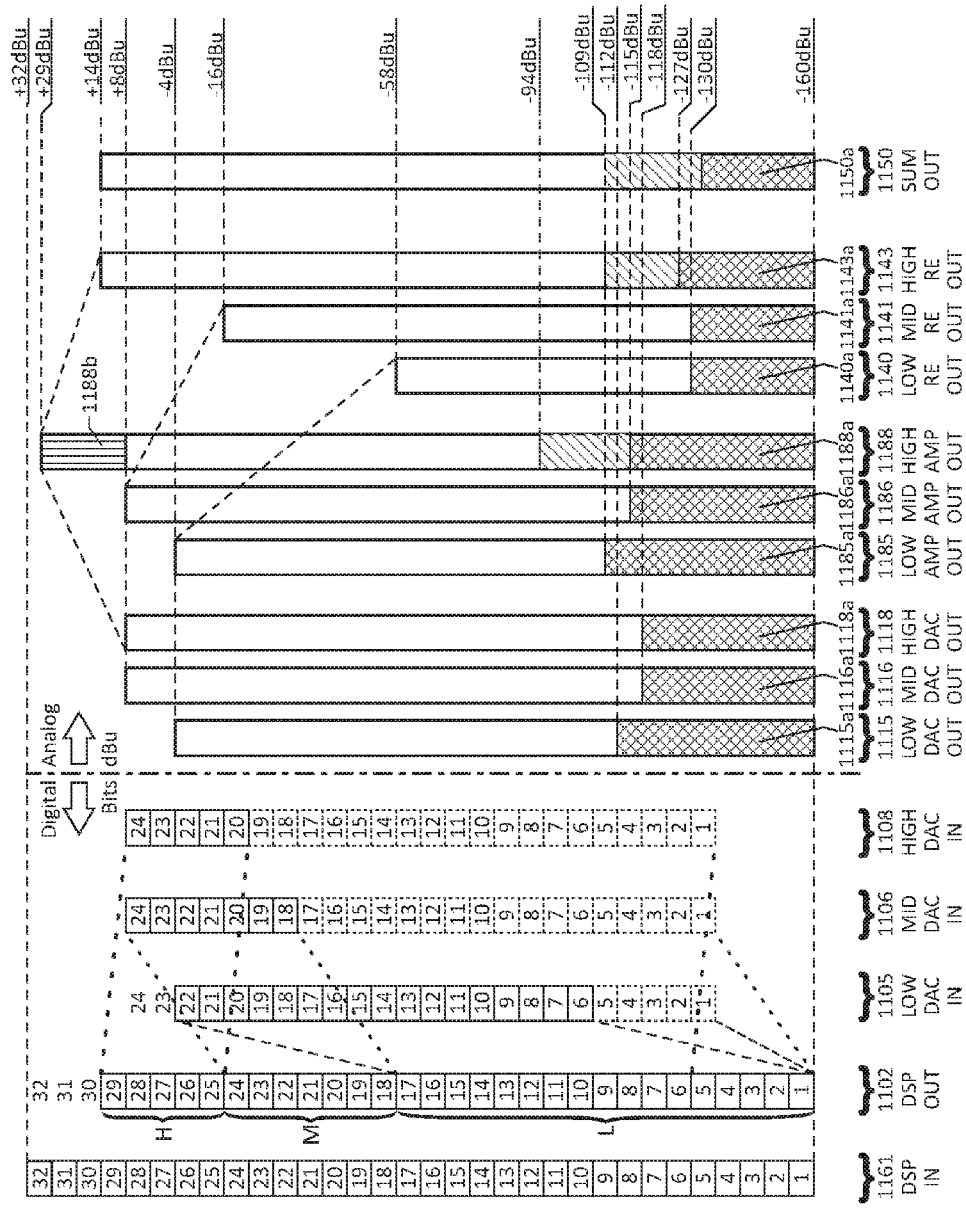
FIG. 11B shows signal and noise levels at various points in the circuit of FIG. 11A.

Although the present invention can be applied to circuitry and components having a wide variety of operational parameters and values, described herein for the purposes of example as a first preferred alternative three-path embodiment is the circuit (1100) of FIG. 11A which has three DACs (1110), (1111) and (1113) which, as shown in the signal levels chart of FIG. 11B, can each accept a 24-bit input (1105), (1106) and (1108), and can each produce a maximum analog level of +8 dBu with a full-scale 24-bit input. Low-path DAC (1110) exhibits a noise floor of −112 dBu, as indicated by the cross-hatched rectangle section (1115a) in FIG. 11B. Mid-path and high-path DACs (1111) and (1113), respectively, exhibit a noise floor of −118 dBu, as indicated by the cross-hatched rectangle sections (1116a) and (1118a) in FIG. 11B. Therefore, any low-path digital input level (1105) below −112 dBu cannot be effectively resolved at DAC output (1115), and any digital input level (1106) or (1108) below −118 dBu cannot be effectively resolved at DAC output (1116) or (1118), because such levels are below the DAC's (1110), (1111) and (1113) residual broadband noise floor (1115a), (1116a) and (1118a), respectively. However, it should be understood that although sometimes audio program signals below a noise threshold can be psychoacoustically perceived or electrically processed, for purposes of example in the present specification it is assumed that the measured broadband, unweighted noise floor will be the lowest usable signal level.

All amplifiers (1120), (1121) and (1123) provide an analog output level (1185), (1186) and (1188), the maximum of which is +32 dBu. Low-path amplifier (1120) exhibits a residual unity-gain self-noise floor of −112 dBu. When the −112 dBu self-noise (1115a) of the low-path DAC (1110) is summed with the −112 dBu self-noise (not shown) of the low-path amplifier (1120), the combined or vector-summed noise (1185a) is −109 dBu. Mid-path and high-path amplifiers (1121) and (1123), respectively, both exhibit a residual unity-gain self-noise floor of −118 dBu. When the −118 dBu self-noise (1116a) of the mid-path DAC (1111) is summed with the −118 dBu self-noise (not shown) of the mid-path amplifier (1121), the combined noise (1186a) is −115 dBu. High path amplifier (1123) has DSP-controlled (1182) adjustable gain ranging from unity (0 dB) to +21 dB and exhibits a self-noise of −118 dBu at unity gain. When combined with the output noise (1118a) of the high-path DAC (1113), the high-path amplifier (1123) output (1188) exhibits a residual noise (1188a) of −115 dBu at unity-gain and a residual self-noise of roughly −94 dBu at +21 dB gain. Any analog level (1115) below −109 dBu cannot be effectively resolved by low-path amplifier device (1120); any analog level (1116) below roughly −115 dBu cannot be effectively resolved by mid-path amplifier device (1121); and any analog level (1118) below roughly −94 dBu cannot be effectively resolved by high-path amplifier device (1123) when high-path amplifier device (1123) is configured for +21 dB of gain, because such threshold signal levels are below the amplifiers' (1120), (1121) and (1123) respective output noise levels.

As shown in FIG. 11A and FIG. 11B, the DSP (1102) divides a 32-bit PCM input (1161) into a low-path DAC input signal (1105), a mid-path DAC input signal (1106) and a high-path DAC input signal (1108). Source (1101) input bits (1161) 1 through 17 are mapped (i.e., multiplied or otherwise shifted) by the DSP (1102) to input bits 6 through 22 of the input (1105) to the low-path DAC (1110) (and subsidiary bits 1 through 5 of the input (1105) to the low-path DAC (1110) are provided as null bits); source (1101) input bits (1161) 18 through 24 are mapped by the DSP (1102) to input bits 18 through 24 of the input (1106) to the mid-path DAC (1111) (and source (1101) bits 1 through 17 are provided to input bits 1 through 17 of the input (1106) to the mid-path DAC (1111) as subsidiary bits); while source (1101) input bits (1161) 25 through 29 are mapped to input bits 20 through 24 of the input (1108) to the high-path DAC (1113) (and source (1101) bits 6 through 24 are provided to input bits 1 through 19 of the input (1106) to the high-path DAC (1113) as subsidiary bits). Source (1101) bits 30-32 are not mapped, meaning that, in the present embodiment, source input levels (1161) between +14 dBu and +32 dBu will not be used.

The mapping process requires that the DSP (1102) provides separate bit-groupings for each path, i.e., a separate bit-group for the high-path signal (1108), the mid-path signal (1106) and the low-path signal (1105). In the present preferred alternative three-path embodiment according to the present invention, the bit-grouped input (1105) to the low-path DAC (1110) is digitally level shifted by 9 bits (i.e., +54 dB) by the DSP (1102), such that the minimum input level (1161) of −160 dBu is mapped to an analog output level (1115) of −106 dBu at the low-path DAC digital input (1105), i.e., the lowest active or ultimately desired lowest bit of the input (1161) is mapped (1105) by DSP (1102) at or above the noise floors (1115a), (1185a) and (1140a) of the DAC (1110), amplifier (1120) and resistive element (1130) after attenuation, respectively. Similarly, the bit-grouped input (1106) to the mid-path DAC (1111) is digitally level shifted or mapped by 4 bits (i.e., +24 dB) by the DSP (1102) so that, for instance, a representative input level (1161) to the DSP (1102) of −16 dBu is mapped to an analog DAC output signal level (1116) of +8 dBu at the digital input (1106) to the mid-path DAC (1111). Similarly, the bit-grouped input (1108) to the high-path DAC (1113) can be understood as level shifted or mapped by −6 dB so that a representative input level (1161) to the DSP (1102) of +14 dBu is mapped to a DAC signal output level (1118) of +8 dBu at the digital input (1108) to the high-path DAC (1113). The low-path DAC (1110) receives a 17-bit signal range (1105) (along with the less-significant null bits, as discussed above) representing signal levels at the digital input (1161) to the DSP (1102) from −160 dBu to −58 dBu, i.e., a signal (1105) having 102 dB of dynamic range. The 7-bit primary-bit group (along with any lower significant subsidiary bits, as discussed above) comprising the digital input (1106) to the mid-path DAC (1111) represents a signal level range at the input (1161) to the DSP (1102) from −58 dBu to −16 dBu, i.e., 42 dB of dynamic range. The 5-bit primary-bit group (along with any lower significant subsidiary bits) comprising the digital input (1108) to the high-path DAC (1113) represents signal levels at the input (1161) to the DSP (1102) from −16 dBu to +14 dBu, i.e., 30 dB of dynamic range. (In all embodiments of the present invention, bit groupings can also include transitional or overlap bits, such as shown in FIG. 2B where the 11$^{th}$ and 12$^{th}$ bits of the input signal (210) are allocated to both the low-range packet (203) and the mid-range packet (204).)

As shown in FIG. 11B, input bit 22 (including all subsidiary bits) of low-path DAC (1110) provides an output level (1115) of −4 dBu, while the low-path DAC (1110) has a noise floor (1115a) of −112 dBu. As also shown in FIG. 11B, input bit 24 (including all subsidiary bits, equivalent to full-scale DAC input) of mid-path DAC (1111) has an output level (1116) of +8 dBu while the mid-path DAC (1111) has a noise floor (1116a) of −118 dBu. As also shown in FIG. 11B, input bit 24 (including all subsidiary bits, equivalent to full-scale DAC input) of the high-path DAC (1113) has an output level (1118) of +8 dBu while the high-path DAC (1113) has a noise floor (1118a) of −118 dBu.

As shown in FIG. 11B by the horizontal dashed line spanning from the top of the bar representing low-path DAC output signal (1115) to the top of the bar representing low-path amplifier output signal (1185), low-path amplifier (1120) is configured to provide unity gain and therefore produces an output signal (1185) having a maximum level (shown in dBu) equal to that of the input (1115). As shown in FIG. 11B by the horizontal dashed line spanning from the top of the bar representing mid-path DAC output signal (1116) to the top of the bar representing mid-path amplifier output signal (1186), mid-path amplifier output (1186) is configured to provide unity gain and therefore produces an output signal (1186) having a maximum level (shown in dBu) equal to that of the input (1116). As shown in FIG. 11B by the dashed line spanning from the top of the bar representing high-path DAC output signal (1118) to the top of the bar representing high-path amplifier output signal (1188), high-path amplifier (1123) has a DSP-controlled (1182) gain range of unity-gain (0 dB) to +21 dB and therefore produces an output signal (1188) having an amplitude range between the actual input level (1118) and a level that is +21 dB higher than the input level (1118), an amplitude range indicated in FIG. 11B by the rectangular area filled with vertical lines (1188b). The high-path amplifier (1123), when operating at a gain of +21 dB, exhibits a broadband self-noise of −94 dBu. Therefore, as shown in FIG. 11B, the high-path amplifier (1123) can amplify an input signal (1118) between a range of unity gain and +21 dB gain. When amplifier (1123) is DSP-controlled (1182) to exhibit unity gain, the sum of DAC noise (−118 dBu) and amplifier noise (−118 dBu) is −115 dBu (1186a) as measured at the high-path amplifier output (1188). When amplifier (1123) is DSP-controlled (1182) to exhibit +21 dB of gain, a noise level of roughly −94 dBu is measured at the high-path amplifier output (1188). When amplifier (1123) is DSP-controlled (1182) to exhibit +21 dB of gain, and an input signal of +8 dBu (1118) is present, amplifier (1123) produces an output level (1188) of +29 dBu.

The output (1188) of the high-path amplifier (1123) is fed to resistive element RF3 (1133). According to this embodiment, RE3 (1133) is a fixed attenuator with −15 dB of attenuation and 200 ohms series resistance. When amplifier (1123) is DSP-controlled (1182) to provide unity gain, the total noise present at (1188) is −115 dBu (1188a). This −115 dBu of noise (1188a) is then fed (1188) to RE3 (1133) and attenuated by −15 dB so that the quiescent noise level at the output of RF3 (1143) becomes roughly −127 dBu, which is the vector sum of the noise of RF3 200 ohm series resistance (roughly −130 dBu) and the attenuated input noise (roughly −130 dBu).

As shown in FIG. 11A, according to the current embodiment, the high-path resistive element RE3 (1133) provides −15 dB of attenuation and a 200 ohm total series resistance which presents a self-noise of about −130 dBu. This −15 dB attenuation is represented on FIG. 11B as a dashed downward sloping diagonal line beginning at the top of the bar of the high-path amplifier output (1188) and ending at the top of the bar representing the high-path resistive element RF3 output (1143). The mid-path resistive element RE2 (1131) provides 200 ohms total series resistance and −24 dB of attenuation. This −24 dB attenuation is represented on FIG.

11B as a dashed downward sloping diagonal line beginning at the top of the bar of the mid-path amplifier output (1186) and ending at the top of the bar of the mid-path resistive element RE2 output (1141). The low-path resistive element RE1 (1130) provides 200 ohms total series resistance and −54 dB of attenuation. This −54 dB attenuation is represented on FIG. 11B as a dashed downward sloping diagonal line beginning at the top of the bar of the low-path amplifier output (1185) and ending at the top of the bar of the low-path resistive element RE1 output (1140). Hence, from our earlier analyses of uncorrelated noise, and as can be seen from FIG. 11A and FIG. 11B, the total (summed) low-path quiescent noise level (1140a) at the output (1140) of the low-path resistive element (1130), when the output (1140) is not connected to summing node (1151), is roughly −130 dBu; the total (summed) mid-path quiescent noise level (1141a) at the output (1141) of the mid-path resistive element (1131), when the output (1141) is not connected to summing node (1151), is roughly −130 dBu; and the total (summed) high-path quiescent noise level (1143a) at the output (1143) of high-path resistive element (1133), when the output (1143) is not connected to summing node (1151) and the high-path amplifier (1123) is configured at unity gain, is roughly −127 dBu. When all output paths (1140), (1141), and (1143) are connected to summing node (1151), the total paralleled source resistance of RE1 (1130), RE2 (1131), and RE3 (1133), as seen at summing node (1151), is given by the formula for multiple resistances in parallel, namely:

$$\frac{1}{1/R1 + 1/R2 + 1/R3}, \quad (2.1)$$

to provide a total source resistance (ignoring the source resistance of prior circuit elements, since it is low) of roughly 66.7 ohms.

Figure 11C:
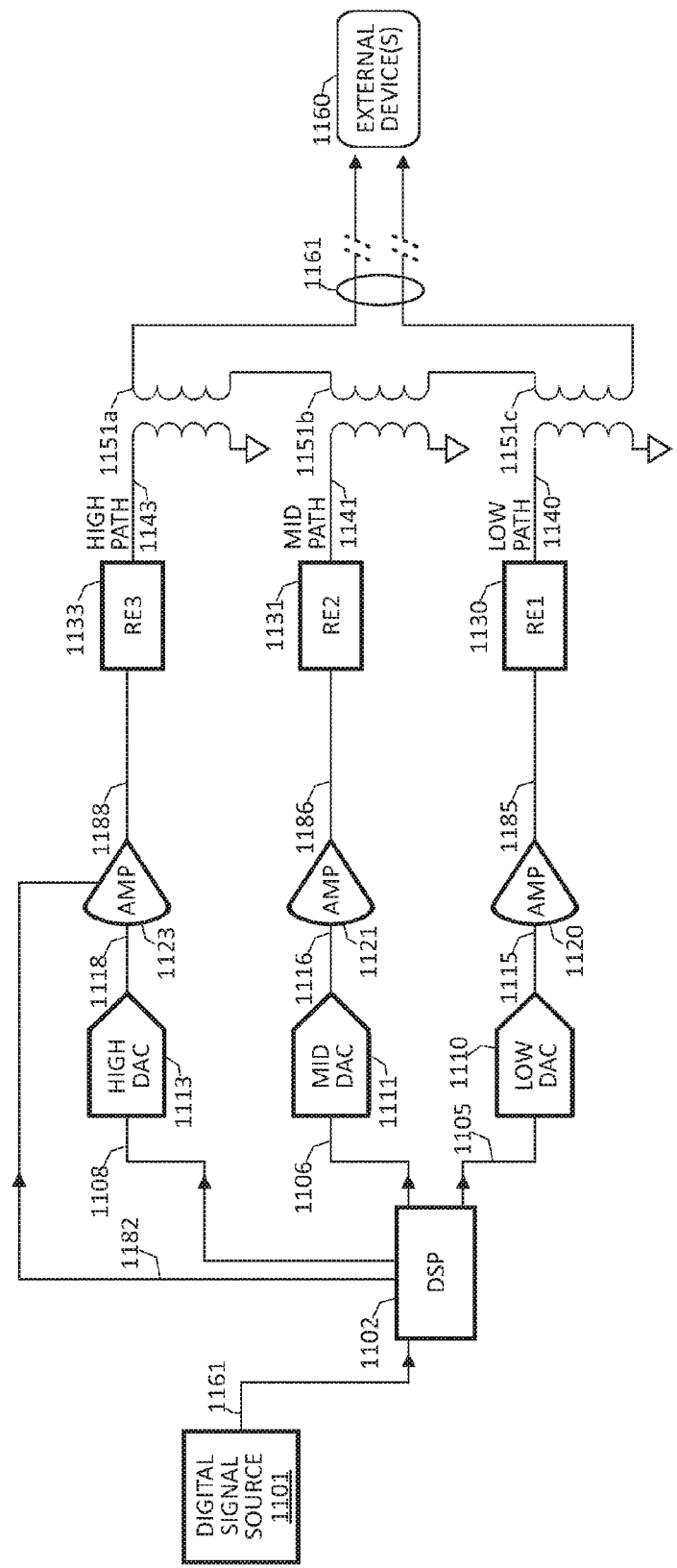
FIG. 11C shows a three-path digital-to-analog conversion circuit with transformer output summing.

The summation node (1151) of FIG. 11A is a passively-combining electrical connection of the outputs (1140), (1141) and (1143) from the resistive elements RE1 (1130), RE2 (1131) and RE3 (1133), respectively. An alternative summing configuration is given in FIG. 11C whereby the summing node (1151) is replaced by passive transformers (1151a), (1151b) and (1151c) arrayed in a conventional transformer summing configuration with a differential summed output (1161). The differential-secondary summing shown in FIG. 11C is just one example of using passive transformers for the summing of multiple signals. Other configuration examples and transformer types could be used, as would be well known to those skilled in the art.

According to the present invention, when the digital input signal level (1161) is significantly below 24 bits, or significantly below −16 dBu input, the digital-gain-controlled (1182) high-path amplifier (1123) is set by DSP (1102) to unity gain, so that total noise level at the amplifier (1123) output (1188) is roughly −115 dBu. When high-path amplifier (1123) is set to unity gain, the total systemic noise which is input to the summing node (1151) is comprised of the parallel-summed thermal noise at RE1 (1130), RE2 (1131), and RE3 (1133) and the post-resistive-element noise generated by all prior circuit elements, such as the low-path DAC (1110), low-path amplifier (1120), mid-path DAC (1111), mid-path amplifier (1121), high-path DAC (1113), and high-path amplifier (1123). The summed noise (1185a) generated by the combination of low-path DAC (1110) and amplifier (1120) is roughly −109 dBu at the low-path amplifier output (1185), and the attenuation created by low-path resistive element RE1 (1130) is −54 dB, hence the summed noise from the low-path DAC (1110) and amplifier (1120) is attenuated by RE1 (1130) down to roughly −163 dBu which is negligible relative to the resistive element's thermal self-noise (1140a) of −130 dBu at the resistive element's output (1140). The summed noise (1186a) generated by the combination of the mid-path DAC (1111) and mid-path amplifier (1121) is roughly −115 dBu at the mid-path amplifier output (1186), and the attenuation created by mid-path resistive element RE2 (1131) is −24 dB, hence the sum of all broadband noise (1141a) from the mid-path DAC (1111), mid-path amplifier (1121), and mid-path resistive element RE2 (1131) is roughly −130 dBu at the output of the mid-path resistive element (1141). The summed broadband noise (1188a) generated by the combination of the high-path DAC (1113) and unity-gain high-path amplifier (1123) is roughly −115 dBu at the output of the high-path amplifier (1188), and the attenuation created by high-path resistive element RE3 (1133) is −15 dB, hence the sum of all broadband noise (1143a) from the high-path DAC (1113), unity-gain high-path amplifier (1123), and high-path resistive element RE3 (1133) is roughly −127 dBu at the output of the high-path resistive element (1143). When the low-path output (1140), mid-path output (1141), and unity-gain high-path output (1143) are combined at the summing node (1151), the 200 ohms series resistance of each resistive element RE1 (1130), RE2 (1131), and RE3 (1133) combines in parallel (ignoring amplifier source resistance because it is low), creating a total source resistance of roughly 67 ohms, which can further reduce the total output noise, as generalized in FIG. 11B as a cross-hatched rectangle (1150a).

As stated above, the high-path amplifier (1123) has a digitally-controlled (1182) variable gain between unity (0 dB) and +21 dB. When the input signal level (1161) is below a certain threshold level, the DSP (1102) adjusts the high-path amplifier (1123) to unity gain (0 dB gain), thus creating a lowest noise state as measured at the resistive element RF3 (1133) output (1143) and the summing node (1151) and summed output (1150). As input signal (1161) rises in level, such that output signal (1141) rises and approaches a certain threshold level, which according to the current embodiment is −16 dBu, the DSP (1102) sends a control signal (1182) which causes the high-path amplifier (1123) to change its gain-state from 0 dB to +21 dBu. According to this embodiment, the increase in amplifier (1123) gain from 0 dB to +21 dB occurs immediately before the DSP (1102) begins to send high-path-program signal (1108) to high-path DAC (1113). With no signal (1108) feeding the high-path DAC (1113) and high-path amplifier (1123) digitally configured (1182) to unity gain, the total broadband noise (1188a) at the output (1188) of the high-path amplifier (1123) is −115 dBu. With the high-path amplifier (1123) digitally configured (1182) at +21 dB gain, the total broadband noise at the output (1188) of the high-path amplifier (1123) is roughly −94 dBu.

Because the high-path amplifier (1123) output signal (1188) is increased in gain by +21 dB when a rising mid-path output program level (1141) at summing node (1151) is at or near −16 dBu, there exists a roughly 90 dB level difference between mid-path program level (1141) and high-path output noise level when high-path amplifier (1123) is configured with +21 dB of gain. The roughly 90 dB signal-to-noise difference (the difference between the mid-path program signal level (1141) near −16 dBu and the attenuated high-path noise of −109 dBu) provides a very high degree of psychoacoustic masking to the −109 dBu high-path noise level, making the total noise at the output (1151) of the summing node (1150) generally psychoacoustically undetectable.

Figure 11D:
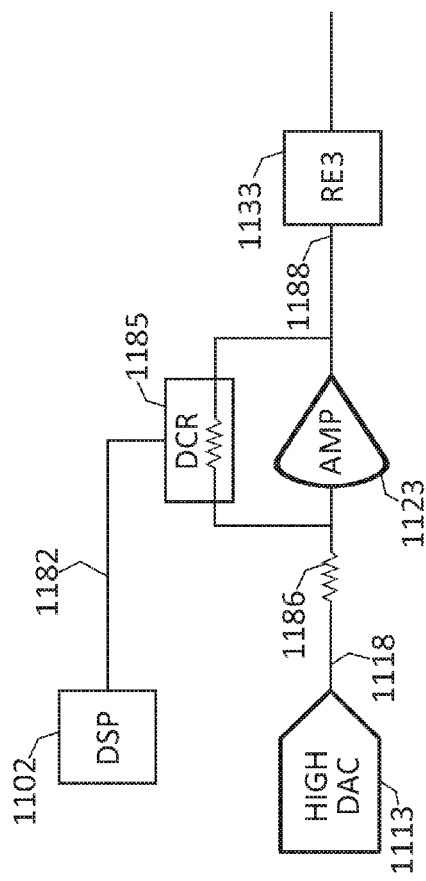
FIG. 11D shows a digitally-controlled gain configuration for the circuit of FIG. 11F.

Any method for digital gain control (1182) of amplifier (1123) can be used, assuming that the method chosen does not prohibit the functionalities described herein. For example, in FIG. 11D, DSP (1102) gain control (1182) is achieved using a digitally-controlled resistor ("DCR") (1185) of sufficiently low self-noise and sufficiently high dynamic level performance. In an alternative embodiment, resistive values (1185) could be selected with digitally-controlled (1182) switches or relays. In FIG. 11D, a simplified (i.e., single-line) operational amplifier configuration is shown with an input resistance (1186) and a DSP (1102) controlled (1182) feedback resistance (1185). When the high-path is in its lowest-noise state, the amplifier (1123) is set to unity gain. For example, if input resistor (1186) is 2 k ohms, then digitally-controlled (1182) feedback resistance (1185) may also be set by DSP (1102) to 2 k ohms (a 1:1 resistance ratio) to achieve unity gain of the amplifier (1123). If the high-path requires, for example, a +24 dB gain state, the DSP (1102) sends a control signal (1182) to the digitally-controlled feedback resistance (1185) to select a resistance of roughly 32 k to achieve an amplifier gain of roughly +24 dB (i.e., an amplifier gain ratio of 16:1).

Figure 11E:
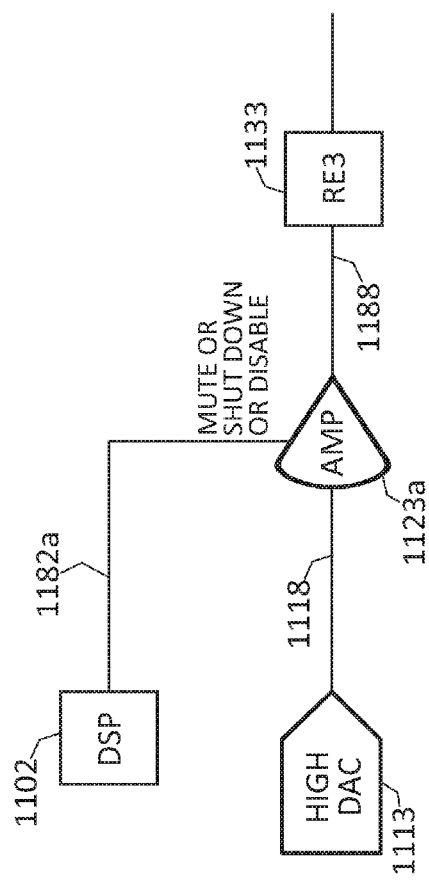
FIG. 11E shows a digitally-controlled enabling-disabling function for an amplifier.

As an alternative embodiment, the amplifier itself may have provision for selective muting or selective enable/disable or other manner of selective output state control. FIG. 11E shows a DSP (1102) controlling (1182*a*) a path amplifier (1123*a*) to achieve any manner of selective noise-reducing behavior available at the amplifier output. In the example of FIG. 11E, the control signal (1182*a*) can cause the amplifier (1123*a*) to enter an off or mute or disabled state (hereinafter referred to as an "off" state) in which audio program output is off or muted, and the amplifier's (1123*a*) quiescent output self-noise (1188) can be minimized. The example of FIG. 11E also provides for the complete digitally-controlled power shut-down of the amplifier in which the amplifier (1123*a*) is turned off and the amplifier's quiescent output self-noise (1188) is minimized. It should be noted that the circuitry shown in FIG. 11E can also be combined with the circuitry shown in FIG. 11D by incorporating a digitally-controlled (1182*a*) power shut down of the amplifier (1123*a*) with a reduction of feedback resistance (1185) so that both series resistance thermal noise and amplifier self-noise are minimized at (1188). The present invention does not limit the manner in which a path amplifier is set to an "off" (i.e. reduced noise) state, but allows any form of disabling/enabling, muting/unmuting, or controlling power on/off by using such provisions within the amplifier, or by using methods to achieve said off-state that are external to the amplifier such as a digitally-controlled power supply shut down. In the circuitry of FIG. 11E, the amplifier (1123*a*) can be pre-configured for gain (e.g., +24 dB), so that when the DSP (1102) sends a command (1182*a*) to return the off-state amplifier (1123*a*) to full operational service, the amplifier begins performing in a non-muted, fully gain-enabled state (hereinafter referred to as amplifier "on" state) in which the amplifier is properly receiving analog input signal (1118) from DAC (1113) and properly buffering and/or amplifying said analog signal.

A Three-Path Embodiment with Controllable High-Path Resistive Elements

Figure 11F:
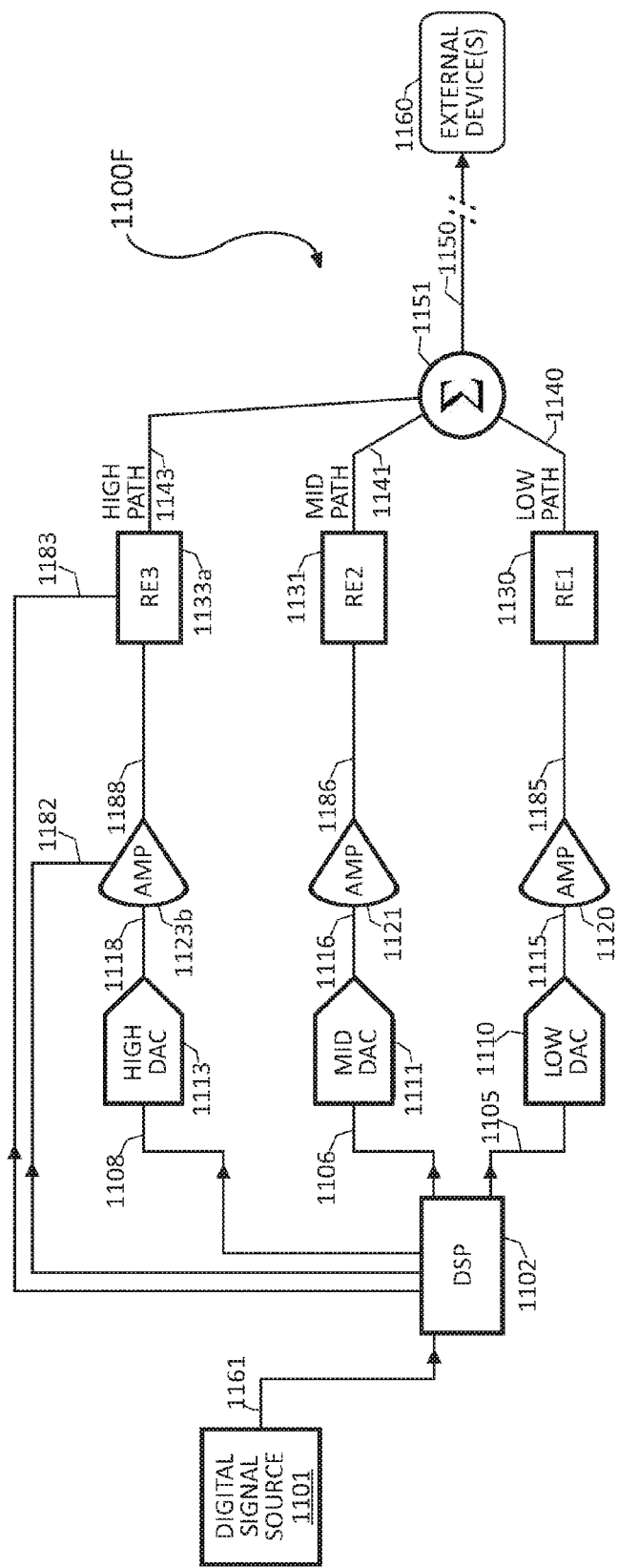
FIG. 11F shows a three-path digital-to-analog conversion circuit with digitally-adjustable amplifier and resistive element.

FIG. 11F shows a second preferred three-path embodiment according to the present invention. In the embodiment shown in FIG. 11F, the DSP (1102) controls a controllable high-path resistive element RF3 (1133*a*) via control line (1183). The controllable high-path resistive element (1133*a*) will be configured with one or more digitally-controlled resistors, so that the DSP (1102) can change, via control line (1183), resistances within the resistive element (1133*a*), hence changing the attenuation value of said resistive element (1133*a*). Moreover, the controllable resistive element (1133*a*) can be configured with a digitally-controlled (1183) switch, relay, or other means to remove or reduce the electrical impact of noise of a series and/or shunt element, or multiple switches removing, or significantly reducing the electrical and/or noise impact of, multiple series and/or shunt elements.

Figure 11G:
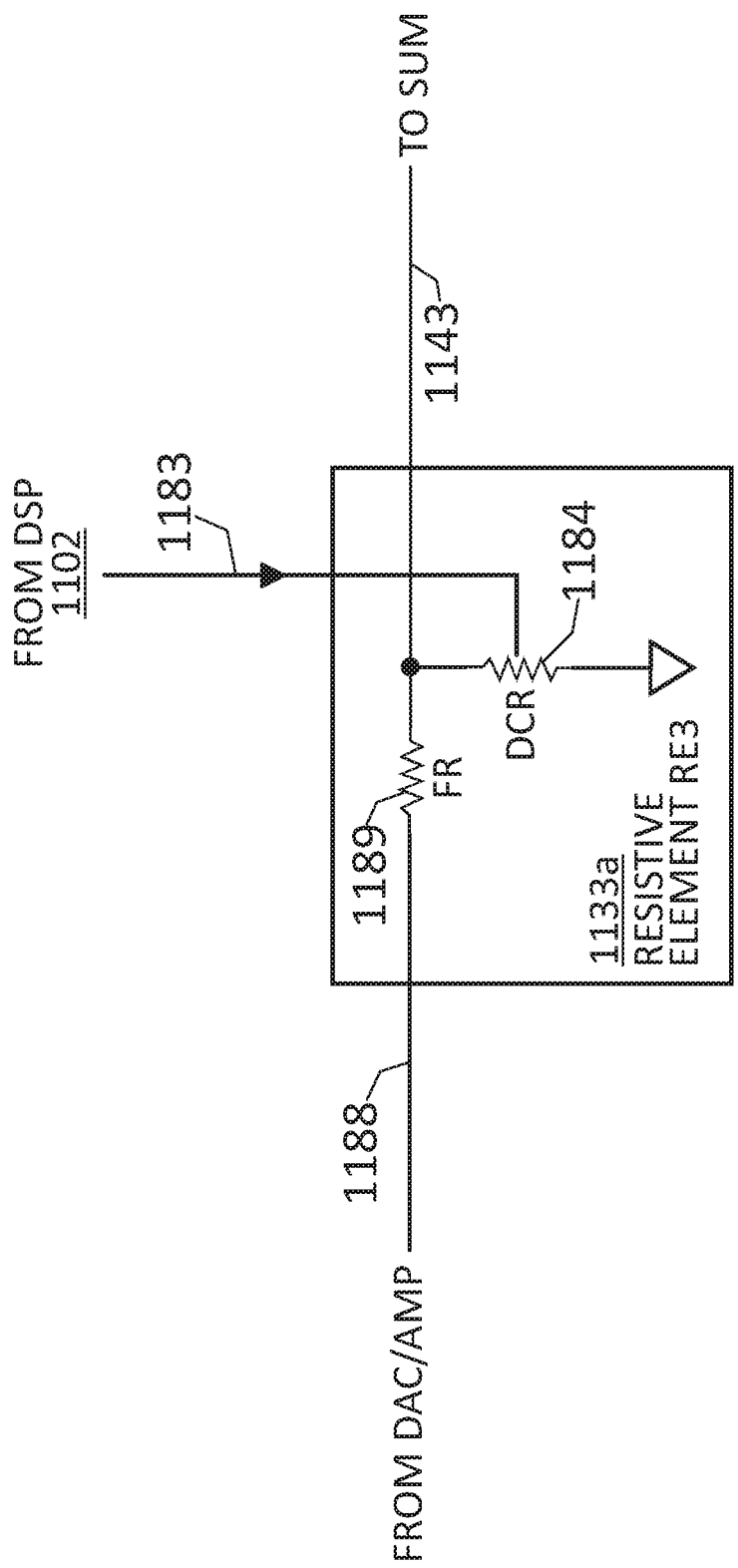
FIG. 11G shows a digitally-controllable resistive element.

FIG. 11G shows one example of a digitally controllable (1183) resistive element RF3 (1133*a*) that consists of a passive voltage divider (attenuator) with a digitally-controlled resistive ("DCR") element (1184) and a fixed resistive ("FR") element (1189). The example of FIG. 11G is just one of myriad controllable resistive-attenuator configurations possible. For instance, the resistive element (1133*a*) could be differential with differential digitally-controlled resistive elements, or the resistive element could be a "T" attenuator with fixed resistances on each side of a digitally-controlled shunt resistance, or the series resistance could be digitally-controlled with a switch-removable fixed resistance to ground, or both resistance elements in a single-ended configuration could be digitally-controllable, or filter elements (e.g., capacitors and inductors) could be added to the resistive network, and so forth. The circuit of FIG. 11G is given as one example (among myriad possible examples) to show the functionality of an adjustable high path(s) resistive element (1133*a*) in context of the present invention.

Figure 11H:
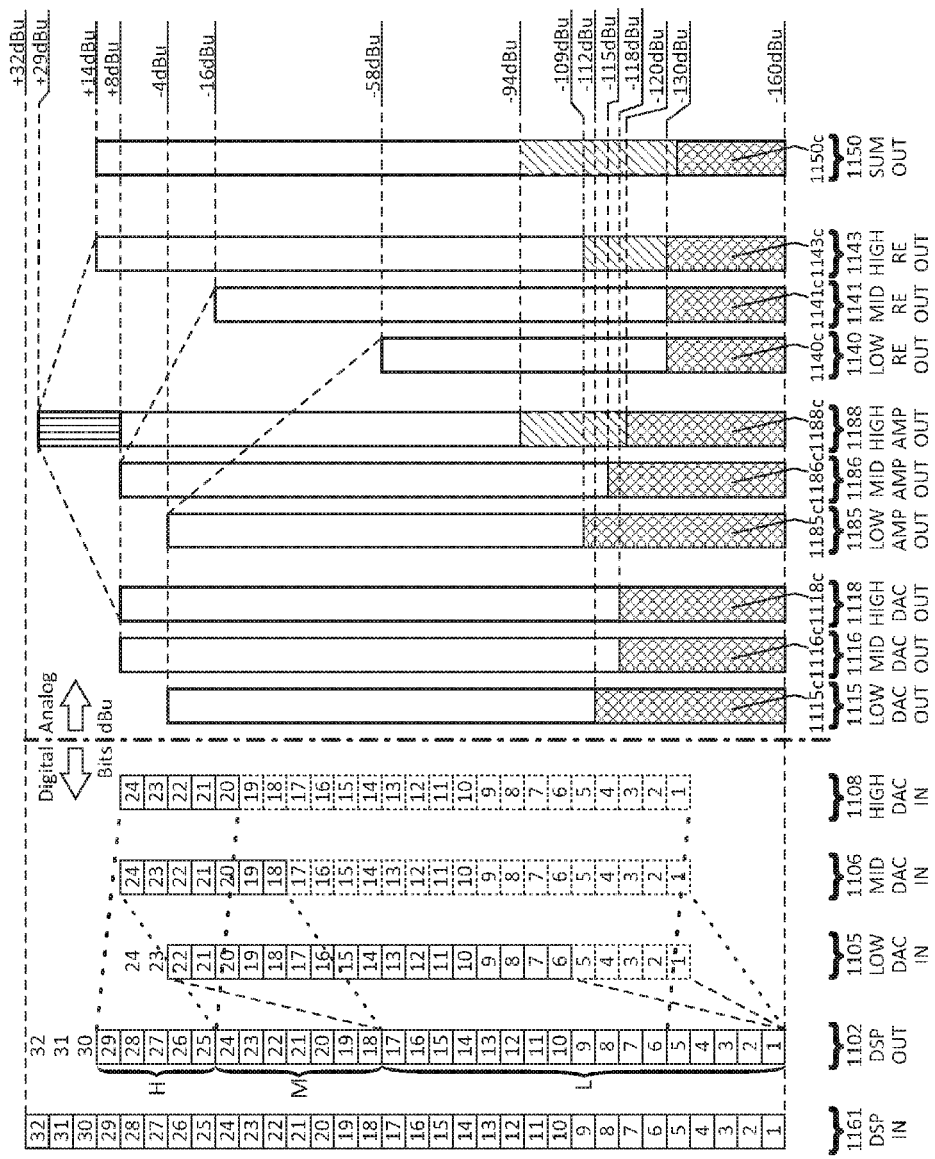
FIG. 11H shows signal and noise levels at various points in the circuit of FIG. 11F

FIG. 11F shows how the combination of a digitally-controlled amplifier and digitally-controlled resistive element can combine to reduce noise and increase dynamic range within the context of the present invention. When the digital input signal level (1161) is lower than 24 bits (i.e., the signal remains active in the low-path output (1140) and/or mid-path output (1141), but is not active in the high path output (1143)), the digitally-controlled (1182) high-path amplifier (1123*b*) is set by DSP (1102) to an "off" state (as previously described) such that the noise level at amplifier (1123*b*) output (1188) is −120 dBu. Likewise, when the digital input signal level (1161) is lower than 24 bits (as previously described), the digitally-controlled (1183) high-path controllable resistive element RF3 (1133*a*) is set by DSP (1102) to exhibit 200 ohms total series resistance and −15 dB of attenuation, causing the output (1143) of the resistive element (1133*a*) to exhibit a broadband unweighted noise of roughly −130 dBu (i.e., the thermal noise of 200 ohms resistance plus the −15 dB attenuated noise of (1188) which, more precisely, has a value of −128.57 dBu but is rounded for purposes of simplicity of exposition in the present specification). As shown in FIG. 11H which shows the signal and noise levels of the circuit 1100F of FIG. 11F, the summed noise (1185*c*) generated by the combination of the noise (1115*c*) of the low-path DAC (1110) and the noise (not shown separately) of the low-path amplifier (1120) of FIG. 11F is roughly −109 dBu. Given that the attenuation created by low-path resistive element RE1 (1130) is −54 dB, the combined noise (1185*c*) from the low-path DAC (1110) and low-path amplifier (1120) is attenuated by RE1 (1130) down to −163 dBu and can be neglected relative to the thermal noise of −130 dBu (1140*c*) generated from the low-path resistive element RE1 (1130). As also shown in FIG. 11F and FIG. 11H, given that the summed noise (1186*c*) generated by the combination of the noise (1116*c*) of the mid-path DAC (1111) and the noise (not shown separately) of the mid-path amplifier (1121) is roughly −115 dBu (1186c), and given that the fixed attenuation created by mid-path resistive element RE2 (1131) is −24 dB, the sum of all noise (1141c) from the mid-level DAC (1111), mid-level amplifier (1121), and mid-path resistive element RE2 (1131) is roughly −130 dBu (i.e., the thermal noise of 200 ohms resistance plus the −24 dB attenuated noise of (1186) which, more precisely, has a value of −129.14 dBu, but is rounded for purposes of simplicity of exposition in the present specification). As also shown in FIG. 11F and FIG. 11H, given that the summed broadband noise (1188c) at the output (1188) of off-state amplifier (1123b) is roughly −120 dBu, and given that the attenuation created by high-path resistive element RF3 (1133a) is −15 dB, the sum of all broadband noise (1143c) from high path DAC (1113), off-state high-path amplifier (1123b), and high-path −15 dB resistive element RE3 (1133a), is roughly −130 dBu. When the low-path output (1140), mid-path output (1141), and off-state high-path output (1143) are combined at the summing node (1151), the 200 ohms series resistance of each resistive element path combines in parallel (ignoring amplifier source resistance because it is low), creating a total source resistance of roughly 67 ohms, which can further reduce the total (parallel summed) noise, as generalized in FIG. 11H as a cross-hatched rectangle (1150c).

With reference to FIG. 11F and FIG. 11H, high-path amplifier (1123b), when in its "on" state, exhibits a fixed gain of +21 dB and the total broadband noise at the output (1188) of the on-state high-path amplifier (1123b) is −94 dBu, as is depicted by the rectangle (1188) filled with non-crossed diagonal lines in FIG. 11H. With amplifier (1123b) in its "off" state, the total noise (1188c) at the output (1188) of the high-path amplifier (1123b) is −120 dBu. Whether RE3 (1133a) is digitally configured (1183) as a −15 dB attenuator, or digitally configured with zero attenuation, RE3 (1133a) provides 200 ohms total series resistance in both cases, thereby always exhibiting −130 dBu broadband thermal self-noise. As depicted in FIG. 11G, one method to achieve digital selection (1183) of −15 dB attenuation and zero attenuation is by using a digitally-controlled resistor "DCR" (1184) which provides low noise and a high operating level range. The digitally-controlled resistor (1184) is placed in the resistive element (1133a) as a shunt path to ground, while a fixed resistor "FR" (1189) is placed in the resistive element (1133a) as a series path from input to output. When attenuation is required, the DSP (1102) sets (1183) the digitally-controlled resistor (1184) to a desired value. For example, if fixed series resistance (1189) is 200 ohms and DSP (1102) sets (1183) RE3 (1133b) shunt resistor (1184) to a value of 200 ohms, the total attenuation at (1143) with respect to (1188) will be −6 dB. For an attenuation value of −15 dB, the DSP (1102) would set (1183) RE3 (1133) shunt resistor (1184) to a lower value so as to provide −15 dB series attenuation. To maintain a constant total series resistance of RE3 (1133a), FR (1189) could also be configured as a digitally-controlled resistance (not shown) with both resistors (1189) and (1184) simultaneously adjusted by DSP (1102) for a variable series attenuation value and constant series resistance (or series impedance) value, as required. Alternatively (not shown), a "T" style resistive attenuator could be used, with one or more of the three resistance elements (two series, one shunt) being digitally-controlled. Alternatively (not shown), a "Pi" style resistive attenuator could be used, with one or more of the three resistance elements (one series, two shunts) being digitally-controlled. The present embodiment is not restricted to any particular resistive attenuator topology or digitally-controlled resistor type (e.g., switched, opto-resistive, MOS, etc.), and can employ any suitable resistive attenuator topology and any number of digitally-controlled resistive elements to achieve the functionalities of the invention.

With reference to FIG. 11F and FIG. 11G, when there is no digital input signal (1161), the DSP (1102) adjusts the high-path amplifier (1123b) to an "off" state and adjusts the resistive element (1133a) to an attenuation level that assures a noise level of roughly −130 dBu as measured at resistive element output (1143), thus creating a low-noise quiescent state at final output (1150). As the digital input signal (1161) rises in level, causing output signal (1141) to rise and approach a certain level, which according to the current embodiment of the present invention is −16 dBu, the DSP (1102) sends control signals (1182) and (1183) to cause high-path amplifier (1123b) to change from an "off" state to an "on" state, and high-path resistive element (1133a) to increase the value of the shunt resistor (1184), causing a reduction of total attenuation (1133a) at resistive element output (1143) to, or near, 0 dB, i.e., little or no series attenuation. The change in amplifier (1123b) state from "off" to "on," and the reduction in resistive element (1133a) attenuation occurs immediately before the DSP (1102) begins to send high-path-program signal (1108) to high-path DAC (1113).

Since the DSP (1102) will change (1182) the high-path amplifier (1123b) from an "off" state to an "on" state when a rising mid-path program level (1141) at summing node (1151) is at or near −16 dBu, and because the resistive element (1133a) reduces its attenuation value to near 0 dB so as to allow full access of the output (1188) of the high-path amplifier (1123b), including its noise (1188c), when a rising mid-path program level (1141) at summing node (1151) is at or near −16 dBu, there exists a significant level difference between the "on" state high-path noise level of −94 dBu and the mid-path signal level near −16 dBu. This signal-to-noise difference provides a high degree of psychoacoustic masking to the high-path noise level, making the high-path noise level effectively imperceptible under normal program.

When rising mid-path output signal level (1141) approaches or reaches −16 dBu, the DSP (1102) will shift or crossfade or overlay or otherwise cause the transition of the input signal (1161) into the high-path (1108), which has been prepared for operation, i.e., the amplifier (1123b) has been turned "on" and there is little or no attenuation by the resistive element (1133a). In a similar manner, when the high-path output signal level (1143) is falling and reaches −16 dBu, the DSP (1102) will shift or crossfade or otherwise cause the reduction or removal of the input signal (1161) from the high-path (1108). At some point after this downward shift operation, assuming the signal is not again rising in level and approaching −16 dBu, the DSP (1102) will change (1182) the high-path amplifier (1123b) from the "on" state to the "off" state, and the DSP (1102) will change (1183) the resistive element (1133a) to an attenuation value of −15 dB. The high-path elements (1123b) and (1133a) will remain in this lowest-noise state until a rising mid-path to high-path transition operation is again required, as described above.

An Alternative Three-Path Embodiment

Figure 11I:
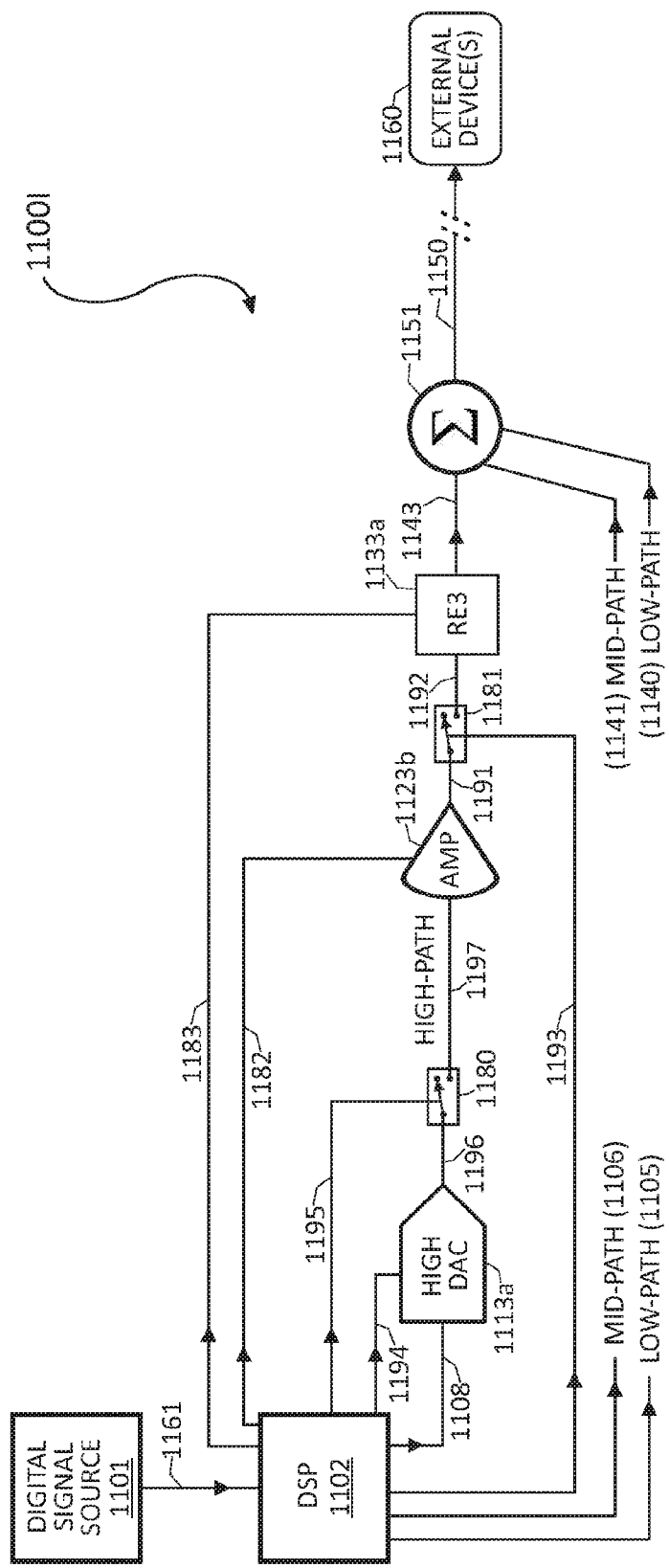
FIG. 11I shows a three-path digital-to-analog conversion circuit with digital adjustment of the DAC, amplifier, resistive element, and two switching elements.
Figure 11:
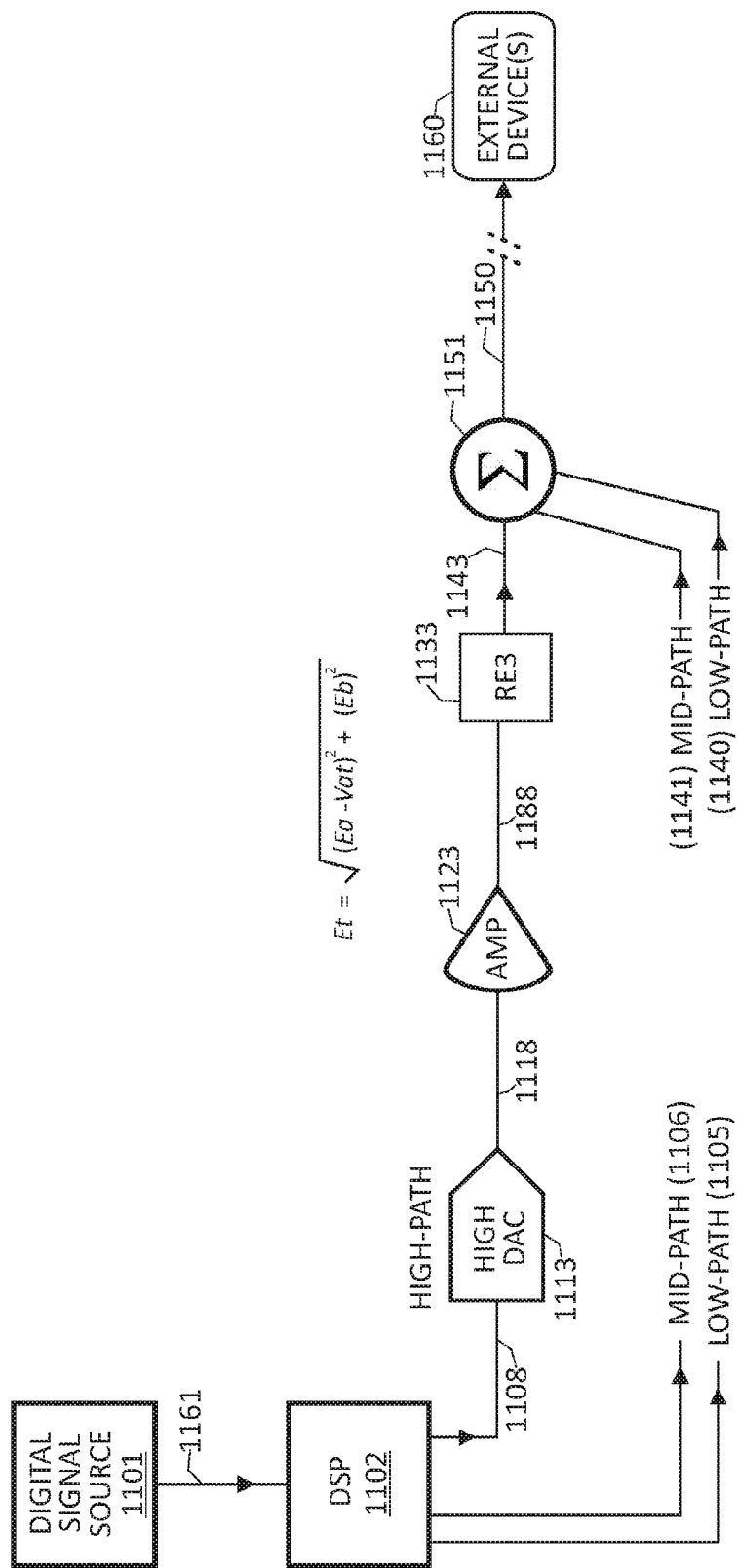
FIG. 11J shows a three-path digital-to-analog conversion circuit where the means to reduce high-path noise is produced entirely by fixed attenuation of resistive element.
FIG. 11K shows a non-summed three-path digital-to-analog conversion circuit with pre-adapted outputs.

FIG. 11I shows an alternative three-path embodiment according to the present invention where additional methods to improve noise reduction and dynamic range are presented, including digital-control of the high(er) path DAC(s), digital-control of the path between DAC and amplifier, and digital control of the immediate amplifier output.

In FIG. 11I, the details of low-path and mid-path circuits have been omitted because there are no changes to these paths relative to the first and second preferred alternative three-path embodiments described previously. Moreover, references to ADC calibration, level control and pre-adapted inputs (as, for instance, shown in FIG. 6A) have been omitted for clarity, but ADC calibration, level control and pre-adapted input techniques can be used on all embodiments of the present invention. FIG. 11I presents a DSP- (1102) controlled (1194) high-path controllable DAC (1113a). The DSP (1102) can manage any digitally-controllable state of a controllable DAC device (1113a), such as power-up and power-down, output muting and un-muting, enable-disable, and/or any other DAC state that may reduce output noise (hereinafter referred to as "mute" or "muting"). The DAC (1113a) has provision for a digitally-controlled (1194) muting function, allowing the DSP (1102) to mute and un-mute the output (1196) of the DAC (1113a). When the DAC (1113a) is muted or in a "mute" state, we assume its output (1196) self-noise to be −120 dBu.

The circuit (11000 of FIG. 11I further includes a DSP- (1102) controlled (1195) series switch or relay or other means (1180) for reducing or eliminating noise (hereinafter referred to as a "switch"), located between the DAC (1113a) and the amplifier (1123b). When the switch (1180) is open or "off" (i.e., the switch position as shown in FIG. 11I), zero DAC-related noise is present at the output (1197) of the switch (1180).

The circuit of FIG. 11I further includes a DSP- (1102) controlled (1182) gain and state adjustment of amplifier (1123b), as described previously. When the amplifier (1123b) is in its "off" state, and switch (1180) is open or "off" (i.e., the position shown in FIG. 11I), the noise as measured at the output (1191) of the amplifier (1123b) is −120 dBu.

The circuit of FIG. 11I further includes a DSP- (1102) controlled (1193) series switch or relay or other means (1181) of reducing or eliminating noise (hereinafter referred to as a "switch"), placed between amplifier (1123b) and resistive element RE3 (1133a). When the DAC (1113a) is muted via control path (1194), switch (1180) is closed (or "on") via control path (1195), and amplifier (1123b) is in an "off" state via control path (1182), the noise measured at the amplifier output (1191) is −117 dBu, which is the sum of the "off-state" amplifier (1123b) self-noise of −120 dBu and the mute-state DAC (1113a) self-noise of −120 dBu; where, for purposes of example, it is assumed that a circuit path between (1197) and (1191) exists even when the amplifier itself is in an "off" state. In some cases, when amplifier (1123b) is in an "off" state, the circuit path between (1197) and (1191) may be open.

When there is no digital input signal (1161), the DSP (1102) adjusts (1194) the DAC (1113a) to a mute state and adjusts (1195) the first switch (1180) to an off or open state (i.e., the state as shown in FIG. 11I) and adjusts (1182) amplifier (1123b) to its lowest self-noise state, which may be at unity gain, or may be in an "off" state, or both, as previously described. Because the operation of the second switch (1181) has been discussed elsewhere herein, it will be assumed that switch (1181) will be held (1193) closed or "on" by DSP (1102) for the rest of the present description of the present embodiment. Because a variety of circuitries and methods of implementation of controllable resistive elements have been discussed elsewhere herein, for the rest of the present discussion we assume that high-path resistive element RE3 (1133a) will exhibit a fixed 200 ohm total series resistance and a fixed attenuation of −10 dBu. When there is no input signal (1161), the noise of the high-path by itself, as measured at (1143) when not connected to the summing node (1151), will be the sum of the noise at amplifier (1123b) output (1191), which is −120 dBu, reduced by the attenuation value of RF3 (1133a) of −10 dB plus the thermal noise of roughly −130 dBu of resistive element RE3 (1133a), which will net a total output noise (1143) of roughly −127 dBu.

As the input signal (1161) rises in level, causing output signal (1141) to rise and approach a certain level, which according to the present embodiment of the present invention is −16 dBu, the DSP (1102) sends control signals (1195), (1194), (1182), (1193) and (1183) to change the state of the respective path components. For example, switch (1180) is set (1195) to its closed or "on" state; DAC (1113a) is set (1194) to its active "on" or non-muted state; amplifier (1123b) is set (1182) to its "on" state with an active gain of +24 dB and a self-noise of −94 dBu. Alternatively, amplifier (1123b) gain could be set (1182) from unity gain to +24 dB using digitally controlled gain as described previously. According to the present embodiment of the present invention, the change in amplifier (1123b) state, the change in state of switch (1180), and the change in state of DAC (1113a) occur immediately before the DSP (1102) begins to send high-path program signal (1108) to high-path DAC (1113a).

Because the DSP-controlled changes to the high-path circuitry (1113a), (1180), etc., change the total noise as measured at the input (1143) to the summing node (1151) from roughly −127 dBu to roughly −104 dBu (which is predominantly the noise of the amplifier (1123b) set to +24 dB of gain, minus the −10 dB attenuation value of RE3 (1133a)), when the rising signal level (1141) approaches −16 dBu there exists a roughly 90 dB difference between the high-path noise level of −104 dBu and the rising mid-path signal level approaching −16 dBu. This signal-to-noise difference provides a high degree of psychoacoustic masking to the −104 dBu high-path noise level. The effectiveness of the masking is, of course, dependent upon the nature of the program audio. It is also to be noted that the maximum output of the high-path stage as measured at output (1143) is +22 dBu, which is the maximum output (1196) of the DAC (1113a) of +8 dBu which is amplified by amplifier (1123b) with a gain of +24 dB, providing an output (1191) of +32 dBu, which is attenuated −10 dB by resistive element RE3 (1133a), thereby providing a maximum signal level of +22 dBu at summing node input (1143). Thus, the potential dynamic range of the present embodiment as measured at final output (1150) is determined by the difference between the system's quiescent noise floor of very roughly −127 dBu (or less, due to lower total paralleled path resistance) and its maximum output level of +22 dBu. The total (i.e., partially psychoacoustically-based) potential dynamic range is 149 dB, which is equivalent to roughly 25-bit performance.

As discussed above, when a rising signal level (1141) approaches or reaches −16 dBu, the DSP (1102) will activate the high-path components (1113a), (1180), (1123b), (1181) and (1133a) to an "on" state and then shift or crossfade or overlay or otherwise route the input signal (1161) into the high-path (1108). The high-path components remain in an active or "on" state until the signal level (1143) falls and reaches −16 dBu or lower, at which time the DSP (1102) will shift or crossfade or otherwise remove the input signal (1161) from the high-path (1108). At some point after this downward shift operation, assuming the signal is not again rising in level and approaching −16 dBu, the DSP (1102) will reverse the state changes described above. That is, the DSP (1102) adjusts (1182) amplifier (1123b) to its lowest self-noise state, which may be at unity gain and/or may be in a "off" condition, adjusts (1194) the DAC (1113a) to a mute state, and adjusts (1195) the first switch (1180) to an off or open state. The high-path is hence returned to the state in which the total noise as measured at (1143) is roughly −127 dBu.

An Alternative Three-Path Embodiment

FIG. 11J shows an alternative three-path embodiment where the means to reduce high-path noise is produced entirely by fixed attenuation of resistive element RF3 (1133). The noise measured at the output (1143) of resistive element RF3 (1133), when not connected to summing node (1151), is given by the noise measured at the output (1188) of amplifier (1123) minus the attenuation factor of RE3 (1133) plus the total noise of RE3 (1133). For instance, if the noise at (1188) is −110 dBu (Ea), and the attenuation factor of RF3 (1133) is 20 dB (Vat), and the total series resistive value of RF3 (1133) is 200 ohms, which exhibits a thermal noise of roughly −130 dBu (Eb), then the total noise (Et), as measured at the output (1143) of resistive element (1133) when not connected to summing node (1151) is given by a formula for the sum of uncorrelated noise (which has the form of a right-angled vector sum), namely:

$$Et = \sqrt{(Ea-Vat)^2 + (Eb)^{20}} \quad (2.2)$$

From the formula above and the exemplary values previously stated, and assuming all noise is uncorrelated, the total noise Et expressed in dBu, as measured at the output (1143) of resistive element RE3 (1133) when not connected to summing node (1151), is roughly −127 dBu.

Figure 11K:
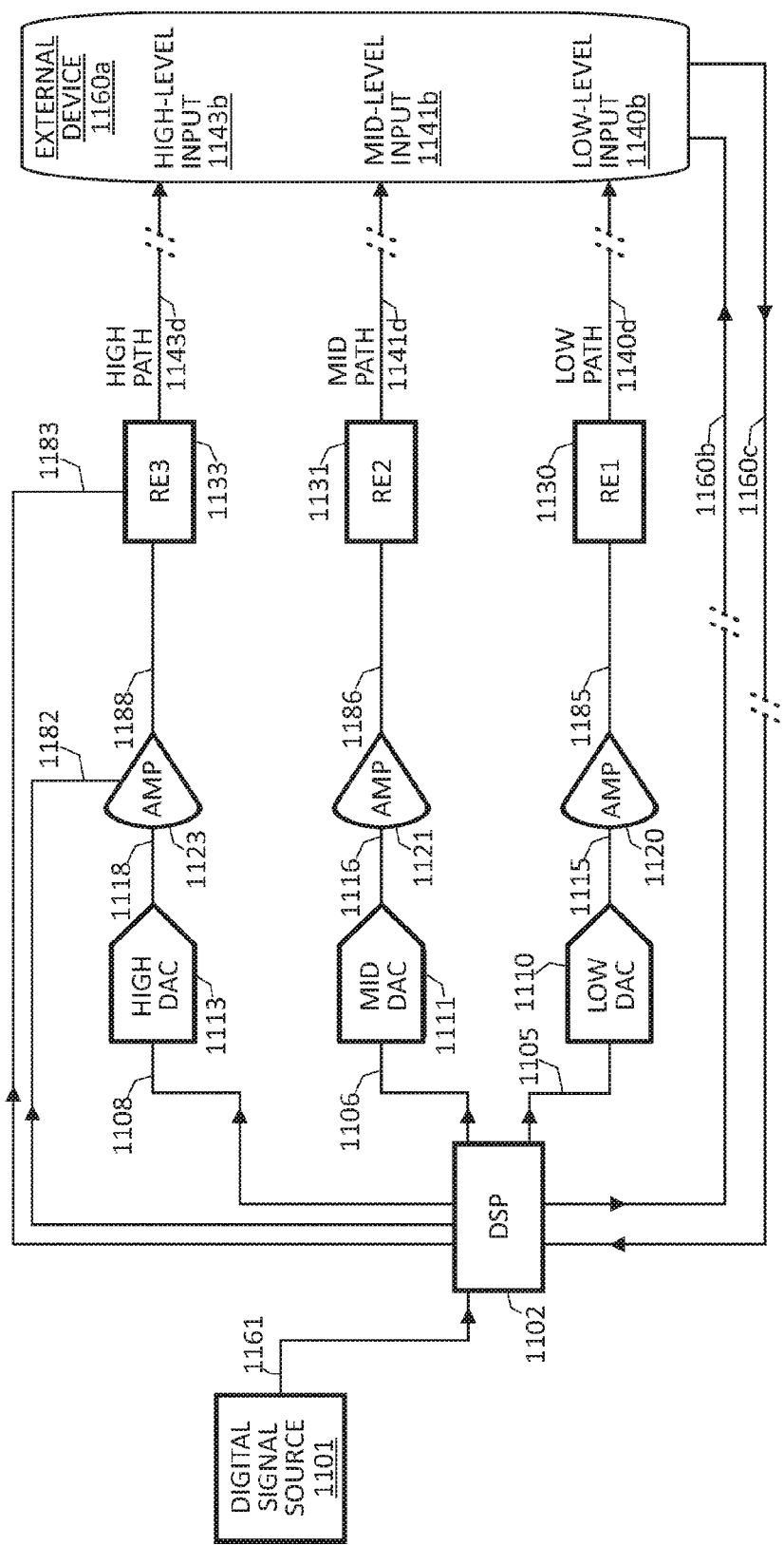

An Alternative Three-Path Embodiment with a Non-Summed, Pre-Adapted Multiple-Path Output Previous examples of external devices that are fed by the output of the circuitry of the present invention, such as external device (1160) in FIG. 11J fed from summing node (1151) via lead (1150), are shown with single-path inputs. However, external devices may also employ a multiple-path (i.e., adaptive) input topology that allows a plurality of input signals corresponding to different level ranges. In such cases when an external device is designed in a manner that accepts multiple signal paths carrying varying "pre-adapted" ranges of signal level, the alternative three-path embodiment, shown in FIG. 11K, provides for a direct interface to said multiple-input external devices. In particular, the summing node (1151) shown in previous embodiments, is removed, and each formerly-summed path (1140), (1141) and (1143) is provided a discrete (i.e., non-summed) output (1140d), (1141d) and (1143d) to an external device (1160a) which has a multi-path (i.e., pre-adapted) input configuration (1140b), (1141b) and (1143b). Examples of external devices that can employ this manner of multi-path/adaptive input topology include audio power amplifiers, analog-to-digital converters, audio test and measurement equipment, seismic test and measurement equipment, transducer test and measurement equipment, line and buffer stages and so forth.

A benefit of pre-adapted, multi-path audio signal transmissions is reduced downstream processing requirements, i.e., by continuous upstream pre-processing of the output signal into multiple pre-adapted pathways the amount of signal processing required at downstream devices with complimentary multi-path topology is substantially reduced. Additional DSP (1102) interfacing with, and control of, the external device (1160a) is provided by control signal path (1160b) and feedback signal path (1160c). The control signal (1160b) provided by DSP (1102) may control a switch or relay or resistance or other digitally-controllable function, or multiple functions, within the external device (1160a). The feedback signal (1160c) provides for calibration data and state feedback of the external device. Signals (1160b) and (1160c) may be transmitted by any means, including a physical wire or via wireless technique, such as Bluetooth or other wireless carrier. While three pre-adapted output signal paths (1140d), (1141d) and (1143d) are shown for exemplary purposes in FIG. 11K, the present invention can be realized with any number of paths. FIG. 11K shows one possible embodiment of a non-summed, multiple-path output topology, but any embodiment of the present invention can be re-configured into non-summed, pre-adapted, multiple-path output topology.

Simplified Embodiments

In the present specification, 0 dBu is equivalent to 0.7746 volts RMS. Unless otherwise specified, all references to noise are considered to be single RMS voltage measurements with an audio bandwidth of 20 kHz with no weighting filters applied. Unless otherwise specified, additions of noise are assumed to be vector sums of uncorrelated noise. While in practice certain program or signal level can often be detected and/or processed under a noise level, for clarity of exposition in the present specification we consider program or signal level below a noise level as unusable. For example, a program level of −100 dBu will be considered as unusable when the noise level is higher than −100 dBu, e.g., −99 dBu. A single DAC device, e.g., component (1210) of FIG. 12A, will be considered to have all common functions of an audio digital-to-analog conversion circuit, including D-A conversion, I-V conversion, clock management, high output current, analog and/or digital filtering, low output impedance, and so forth.

Figure 12A:
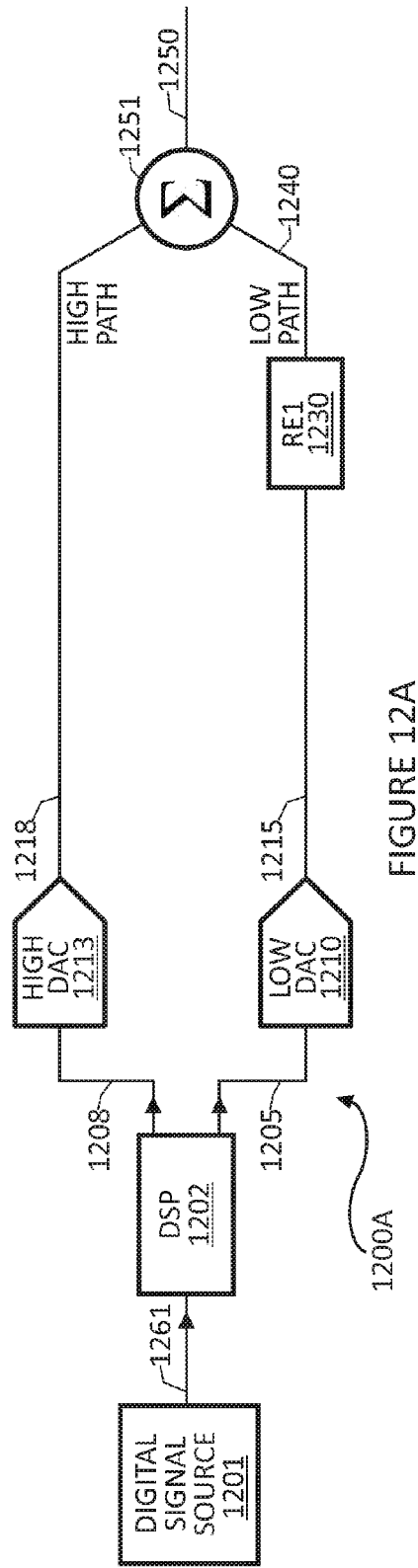
FIG. 12A shows a two-path digital-to-analog conversion circuit.

FIG. 12A is a schematic of a circuit (1200A) with fundamental components for the implementation of a two-path bit-grouping for a digital-to-analog converter circuit where the low-path is configured for dynamic range improvement according to the present invention. The circuit of (1200A) has an input digital signal source (1201) and output analog signal (1250) according to a preferred embodiment of the present invention. The circuit of FIG. 12A uses a digital signal processor (DSP) (1202) to divide a PCM digital input signal (1261) into two bit groupings, a low-path grouping (1205) and a high-path grouping (1208). The low-path and high-path bit groupings (1205) and (1208), in relation to one another, may be contiguous or appended or cross-faded or overlapping data which are processed by DSP (1202) via separate data paths to increase dynamic range relative to what is possible with a single-path digital-to-analog converter (DAC). In a two-path configuration, such as that shown in the circuit (1200A) of FIG. 12A, the paths are referred to as the "low" and "high" paths, with each path optimized for a partial dynamic range of the original digital signal, and then, according to the present embodiment, the output signals from the multiple paths (1218) and (1240) are summed at the summing node (1251) to provide the analog output (1250). The signal transitions between paths and the nature of how paths are utilized as the input level rises or falls (i.e., the "adjacent path transitions" or "path-to-path transitions") is managed by a digital signal processor (DSP) (1202). The adjacent path transitions can occur in a contiguous or appended manner, or by overlapped cross-fading, or by layering or summing multiple active paths, or by any path-to-path transition method under DSP control which maintains what a listener will perceive to be a linear, artifact-free and glitch-free summed program output (1250) before, during, and after transitions, i.e., a path transition method will provide perceptively accurate program reproduction under all operational conditions.

With reference to FIG. 12A, a digital-audio input signal (1261), typically formatted with pulse-code-modulation (PCM), is input to the DSP (1202) which can be any processor having suitable speed, bandwidth, and functional attributes required to fulfill the functionalities of the present invention. The DSP (1202) splits the input signal (1261) into two bit-groupings (1205) and (1208). The low-bit group is multiplied upwards by DSP (1202) to an extent that raises the lowest desired (generally the lowest usable) input bit of signal (1261) to a level that equals or exceeds the total output noise of the low path circuitry (1240) after attenuation (1230), so that the lowest desired bit of input signal (1261) remains usable (i.e., as previously defined) at the low path output (1240).

The multiplied low-bit group (1205) is input to a DAC (1210). Any audio-grade DAC can be used, defined as having sufficiently low output impedance, sufficiently high output current, and sufficiently high output voltage to properly interface with summing node (1251) which combines the low-path and high-path signals into a single analog output signal (1250) capable of driving real-world external devices to a sufficiently high level and wide bandwidth, while maintaining sufficiently low noise and distortion.

With reference to FIG. 12A, because the low-bit-group digital input signal (1205) has been multiplied upward by DSP (1202), the analog output (1215) of the low-path DAC (1210) may exhibit a level that is not representative of the original input signal (1261), i.e., the low-path DAC signal output (1215) will be too high relative to the desired output signal (1240). To correct for this, a low-path attenuator (1230) receives the DAC output signal (1215) and reduces (attenuates) the signal (1215) to a low-path output (1240) with a level representative of the input signal level (1261). For example, if the low-path DAC (1210) has a 24-bit PCM input with a maximum analog output of +8 dBu and a noise floor of −112 dBu (i.e., the DAC (1210) cannot resolve its own least significant input bits 1-4 and hence produces output (1215) noise for any digital input (1205) from −136 dBu to −112 dBu), and if the digital input (1261) is a 32-bit PCM signal, and if the lowest (i.e., least significant) bit of the input program signal (1261) is representative of −160 dBu, and if the lowest desired (i.e., above-the-noise) signal level from input (1261) is −130 dBu (i.e., any original program signal (1261) below −130 dBu is not required and/or will be below the output (1240) noise floor), and if the DSP (1202) multiplies the digital input signal (1261) upwards so that a representative −130 dBu input signal level (1205) is output (1215) by the DAC (1210) at a −76 dBu level, then an attenuator (1230) of sufficiently low total series resistance (i.e., a passive resistive attenuator having a total thermal self-noise of −130 dBu or less, equivalent to roughly 200 ohms total series resistance or less) and configured for a level reduction of −54 dB will reduce a −76 dBu input (1215) to an output (1240) of −130 dBu when the output (1240) is not connected to summing node (1251). The attenuation value (1230) of −54 dBu simultaneously reduces the self-noise of the DAC (1215) to an insignificant level (e.g., roughly −166 dBu) so that the original −130 dBu input program signal (1261) is presented at the output (1240) as a −130 dBu program signal, which is also the noise floor presented by the low-path output (1240).

With reference to FIG. 12A and as previously described, the DSP (1202) splits the input signal (1261) into two bit-groupings, the low-path group (1205) and high-path group (1208). The high-path bit group (1208) is typically configured by DSP (1202) so that the highest desired input bit is mapped to the highest (i.e., most significant) input bit of the high-path DAC (1213) (i.e., DAC input bit 24 in the present example). The DSP (1202) could, alternatively, feed (1208) the highest desired input bit to an input bit of the DAC (1213) that is lower than the DAC's most significant bit, but such an alternative configuration would typically reduce overall systemic dynamic range performance. Hence configuring the DSP (1202) to map the highest desired input bit (1261) to the highest possible input location (1208) of the high-path DAC (1213) is preferred. When the high-path DAC (1213) is receiving the high-path bit group (1208) as a full-scale program so that all of the DAC (1213) input bits are active to the most significant bit (i.e., the DSP (1202) is feeding (1208) its most significant 24 bits of data to the high-path DAC (1213)), the high-path DAC (1213) will correspondingly output (1218) a full-scale analog level of +8 dBu, with a self-noise of −112 dBu when the output (1218) is not tied to the summing node. (Since each path manages noise in a separate manner, and since combining both paths at the summing node (1251) changes the total noise as measured on each path separately, a path's output noise level will generally be different when the output paths connected and not connected to the summing node.)

Figure 12B:
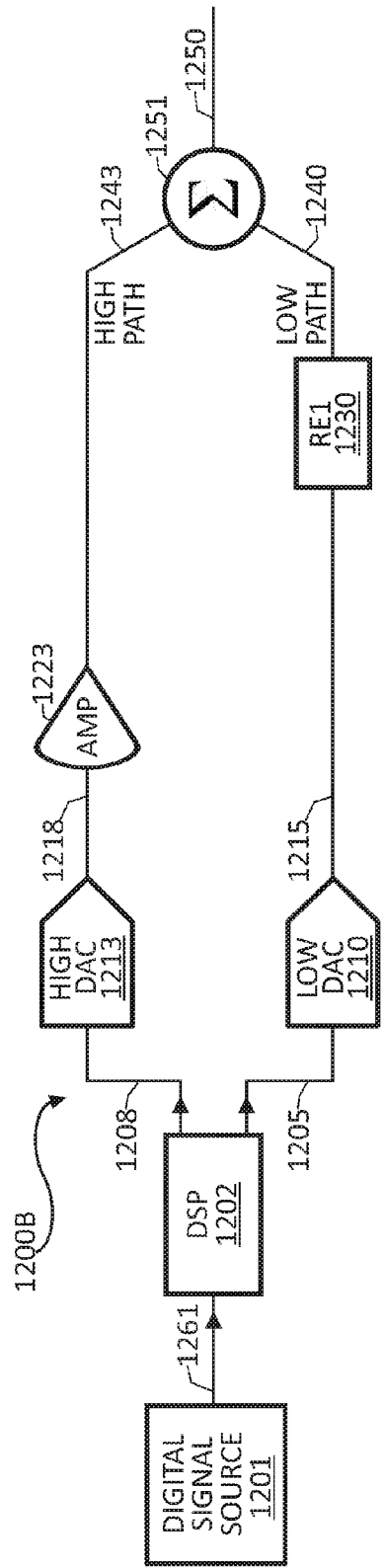
FIG. 12B shows the two-path digital-to-analog conversion circuit of FIG. 12A with an amplifier added to the high-path circuitry.

In practice, a maximum output level (1218) of +8 dBu may be too low. FIG. 12B shows a two path circuit (1200B) but with the addition of a high-path amplifier (1223) located between the DAC output (1218) and the summing node input (1243). While such an amplifier (1223) could be described as part of an integrated DAC device or system (1213), it is shown here as a separate schematic element for clarity of exposition. To increase the high-path output (1243) level, the high-path amplifier (1223) provides gain, for example +18 dBu. The amplifier (1223) exhibits −96 dBu of noise at +18 dB gain. When the high-path DAC (1213) reaches full-scale output (1218) of +8 dBu, the amplifier (1223) receives the +8 dBu full scale program signal from the DAC (1213) and boosts the level by +18 dB to provide a maximum full-scale output (1243) of +26 dBu, which provides a more practical working level.

Although a passive summing node is shown (1251), when summing multiple output paths active summing can be alternatively used. However, active summing adds additional output noise due to the self-noise of the active summing element(s). While active summing can be used within the scope of the present invention, in order to reduce systemic noise and improve overall dynamic range, a passive summing method is taught. In FIGS. 12A-12H, summing node (1251) is passive, i.e., a simple physical electrical connection.

Figure 12C:
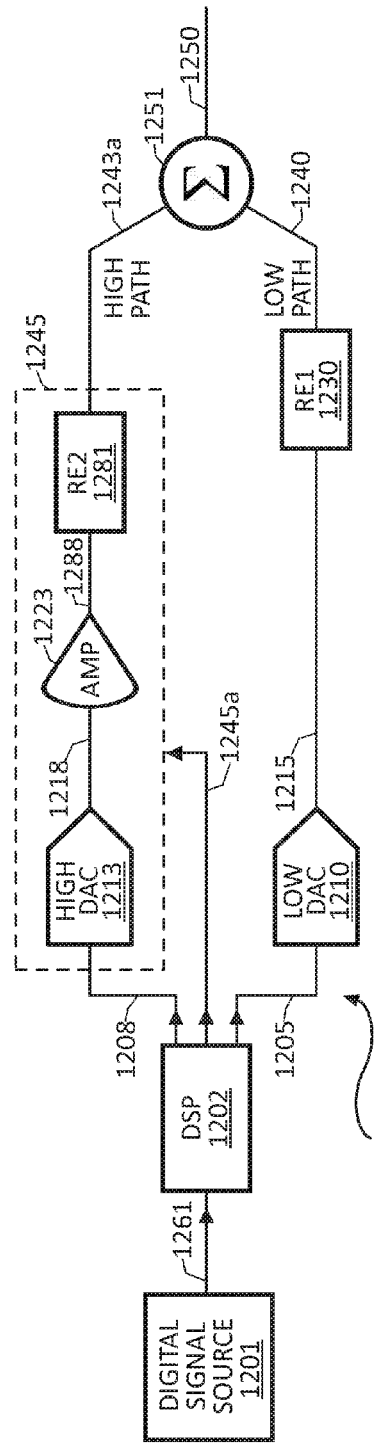
FIG. 12C shows the two-path digital-to-analog conversion circuit of FIG. 12B with additional high-path noise reduction elements.

As heretofore described, the high-path circuits of FIG. 12A and FIG. 12B add a significant amount of noise when connected to the summing node (1251). For instance, in FIG. 12A, the high-path output will add −112 dBu of noise to the summed output (1250), while in FIG. 12B, the amplified output (1223) will add −96 dBu of noise to the summed output (1250). Shown in FIG. 12C is a circuit (1200C) which, relative to the circuits (1200A) and (1200B) of FIG. 12A and FIG. 12B, further reduces noise from the high-path output (1243a). Circuit (1200C) is identical to circuit (1200B) except for the addition of a high-path resistive element (RE2) (1281) between the amplifier (1223) and the high-path output (1243a). Furthermore, the components (1213), (1223) and (1281) inside the dashed-line rectangle (1245) are under DSP (1202) control (1245a) in order to reduce noise in the high-path. Examples of digitally-controlled (1245a) high-path noise reduction methods include, but are not limited to, DAC (1213) muting or disabling, locating a switch between the DAC (1213) and the amplifier (1223), muting or disabling the amplifier (1223), providing the amplifier (1223) with digitally-controlled gain, locating a switch between the amplifier (1223) and the resistive element (1281), digitally-controlled resistance and attenuation by the resistive element (1281), locating a switch after the resistive element (1281), or any combination of the above high-path noise-reduction methods.

The circuit (1200A) of FIG. 12A achieves a low-path noise floor of −130 dBu when the low-path output (1240) is not connected to the summing node (1251). For the circuit of FIG. 12C to achieve a −130 dBu noise floor when both the high-path output (1243a) and low-path output (1240) are connected to the summing node (1251), the high-path output (1243a) must provide a very low-noise. Low levels of high-path noise can be achieved by the methods described in the previous paragraph. The highest degree of high-path noise reduction is achieved by eliminating the high-path connection (1243a) to the summing node (1251) via a DSP-controlled switch placed before or after the resistive element, or by some other means, to fully remove the high-path noise from electrical connection to the summing node.

In an alternative embodiment related to FIG. 12C, any of the above-described high-path noise reduction techniques (1245) can be used regardless of whether low-path noise-reduction techniques are utilized. For instance, the low-path bit-grouping (1205) could be delivered to the DAC (1210) without bit shifting so that no attenuation is required by resistive element RE1 (1230) or no resistive element (1230) is even present. Any noise from the output (1215) of the low-path DAC (1210) and any associated low-path circuit elements will be summed at the output (1250).

Figure 12D:
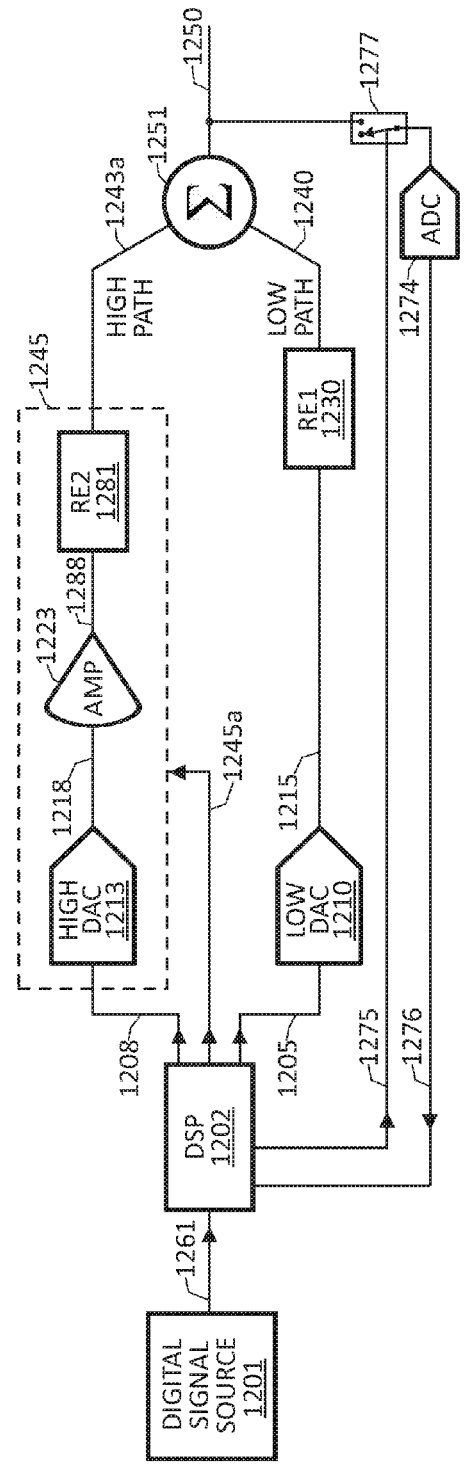
FIG. 12D shows the two-path digital-to-analog conversion circuit of FIG. 12C with ADC calibration feedback added to the circuitry.

Because electronic component values can drift with material variations and environmental conditions, and because resistance and impedance values can vary with path switching effects, and because a passive summing topology can have variation in output level due to changes in downstream loads, the schematic of FIG. 12D presents a circuit that is identical to FIG. 12C with the addition of a digitally-controlled ADC feedback network (1274), (1275), (1276) and (1277) used for calibrating the systemic output levels (1240), (1243a) and (1250).

A conventional digital PCM signal is configured and delivered as a per-sample signal of contiguous bits. However, alternatively the incoming high dynamic range signal may be configured and delivered in a pre-adapted, multi-path manner. FIG. 12E is identical to FIG. 12D except that the input is multiple pre-adapted input signals (1261), (1261a) and (1261b). An unlimited number of pre-adapted multi-path input signals can be used in the present invention, as represented by the three dots below the bottom input source (1201b).

Conventional audio DACs can include a means for controlling output level. The circuit (1200F) of FIG. 12F is identical to the circuit (1200E) except for the addition of a level controller (1202a) connected to DSP (1202) via control line (1204). The level controller (1202a) provides a means for varying the output level (1250) relative to the input level (1261) (or pre-adapted input levels) by shifting the low-path and high-path bit-groupings (1205) and (1208) uniformly upward or downward in level in a selectable and/or digitally-controllable (1202a) manner (1204).

Any functionality heretofore described in a two-path DAC embodiment can be realized in a three-or-more path DAC embodiment. The circuit (1200G) of FIG. 12G, which is identical to the circuit (1200A) of FIG. 12A except for the addition of a middle path (1206), (1211), (1216), (1231) and (1241), shows a rudimentary three-path embodiment.

The circuit (1200H) of FIG. 12H is identical to the circuit (1200G) of FIG. 12G except for the addition of digital-control of the high-path components (1213), (1223) and (1281) to provide noise reduction as described earlier. Any noise reduction methods heretofore described in a two-path DAC embodiment can be realized in a three-or-more path embodiment. Said noise reduction methods can also be applied to mid-paths as required to meet noise performance objectives.

The circuit (1200I) of FIG. 12I is identical to the circuit (1200H) of FIG. 12H except that the summing node (1251) and summed output (1250) have been removed and each output (1240a), (1241a), and (1243c) is now provided as a discrete pre-adapted source. Pre-adapted, multi-path audio signals can be used in many applications where conventional single-path audio signals are used, such as for pre-amplifiers, power amplifiers, A-D converters, line stages and buffers, etc. A benefit of pre-adapted, multi-path audio signal transmissions is reduced downstream processing requirements, i.e., by continuous upstream pre-processing of the output signal into multiple pre-adapted pathways, the amount of signal processing required at downstream devices with complimentary multi-path topology is substantially reduced. For instance, if a multi-path topology power amplifier downstream of the DAC circuit (1200I) has complimentary inputs (e.g., three pre-adapted inputs comprising low-path, mid-path and high-path), and path management, path-to-path transitioning, and other digitally-controlled functions are performed upstream (i.e., by the DSP (1202), etc.), then the power amplifier can receive pre-adapted multi-path signals from the discrete DAC outputs (1240a), (1241a) and (1243a) and maintain the signals in a multi-path domain. If digitally-controlled functions (e.g., digitally-controlled noise switching) are included in the downstream device (e.g., the power amplifier), digital function control signals from the upstream DAC circuit (1200I) can be sent to the downstream device via wires or wirelessly.

Thus, it will be seen that the improvements presented herein are consistent with the objects of the invention described above. While the above description contains many specificities, these should not be construed as limitations on the scope of the invention, but rather as exemplifications of preferred embodiments thereof. Many other variations are within the scope of the present invention. For instance: any of the high-path elements as shown in FIG. 11I can be used in any combination and/or variation to reduce the noise of the high-path; the invention is not limited to a 32-bit input signal—an input signal of any bit length may be used; unless otherwise specified, the term "bit," when used to describe a level (e.g., bit 22=−4 dBu), will generally refer to the top bit of an unsigned full-scale (i.e., all lesser significant bits active) level represented by said bit; path-to-path transitions may be appended, and/or concurrent or overlapping, and/or involve fade-ins and/or fade-outs and/or cross-fades and/or dithering; in the event that an input signal possesses an extremely fast rise-time (e.g., gunshot) or extremely fast fall-time (e.g., square wave falling edge), one or more paths could be skipped in transition, for instance in a three-path system a fast-rising signal could transit from low-path to high-path without engaging with the mid-path; while the present specification describes path-to-path transitions as appended or cross-faded or adjacent, an alternative transition method would concurrently sum the output of two or more paths along with DSP-controlled level management of said paths; the digital signal processor may be any manner of digital processor (such as FPGA, etc.) that has adequate speed, bandwidth, input/output capabilities, and programmable features to perform the necessary processing; although 200 ohm resistive elements are taught, the invention can be designed with any resistances appropriate and suitable to low noise, parallel-summed, high performance passive summing; while passive summing is taught as the preferred path-combing method, the invention can be used with any summing method, including active summing; the resistive elements may generate values of attenuation (or no attenuation) other than the particular values taught above—the invention can function successfully over a wide range of attenuation values when suitably designed in consort with other parameters of the circuitry; the invention is not limited to 2-path and 3-path topologies, and any number of paths can be employed according to the present invention; the high-path (or higher paths) series switching element(s) are defined as any means for eliminating or significantly reducing noise at of the path as measured at the path output—possible means could include, but are not limited to, (1) selectively shutting down the path amplifier via power supply, internal shutdown or disable pin, or other methods, (2) grounding the high-path(s) through a suitable grounding path resistance(s), (3) using a low noise CMOS or FET or related active switching device (although it should be noted that 1-ET and CMOS devices may have inherently higher self-noise than what is taught above), and (4) using digitally-controlled resistive elements in various path topologies; methods of timing the high-path(s) switching element(s) may involve digitally-controlled input signal delay and look-ahead processing techniques; although specific examples of path switching threshold levels are described herein, the invention is not limited to these specific switching levels and may employ other switching threshold levels and/or other switch timing dynamics (e.g., to prevent switching chatter or oscillation, a switch or switching event or noise reduction technique may be held closed or active for some extended period of time even though the output signal level may drop below the described switching threshold level); to reduce path non-linearity, switching may be configured in a make-before-break manner which can maintain a constant path source/output impedance before and after a switching event; although specific examples of path levels and bit-relationships to said path levels are described herein, the invention is not limited to these specific levels and may employ other levels and or bit-relationships to in order to achieve the novelties of the present invention; high-path resistive element(s) can be implemented down-stream and/or up-stream from the switching elements as required to improve linearity, transient noise and/or switching performance; although the circuits are diagramed and described in terms of discrete items (e.g, amplifiers, digital-to-analog converters, resistive elements, switching elements, digitally-controlled elements, etc.), multiple discrete elements may be integrated into a single integrated circuit or other integrated or modular system; although amplifiers with particular characteristics are described herein (e.g., a maximum output of +32 dBu and a unity gain noise floor of −112 dBu), the invention is not limited to amplifiers with these characteristics; although digital-to-analog converters (DACs) with particular characteristics are described herein (e.g., 24 bit input, −112 dBu noise, 120 dB usable dynamic range, etc.), the invention is not limited to DACs with these characteristics; although unipolar or unsigned DAC topology is used for explanatory clarity in the present invention, as will be appreciated by one skilled in the art the present invention is not limited to unipolar or unsigned style DACs or any specific arrangement and may employ any topology of DAC or DAC interface including but not limited to PWM, ladder, R2R, multiplying, string, oversampled, delta sigma, switched resistor, parallel capacitor, current source, successive approximation, thermometer coded, binary weighted, signed, unsigned, bipolar, unipolar, I2S, right justified, left justified, TDM, etc.; although bit diagrams shown in the present invention are arranged simply from LSB to MSB (e.g., 1=>24, 1=>32, etc.) without respect to any particular conversion style, sign management technique or specific interface, the present invention is not limited to any particular conversion style, sign management technique or specific interface; although an exemplary systemic level shift of −6 dB is described herein, the invention is not limited to any specific systemic level shift value, i.e., any value of level shift within the programmable range of the DSP can be utilized; while level shift and/or mapping examples are shown and described in terms of integer bit increments (which corresponds to incremental 6 dB analog domain level shifts), for clarity of explanation the present invention may utilize level shifting corresponding to non-integer values, and such level shifts may be implemented by multiplication with any convenient or relevant coefficient(s), or through computation and/or programming of exponent register values within the programmable range of the DSP; in the detailed description, input data bits below the noise floor of a DAC are conventionally defined as unusable, but in some circumstances, depending on program type and DAC design and performance, some data bits below the DAC noise floor could be usable, hence the convention of using "null bit" or "zero bit" mapping in the low path(s) is offered for explanatory clarity, but in practice some "null" or "zero" bits may otherwise be used as or by program bits below the objective or measured noise floor of the DAC; while the preferred embodiments are described in terms of discrete functional elements (e.g., DSP, DAC, amplifier, switching device, resistive element, digitally-controlled resistance, etc.), functional elements may be integrated into a common device—for instance, an amplifier function may be integrated into a DAC device so that the DAC device may possess an output with sufficiently low output impedance, sufficiently high output current, sufficiently high output gain capability, sufficient frequency filtering characteristic, etc., i.e., the integrated DAC device performs functions which might otherwise be in the domain of an external amplifier device—or for instance, a DAC device may be integrated into a DSP device, or a resistive element possessing proper resistance and/or attenuation characteristics, etc., may be integrated into the integrated DAC and DSP device, etc., or IV conversion may be built into a DAC device, or path summing may occur in the current domain directly from DAC outputs before IV conversion, etc.; although for explanatory clarity components are typically shown with a simple single-line inputs and outputs, amplifiers, DACs, and other circuit elements may employ different types or varieties of inputs, outputs, control elements, power supply elements, clocks, etc., and specific functional attributes of said circuit elements should be well understood to those skilled in the art; noise levels, resistance values, signal levels, attenuations values, transition levels, and other such values and levels and examples given in the embodiments are chosen for exemplary purposes—myriad alternative values and other operating and design parameters could be chosen to exemplify the functionalities of the embodiments; although in the present specification it is shown how passive summing can be used to combine output paths for optimal dynamic range, active path summing may also be used, although it should be noted that active summing can increase systemic noise, and hence reduce dynamic range performance (i.e., the noise added by active summing will add to the output noise, thereby reducing systemic dynamic range relative to passive summing); while the present invention is described as having PCM data formatting, the invention is not limited to PCM data and may be realized with other formats or data coding, such as MQA, PDM, PWM, etc.; while multiple ADC feedback paths are shown for explanatory clarity, in practice a lesser number of ADC paths may be required to achieve systemic calibration; while single channel embodiments are shown, any number of channels can be configured for time-concurrent operation with appropriate clock and i/o synchronization, as would be understood by those skilled in the art; while certain descriptions and claims describe digital level shifting or level mapping or bit mapping using directional language such as "upward" or "downward," such language is used for explanatory clarity and may or may not represent a mathematical (DSP) shift or scalar upward or downward "direction," etc. Accordingly, it is intended that the scope of the invention be determined not by the embodiments illustrated or the physical analyses motivating the illustrated embodiments, but rather by the appended claims and their legal equivalents.

What is claimed is:

1. An apparatus for conversion of an input digital signal to an output analog signal having a maximum output level, said input digital signal being nominally a signal of K bits, comprising:
    a bit grouping providing system which provides said input digital signal as a low-path digital signal of L primary bits and a high-path digital signal of H primary bits, where L+H is greater than or equal to J, and J is a number of bits of said input digital signal utilized by said bit divider where J is less than or equal to K,
    a low-path digital-to-analog converter for digital inputs of $R_L$ bits or less, said low-path digital signal being bit shift mapped to an input of said low-path digital-to-analog converter where L is less than or equal to $R_L$, wherein the L bits of the low-path digital signal are level shift mapped upwards by $L_S$ bits where $L+L_S \leq R_L$, said low-path digital-to-analog converter producing a low-path digital-to-analog converter output signal,
    a high-path digital-to-analog converter for digital inputs of $R_H$ bits, said high-path digital signal being level shift mapped downwards to an input of said high-path digital-to-analog converter by a bit shift of $H_S$ bits such that $(K-H_S) \leq R_H$ and $(K-H-H_S) \geq 0$, said high-path digital-to-analog converter producing a high-path digital-to-analog converter output signal,
    a low-path attenuator which attenuates said low-path digital-to-analog converter output signal to produce an attenuated low-path analog signal,
    a high-path amplifier which amplifies said high-path digital-to-analog converter output signal to produce an amplified high-path signal having a maximum level equal to said maximum output level, and
    a passive summing node which, combines an ultimate low-path signal derived from said attenuated low-path analog signal and an ultimate high-path signal derived from said amplified high-path signal to produce said output analog signal.

2. The apparatus of claim 1 wherein said high-path digital-to-analog converter and said high-path amplifier are components of high-path circuitry, said low-path digital-to-analog converter and said low-path attenuator are components of low-path circuitry, further including a control system for managing said high-path circuitry and said low-path circuitry during signal level transitions across a first threshold level of said input digital signal.

3. The apparatus of claim 2 wherein if a signal level of said input digital signal does not exceed said first threshold level, said control system reduces access of noise from said high-path amplifier to said passive summing node.

4. The apparatus of claim 3 wherein signal level transitions across a second threshold level are implemented by a cross-fading of said ultimate high-level signal with said ultimate low-level signal.

5. The apparatus of claim 4 wherein signal level transitions across a second threshold level are implemented by contiguous transitions between said ultimate high-level signal and said ultimate low-level signal.

6. The apparatus of claim 3 wherein signal level transitions across a second threshold level are implemented by a sum of said ultimate high-path signal and said ultimate low-path signal.

7. The apparatus of claim 5 wherein said first threshold level is equal to said second threshold level.

8. The apparatus of claim 1 wherein said bit grouping providing system is a bit divider which divides said input digital signal into said low-path digital signal of L primary bits and said high-path digital signal of H primary bits.

9. The apparatus of claim 8 wherein said high-path digital signal includes $H_L$ subsidiary bits taken from said input digital signal, said $H_L$ subsidiary bits being less significant bits of said high-path digital signal than said H primary bits, and said low-path digital signal includes $L_S$ subsidiary bits, said $L_S$ subsidiary bits being less significant bits of said low-path digital signal than said L primary bits.

10. The apparatus of claim 8 wherein (L+H−J) is the number of primary bits of overlap between said low-path digital signal and said high-path digital signal.

11. The apparatus of claim 1 further including a high-path resistive element between said high-path amplifier and said passive summing node, the thermal noise of said high-path resistive element being less than noise in said amplified high-path signal.

12. The apparatus of claim 1 wherein said low-path attenuator attenuates said low-path digital-to-analog converter output signal by an attenuation factor such that said attenuated low-path analog signal has a maximum level corresponding to the highest bit of said low-path digital signal.

13. The apparatus of claim 1 wherein said low-path digital-to-analog converter has a DAC-output noise level of $\phi_{LDAC}$ dBu which corresponds to bit level $N_{LDAC}$ of the input to said low-path digital-to-analog converter, and wherein $L_S$ is greater than or equal to $N_{LDAC}$.

14. The apparatus of claim 13 wherein said high-path digital-to-analog converter has a DAC-output noise level of $\phi_{HDAC}$ dBu which corresponds to bit level $N_{HDAC}$ of the input to said high-path digital-to-analog converter, and wherein $(J-(H+H_S)) \geq N_{LDAC}$.

15. The apparatus of claim 2 wherein said first threshold level is substantially greater than a noise level $\phi_{HPU}$ dBu of said ultimate high-path signal.

16. The apparatus of claim 1 wherein J is a difference in bits between a maximum level of said input digital signal and a noise floor of said input digital signal.

17. The apparatus of claim 1 wherein said low-path digital-to-analog converter output signal is passed through a low-path buffer.

18. The apparatus of claim 17 wherein said low-path buffer is a unity gain buffer amplifier.

19. The apparatus of claim 17 wherein said low-path buffer has a low-path buffer noise level of $\phi_{LBUF}$ dBu corresponding to a bit level $N_{LBUF}$ of said input digital signal, and wherein $L_S$ is greater than or equal to $N_{LBUF}$.

20. The apparatus of claim 17 wherein a buffer output signal which is output from said low-path buffer passes through a low-path resistive element in route to said passive summing node.

21. The apparatus of claim 20 wherein said low-path resistive element has a resistance between 20 and 5000 ohms.

22. The apparatus of claim 20 wherein said low-path resistive element has a resistance between 50 and 500 ohms.

23. The apparatus of claim 1 wherein said amplified high-path signal passes through a high-path resistive element in route to said passive summing node.

24. The apparatus of claim 23 wherein said high-path resistive element has a resistance between 20 and 5000 ohms.

25. The apparatus of claim 23 wherein said high-path resistive element has a resistance between 50 and 500 ohms.

26. The apparatus of claim 1 further including a feedback mechanism for stabilizing said analog output level in the course of transitions of said input digital signal across said threshold level.

27. The apparatus of claim 26 wherein said feedback mechanism monitors said analog output level.

28. The apparatus of claim 26 wherein said feedback mechanism monitors said amplified high-path signal.

29. The apparatus of claim 26 wherein said feedback mechanism controls a level shift provided by said bit grouping providing system.

30. The apparatus of claim 26 wherein said feedback mechanism provides a feedback signal to said bit grouping providing system.

31. The apparatus of claim 26 wherein said feedback mechanism includes an analog-to-digital converter.

32. The apparatus of claim 1 wherein $L+L_S=R_L$.

33. The apparatus of claim 1 wherein $L+L_S=R_L-1$.

34. The apparatus of claim 1 wherein $L+L_S=R_L-2$.

35. The apparatus of claim 1 wherein K is 32, $R_L$ is 24, $R_H$ is 24, L is 18, and H is 14.

36. The apparatus of claim 1 wherein $R_L=R_H$.

37. The apparatus of claim 1 wherein $L+H=J$.

38. An apparatus for conversion of an input digital signal to an output analog signal having a maximum output level, said input digital signal being nominally a signal of K bits, comprising:
 a bit grouping providing system which provides said input digital signal as a low-path digital signal of L primary bits, a middle-path digital signal of M primary bits, and a high-path digital signal of H primary bits, where L+M+H is greater than or equal to J, and J is a number of bits of said input digital signal utilized by said bit divider, where J is less than or equal to K,
 a low-path digital-to-analog converter for digital inputs of $R_L$ bits or less, said low-path digital signal being level shift mapped to an input of said low-path digital-to-analog converter, where L is less than or equal to $R_L$, wherein the L primary bits of the low-path digital signal are level shift mapped upwards by $L_S$ bits where $L+L_S \leq R_L$, said low-path digital-to-analog converter producing a low-path digital-to-analog converter output signal,
 a middle-path digital-to-analog converter for digital inputs of $R_M$ bits or less, said middle-path digital signal being level shift mapped to an input of said middle-path digital-to-analog converter, where M is less than or equal to $R_M$, said middle-path digital-to-analog converter producing a middle-path digital-to-analog converter output signal,
 a high-path digital-to-analog converter for digital inputs of $R_H$ bits or less, said high-path digital signal being bit shift mapped downwards to an input of said high-path digital-to-analog converter, where H is less than or equal to $R_H$, wherein the H primary bits of the high-path digital signal are level shift mapped downwards by $H_S$ bits where $(J-H_S) \leq R_H$, said high-path digital-to-analog converter producing a high-path digital-to-analog converter output signal,
 a low-path attenuator which attenuates said low-path digital-to-analog converter output signal to produce an attenuated low-path analog signal,
 a high-path amplifier which amplifies said high-path digital-to-analog converter output signal to produce an amplified high-path signal having a maximum level equal to said maximum output level, and
 a passive summing node which combines an ultimate low-path signal derived from said attenuated low-path analog signal, an ultimate middle-path signal derived from said middle-path digital-to-analog converter output signal, and an ultimate high-path signal derived from said amplified high-path signal to produce said output analog signal.

39. The apparatus of claim 38 wherein said high-path digital-to-analog converter and said high-path amplifier are components of high-path circuitry, said mid-path digital-to-analog converter is a component of mid-path circuitry, said low-path digital-to-analog converter and said attenuator are components of low-path circuitry, further including a control system for managing said high-path circuitry and said mid-path circuitry during signal level transitions across a first threshold level of said input digital signal, and said control system managing said low-path circuitry, said mid-path circuitry, and said high-path circuitry during signal level transitions across a second threshold level of said input digital signal.

40. The apparatus of claim 39 wherein if a signal level of said input digital signal does not exceed said first threshold level, said control system reduces access of noise from said high-path amplifier to said passive summing node.

41. The apparatus of claim 40 wherein if said signal level of said input digital signal does not exceed said second threshold level, said second threshold level being below said first threshold level, said control system reduces access of noise from said mid-path amplifier to said passive summing node.

42. The apparatus of claim 38 wherein said high-path digital signal includes $H_L$ subsidiary bits taken from said input digital signal, said $H_L$ subsidiary bits being less significant bits of said high-path digital signal than said H primary bits, and said mid-path digital signal includes $M_L$ subsidiary bits taken from said input digital signal, said $M_L$ subsidiary bits being less significant bits of said mid-path digital signal than said M primary bits, and low-path digital signal includes $L_S$ subsidiary bits, said $L_S$ subsidiary bits being less significant bits of said low-path digital signal than said L primary bits.

43. The apparatus of claim 38 wherein said bit grouping providing system is a bit divider which divides said input digital signal into said low-path digital signal, said middle-path digital signal, and said high-path digital signal.

44. The apparatus of claim 38 further including a feedback mechanism for stabilizing said analog output level in the course of transitions of said input digital signal across said first threshold level.

45. The apparatus of claim 38 further including a feedback mechanism for stabilizing said analog output level in the course of transitions of said input digital signal across said second threshold level.

46. An apparatus for conversion of an input digital signal to an output analog signal having a maximum output level, said input digital signal being nominally a signal of K bits, comprising:

a bit grouping providing system which provides said input digital signal as a low-path digital signal of L primary bits, a number n of middle-path digital signals of $M_1$, ..., $M_n$ primary bits, and a high-path digital signal of H primary bits, where $L+M_1+ \ldots +M_n+H$ is greater than or equal to J, and J is a number of bits of said input digital signal utilized by said bit divider, where J is less than or equal to K, a low-path digital-to-analog converter for digital inputs of $R_L$ bits or less, said low-path digital signal being level shift mapped to an input of said low-path digital-to-analog converter where L is less than or equal to $R_L$, wherein the L primary bits of the low-path digital signal are level shift mapped upwards by $L_S$ bits where $L+L_S \leq R_L$, said low-path digital-to-analog converter producing a low-path digital-to-analog converter output signal, said number n of middle-path digital-to-analog converters for digital inputs of $R_{M1}, \ldots, R_{Mn}$ bits or less, said middle-path digital signals being level shift mapped to $M_1 \ldots M_n$ primary bit inputs of said middle-path digital-to-analog converters where $M_1 \ldots M_n$ are less than or equal to $R_{M1}, \ldots, R_{Mn}$, respectively, said middle-path digital-to-analog converters producing middle-path digital-to-analog converter output signals, a high-path digital-to-analog converter for digital inputs of $R_H$ bits, said high-path digital signal being level shift mapped downwards to an input of said high-path digital-to-analog converter by a bit shift of $H_S$ bits such that $(J-H_S) \leq R_H$, said high-path digital-to-analog converter producing a high-path digital-to-analog converter output signal, a low-path attenuator which attenuates said low-path digital-to-analog converter output signal to produce an attenuated low-path analog signal, a high-path amplifier which amplifies said high-path digital-to-analog converter output signal to produce an amplified high-path signal having a maximum level equal to said maximum output level, and a passive summing node which, if a signal level characteristic of said input digital signal exceeds a highest threshold level, combines an ultimate low-path signal derived from said attenuated low-path analog signal, an ultimate middle-path signals derived from said middle-path digital-to-analog converter output signals, and an ultimate high-path signal derived from said amplified high-path signal to produce said output analog signal.

47. The apparatus of claim 46 wherein said high-path digital-to-analog converter and said high-path amplifier are components of high-path circuitry, the $n^{th}$ of said mid-path digital-to-analog converters is a component of an $n^{th}$ mid-path circuitry, and said low-path digital-to-analog converter and said attenuator are components of low-path circuitry, further including a control system for managing said high-path circuitry and said $n^{th}$ mid-path circuitry during signal level transitions across a first threshold level of said input digital signal.

48. The apparatus of claim 47 wherein if a signal level of said input digital signal does not exceed said high-level threshold level, said control system reduces access of noise from said high-path amplifier to said passive summing node.

49. The apparatus of claim 46 wherein if a signal level of said input digital signal does not exceed an intermediate threshold level, sums said ultimate low-path signal derived from said attenuated low-path analog signal and ultimate middle-path signals which correspond to signal levels in said input digital signal below said intermediate threshold level to produce said output analog signal, and utilizes a noise reducer to reduce access of noise to said passive summing node from said high-path amplifier and from ultimate middle-path signals which correspond to signal levels in said input digital signal above said intermediate threshold level.

50. The apparatus of claim 46 further including a next-to-lowest-path attenuator which attenuates a next-to-lowest-path digital-to-analog converter output signal to produce an attenuated next-to-lowest-path analog signal.

51. The apparatus of claim 46 further including a next-to-highest-path amplifier which amplifies a next-to-highest-path digital-to-analog converter output signal to produce an amplified next-to-highest-path signal.

52. The apparatus of claim 46 further including a feedback mechanism for stabilizing said analog output level in the course of transitions of said input digital signal across said highest threshold level.

53. The apparatus of claim 46 further including a feedback mechanism for stabilizing said analog output level in the course of transitions of said input digital signal across said lowest threshold level.

54. An apparatus for conversion of an input digital signal to a low-level final output analog signal and a high-level final output analog signal, comprising:

a bit grouping providing system which provides a low-path portion of said input digital signal as a low-path digital signal representing said input digital signal below a lower threshold level, and provides a high-path portion of said input digital signal as a high-path digital signal representing said input digital signal above a higher threshold level, a low-path digital-to-analog converter, said low-path digital signal being bit shift mapped to an input of said low-path digital-to-analog converter, said low-path digital-to-analog converter producing a low-path digital-to-analog converter output signal, a high-path digital-to-analog converter, said high-path digital signal being bit shift mapped to an input to said high-path digital-to-analog converter, said high-path digital-to-analog converter producing a high-path digital-to-analog converter output signal from which is derived said high-level final output analog signal, and a low-path attenuator which attenuates said low-path digital-to-analog converter output signal to produce said low-level final output analog signal.

55. The apparatus of claim 54 wherein said lower threshold level is equal to said upper threshold level.

56. The apparatus of claim 54 wherein said bit grouping provides a mid-path portion of said input digital signal as a mid-path digital signal when said input digital signal is between a lower intermediate threshold level and a higher intermediate threshold level, further including a mid-path digital-to-analog converter, said mid-path digital signal being bit shift mapped to an input of said mid-path digital-to-analog converter, said mid-path digital-to-analog converter producing a mid-path digital-to-analog converter output signal.

57. The apparatus of claim 56 wherein said lower threshold level is equal to said lower intermediate threshold level and said higher threshold level is equal to said higher intermediate threshold level.

58. An apparatus for conversion of an input digital signal to an output analog signal, comprising:
- a bit grouping providing system which provides said input digital signal as a low-path digital signal representing said input digital signal below a lower threshold level, and provides a high-path digital signal representing said input digital signal above a higher threshold level,
- a low-path digital-to-analog converter, said low-path digital signal being bit shift mapped to an input of said low-path digital-to-analog converter, said low-path digital-to-analog converter producing a low-path digital-to-analog converter output signal,
- a high-path digital-to-analog converter, said high-path digital signal being input to said high-path digital-to-analog converter, said high-path digital-to-analog converter producing a high-path digital-to-analog converter output signal,
- a low-path attenuator which attenuates said low-path digital-to-analog converter output signal to produce an attenuated low-path analog signal, and
- a summing node which combines said attenuated low-path analog signal and an ultimate high-path signal derived from said high-path digital-to-analog converter output signal to produce a final output signal.

59. The apparatus of claim 58 wherein said low-path digital signal is bit shift mapped upwards to an input of said low-path digital-to-analog converter.

60. The apparatus of claim 58 wherein said high-path digital signal is level shift mapped downwards to an input of said high-path digital-to-analog converter, said high-path digital-to-analog converter producing a high-path digital-to-analog converter output signal.

61. The apparatus of claim 58 further including a high-path amplifier which amplifies said high-path digital-to-analog converter output signal to produce an amplified high-path signal.

62. The apparatus of claim 61 wherein, said amplified high-path signal is said ultimate high-path signal.

63. The apparatus of claim 61 further including a high-path noise reducer to reduce access of noise from said high-path digital-to-analog converter output signal to said summing node.

64. The apparatus of claim 63 wherein said high-path noise reducer is a switch between an output of said high-path amplifier and said summing node.

65. The apparatus of claim 63 wherein said high-path noise reducer is a switch between said high-path digital-to-analog converter and said high-path amplifier.

66. The apparatus of claim 63 wherein said high-path noise reducer controls said high-path amplifier.

67. The apparatus of claim 58 wherein said summing node is a passive summing node.

68. The apparatus of claim 58 wherein said lower threshold level is equal to said higher threshold level.

69. The apparatus of claim 58 wherein when said input digital signal is between said lower threshold level and said higher threshold level, said bit grouping providing system provides said input digital signal as both said low-path digital signal and said high-path digital signal.

70. The apparatus of claim 58 further including an analog-to-digital converter providing feedback from said final output signal to said bit grouping providing system.

71. The apparatus of claim 70 wherein said feedback generated by said analog-to-digital converter provides calibration of bit grouping providing system.

72. The apparatus of claim 71 wherein said feedback is based on a test signal produced by said bit grouping providing system.

73. The apparatus of claim 58 wherein said input digital signal is a plurality of partial-range input digital signals, each of said partial-range input digital signals having a dynamic range less than said input digital signal.

74. The apparatus of claim 58 further including a level control which controls a level shifting produced by said bit grouping providing system of said low-path digital signal and said high-path digital signal.

75. The apparatus of claim 58 wherein said bit grouping providing system provides said input digital signal as a mid-path digital signal representing said input digital signal above an intermediate lower threshold level and below an intermediate higher threshold level, and further including
- a mid-path digital-to-analog converter, said mid-path digital signal being bit shift mapped to an input of said mid-path digital-to-analog converter, said mid-path digital-to-analog converter producing a mid-path digital-to-analog converter output signal, and
- a mid-path attenuator which attenuates said mid-path digital-to-analog converter output signal to produce an attenuated mid-path analog signal, and
- wherein said summing node combines an ultimate mid-path signal derived from said attenuated mid-path analog signal with said attenuated low-path analog signal and said ultimate high-path signal.

76. The apparatus of claim 75 further including a high-path noise reducer to reduce access of noise from said high-path digital-to-analog converter output signal to said summing node.

77. The apparatus of claim 75 wherein said lower threshold level is equal to said intermediate lower threshold level, and said intermediate higher threshold level which is equal to said higher threshold level.

* * * * *

UNITED STATES PATENT AND TRADEMARK OFFICE
CERTIFICATE OF CORRECTION

PATENT NO. : 9,590,648 B2
APPLICATION NO. : 15/227913
DATED : March 7, 2017
INVENTOR(S) : John Howard La Grou Page 1 of 1

It is certified that error appears in the above-identified patent and that said Letters Patent is hereby corrected as shown below:

In the Specification

<u>Column 45,</u>
Line 10, replace "path-combing" with -- path-combining --.
Line 21, delete the word "at".
Line 28, replace "1-ET" with -- FET --.
Line 48, delete the first instance of the word "to".

<u>Column 46,</u>
Line 55, delete the letter "a".
Line 61, replace "attenuations" with -- attenuation --.

Signed and Sealed this
Second Day of July, 2019

Andrei Iancu
*Director of the United States Patent and Trademark Office*